United States Patent
Liao et al.

(10) Patent No.: US 11,769,826 B2
(45) Date of Patent: Sep. 26, 2023

(54) SEMICONDUCTOR DEVICE WITH ASYMMETRIC GATE STRUCTURE

(71) Applicant: INNOSCIENCE (ZHUHAI) TECHNOLOGY CO., LTD., Zhuhai (CN)

(72) Inventors: Hang Liao, Zhuhai (CN); Qiyue Zhao, Zhuhai (CN); Chang An Li, Zhuhai (CN); Chao Wang, Zhuhai (CN); Chunhua Zhou, Zhuhai (CN); King Yuen Wong, Zhuhai (CN)

(73) Assignee: INNOSCIENCE (ZHUHAI) TECHNOLOGY CO., LTD., Zhuhai (CN)

( * ) Notice: Subject to any disclaimer, the term of this patent is extended or adjusted under 35 U.S.C. 154(b) by 0 days.

(21) Appl. No.: 17/976,876

(22) Filed: Oct. 31, 2022

(65) Prior Publication Data
US 2023/0058006 A1    Feb. 23, 2023

Related U.S. Application Data

(63) Continuation of application No. 17/064,630, filed on Oct. 7, 2020, now Pat. No. 11,515,409.

(30) Foreign Application Priority Data

Jun. 19, 2020 (CN) .................. 202010564674.X

(51) Int. Cl.
*H01L 29/778* (2006.01)
*H01L 29/06* (2006.01)
(Continued)

(52) U.S. Cl.
CPC ...... *H01L 29/7787* (2013.01); *H01L 29/0619* (2013.01); *H01L 29/2003* (2013.01); *H01L 29/404* (2013.01)

(58) Field of Classification Search
CPC ... H01L 29/66719; H01L 29/778–7789; H01L 29/7816; H01L 29/808;
(Continued)

(56) References Cited

U.S. PATENT DOCUMENTS 10,062,756 B2 *  8/2018  Moens .............. H01L 29/66462
2013/0075752 A1 *  3/2013  Kotani .............. H01L 29/66462
257/E21.403

(Continued)

*Primary Examiner* — Natalia A Gondarenko
(74) *Attorney, Agent, or Firm* — McCoy Russell LLP

(57) ABSTRACT

A semiconductor device includes a channel layer, a barrier layer, source contact and a drain contact, a doped group III-V layer, and a gate electrode. The barrier layer is positioned above the channel layer. The source contact and the drain contact are positioned above the barrier layer. The doped group III-V layer is positioned above the barrier layer and between the first drain contact and the first source contact. The first doped group III-V layer has a first non-vertical sidewall and a second non-vertical sidewall. The gate electrode is positioned above the doped group III-V layer and has a third non-vertical sidewall and a fourth non-vertical sidewall. A horizontal distance from the first non-vertical sidewall to the third non-vertical sidewall is different than a horizontal distance from the second non-vertical sidewall to the fourth non-vertical sidewall.

20 Claims, 44 Drawing Sheets

(51) Int. Cl.
*H01L 29/20* (2006.01)
*H01L 29/40* (2006.01)

(58) Field of Classification Search
CPC ... H01L 29/122–127; H01L 29/15–158; H01L 29/42316; H01L 29/6656; H01L 29/66431; H01L 29/66462; H01L 29/6653; H01L 23/28; H01L 23/3171; H01L 23/3192; H01L 27/0605; H01L 27/085; H01L 21/02183; H01L 21/02164; H01L 21/0228; H01L 21/02274; H01L 21/02107; H01L 21/02112; H01L 21/022; H01L 21/02208; H01L 21/02205; H01L 2924/13064; H01L 21/02225; H01L 21/0229; H01L 21/2123; H01L 21/8252; H01L 21/28114; H01L 21/823468; H01L 21/823864; H01L 21/823456; H01L 21/82385; H01L 29/7787; H01L 29/0619; H01L 29/2003; H01L 29/404; H01L 29/0684; H01L 29/1066; H01L 29/402; H01L 29/7786; H01L 29/475
USPC ..... 257/76, 77, 190, 194, 192, 183; 438/172
See application file for complete search history.

(56) References Cited

U.S. PATENT DOCUMENTS

| | | | |
|---|---|---|---|
| 2014/0209922 A1* | 7/2014 | Ota | H01L 29/42316 257/194 |
| 2014/0346566 A1* | 11/2014 | Basu | H01L 21/28575 257/194 |
| 2018/0248027 A1* | 8/2018 | Okita | H01L 27/098 |
| 2020/0335493 A1* | 10/2020 | Arnold | H01L 28/40 |
| 2021/0083073 A1* | 3/2021 | Liu | H01L 29/778 |

* cited by examiner

SEMICONDUCTOR DEVICE WITH ASYMMETRIC GATE STRUCTURE

CROSS REFERENCE TO RELATED APPLICATIONS

This application is a continuation application of U.S. application Ser. No. 17/064,630, filed on 7 Oct. 2020, which claims priority of Chinese Application No. 202010564674.X filed on 19 Jun. 2020, the disclosure of which is hereby incorporated by reference in its entirety.

BACKGROUND OF THE INVENTION

1. Field of the Invention

The present invention relates to a semiconductor device and a manufacturing method thereof, and more particularly to a semiconductor device with a group III-V layer, two-dimensional electron gas, conductor structures, and metal layers.

2. Description of the Related Art

GaN switching power transistors can realize a new generation of small-size high-efficiency power converters. Through high switching speeds of these devices, the switching frequency can be improved to realize maintenance or even increase of the total efficiency while reducing the volume and the weight. Due to the physical properties of GaN/AlGaN materials, a high breakdown voltage and a high current level can be achieved at the same time over the small semiconductor area, and these material properties are converted into the high switching frequency at a high power level. However, many different physical effects limit the voltage tolerance performance of GaN devices. In many cases, the maximum allowable operating voltage is limited by excessive gate leakage current. The gate leakage current refers to a current leaked to a source and/or drain from gate metal along a sidewall of a doped group III-V layer and an interface between a channel layer and a passivation layer. Excessive gate leakage current may inhibit the operating voltage of a component.

Therefore, there is a need of improving gate leakage current characteristics in the field of GaN switching power transistors.

SUMMARY OF THE INVENTION

The following presents a simplified summary of the basic features of the present invention in order to provide a basic understanding of some aspects of the present invention.

First generation semiconductor materials are elemental semiconductors with indirect energy gaps, such as silicon or germanium. Second generation semiconductor materials are represented by Group III arsenide (for example, gallium arsenide (GaAs)) compound semiconductor materials, and they have direct energy gaps, are luminous but have certain wavelength limitation, and have high pollution. Third generation semiconductors refer to wide bandgap semiconductor materials represented by Group III nitrides (for example, gallium nitride (GaN)), silicon carbide (SiC), diamond, and zinc oxide (ZnO).

With the development of wireless communication markets, such as military radar systems, personal mobile phones, and base stations, in recent years, millimeter wave transistors are becoming increasingly important. High electron mobility transistors, such as AlGaN/GaN high electron mobility transistors, made of Group III nitride materials, are always a hot research topic. Gallium nitride has a wide bandgap, a high breakdown voltage, a high peak electron velocity, a high electron saturation velocity, strong bonding force and excellent thermal stability, so the gallium nitride has the opportunity to become a main material of the next generation of power devices.

Compared with the first generation semiconductor materials of silicon (Si) and the second generation semiconductor materials of gallium arsenide (GaAs), the third generation semiconductors have the unique performance of large bandgap width, high breakdown electric field, high thermal conductivity, high electron saturation drift speed, small dielectric constant and the like, so that they show great potentials in aspects of photoelectric devices, power electronics, radio frequency (RF) and microwave power amplifiers, lasers, detection devices and the like.

Components based on the third generation semiconductors may include high electron mobility transistors (HEMTs), also known as heterojunction field effect transistors (HFETs) or modulation doped field effect transistors (MODFETs). Generally, junctions formed by using two kinds of materials with different bandgap widths, such as heterojunctions, are used instead of doped regions as channels. High electron mobility transistors get benefits from heterostructures, and use high mobility electrons generated by the heterojunctions. The heterojunctions may be formed, for example, by unintentionally doped wide bandgap layers (for example, AlGaN layers) and unintentionally doped narrow bandgap layers (for example, GaN layers).

In the AlGaN/GaN material system, due to extremely strong spontaneous polarization and piezoelectric polarization effects, unintentional doping may also form a high-concentration electron channel. For example, an electric field induced by internal polarization may transfer electrons in a donor level on the AlGaN surface into a GaN layer. Under this condition, since there is no scattering caused by donor impurities in the channel, electrons may move at a high speed, and very high electron mobility is obtained. A final result is that an electron thin layer with high concentration and high mobility is generated in the heterostructure, thus resulting in very low channel resistivity. This is generally known as two-dimensional electron gas (2DEG). In the field effect transistors (FETs), the operation of the transistor is accomplished by changing the conductivity of this layer by applying a bias voltage to a gate electrode, and this is an advantage not found in the second generation semiconductor materials (such as gallium arsenide).

Therefore, gallium nitride may be used as the HEMT. The HEMT is better than the MESFET in the carrier concentration and electron mobility due to lower impurity scattering and lattice scattering. Therefore, the gallium nitride material is very suitable for being applied to the HEMTs and applied to high-frequency, high-power or microwave purposes.

High-frequency and high-power components need to have the characteristics of high breakdown voltage and high electron speed. In view of power amplifiers, the third generation semiconductor HEMTs have better power density than the second generation semiconductor HEMTs, so that the third generation semiconductor HEMTs conform to requirements by smaller sizes.

An AlGaN/GaN HEMTs is a most general heterojunction HEMT. Generally, MOCVD or MBE is used for epitaxial growth of GaN, AlGaN and relevant structures thereof on a substrate material (such as sapphire, silicon (111) and silicon carbide) to provide materials required for preparation of the AlGaN/GaN HEMT.

The energy gap of GaN is as high as 3.39 eV, and the breakdown voltage also reaches 3.3 MV/cm. From these two points, the possibility of GaN for preventing the electronic pulse attack can be improved, and GaN can also work normally in a high-temperature environment.

The technology of growing gallium nitride on a silicon carbide or sapphire substrate is very mature, and the grown gallium nitride has good crystallization quality and low surface defect density. However, the silicon carbide or sapphire substrate is expensive and difficult to process, so that a semiconductor device based on the silicon carbide or sapphire substrate is difficult to realize mass production or manufacturing cost reduction. Based on the above disadvantages, GaN-on-Si is a process development trend in recent years. The silicon substrate has the cost advantages, and GaN-on-Si is also compatible with a modern silicon semiconductor manufacturing process. However, the difference in thermal expansion coefficients of gallium nitride and silicon is as high as 34%, so that epitaxial film breaking or silicon substrate bending deformation is caused during growth of a crystal film or at the room temperature. The surface defect density of the epitaxial film is high due to poor crystallization quality of the epitaxial film, so that a leakage current of about $10^{-12}$ A/mm to about $10^{-8}$ A/mm may be generated when the operating voltage of a GaN-on-Si HEMT at a gate voltage of 5-6 V.

It is known that the magnitude of the leakage current is mainly related to the quality of the epitaxial film growing on a substrate, and different dies on the same substrate or different switching elements of the same integrated circuit generally have substantially identical gate leakage current. Additionally, the gate leakage current may be subdivided into gate-to-source leakage current ($J_{gs}$) and gate-to-drain leakage current ($J_{gd}$). In conventional devices with symmetrical gate structures, $J_{gs}$ and $J_{gd}$ have a similar magnitude. It has been found that when the HEMTs are applied to an upper tube of a buck circuit in an on board charger (OBC), it is generally desirable to minimize $J_{gd}$ to reduce the power consumption of $C_{gd}$ in a charging process. On the other hand, when the HEMTs are applied to LLC resonant converters in adapters, it is generally desirable to minimize $J_{gs}$ to optimize the charging time for $C_{gs}$, thus further reducing the delay of the circuit. Based on this, there are the following requirements in the art: 1) the requirement of modulating the magnitude of leakage current of different dies on the same wafer; 2) the requirement of modulating the magnitude of leakage current of different switching elements in the same integrated circuit; or 3) the requirement of independently modulating the magnitudes of $J_{gs}$ and $J_{gd}$ in the HEMT devices.

In various embodiments, the present invention provides precisely designed HEMT gate structures. These gate structures effectively improve the gate leakage current characteristics of the HEMT devices, thereby achieving the above-mentioned requirement of independently modulating the magnitude of the leakage current of each die or switching elements, or the requirement of independently modulating the magnitudes of $J_{gs}$ and $J_{gd}$.

Some embodiments of the present invention provide a semiconductor device, comprising a channel layer, a barrier layer, source contact and a drain contact, a doped group III-V layer, and a gate electrode. The barrier layer is positioned above the channel layer, the barrier layer and the channel layer are configured to form two-dimensional electron gas (2DEG) along an interface between the channel layer and the barrier layer. The source contact and the drain contact are positioned above the barrier layer. The doped group III-V layer is positioned above the barrier layer and between the first drain contact and the first source contact. The first doped group III-V layer has a first non-vertical sidewall adjacent to the first source contact and a second non-vertical sidewall adjacent to the first drain contact. The gate electrode is positioned above the doped group III-V layer and has a third non-vertical sidewall adjacent to the first source contact and a fourth non-vertical sidewall adjacent to the first drain contact. A horizontal distance from the first non-vertical sidewall to the third non-vertical sidewall is different than a horizontal distance from the second non-vertical sidewall to the fourth non-vertical sidewall.

Some embodiments of the present invention provide a semiconductor device, comprising a channel layer, a barrier layer, a doped group III-V layer, and a gate electrode. The barrier layer is positioned above the channel layer, the barrier layer and the channel layer are configured to form two-dimensional electron gas (2DEG) along an interface between the channel layer and the barrier layer. The doped group III-V layer is positioned above the barrier layer and between the first drain contact and the first source contact. The first doped group III-V layer has a first left sidewall and a first right sidewall which are curved and opposite each other. The gate electrode is positioned above the doped group III-V layer and has a second left sidewall and a second right sidewall which are curved and opposite each other. A horizontal distance from the first non-vertical sidewall to the third non-vertical sidewall is different than a horizontal distance from the second non-vertical sidewall to the fourth non-vertical sidewall.

Some embodiments of the present invention provide a semiconductor device, comprising a channel layer, a barrier layer a low voltage device, and a high voltage device. The barrier layer is positioned above the channel layer. The barrier layer and the channel layer are configured to form two-dimensional electron gas (2DEG) along an interface between the channel layer and the barrier layer. The low voltage device includes: a first source contact and a first drain contact which are positioned above the barrier layer; a first doped group III-V layer positioned above the barrier layer and between the first drain contact and the first source contact; and a first gate electrode positioned above the doped group III-V layer and having a first sidewall adjacent to the first source contact and a second sidewall adjacent to the first drain contact. A profile of the first sidewall and a profile of the second sidewall are substantially in non-specular symmetry with respect to a geometric center of the first doped group III-V layer. The high voltage device includes: a second source contact and a second drain contact which are positioned above the barrier layer; a second doped group III-V layer positioned above the barrier layer and between the second drain contact and the second source contact; and a second gate electrode positioned above the doped group III-V layer and having a third sidewall adjacent to the second source contact and a fourth sidewall adjacent to the second drain contact. A profile of the third sidewall and a profile of the fourth sidewall are substantially in non-specular symmetry with respect to a geometric center of the second doped group III-V layer.

BRIEF DESCRIPTION OF THE DRAWINGS

The aspects of the present invention will become more comprehensible from the following detailed description made with reference to the accompanying drawings. It should be noted that, various features may not be drawn to scale. In fact, the sizes of the various features may be increased or reduced arbitrarily for the purpose of clear description.

FIG. 1 (b) shows a three-dimensional configuration of a gate structure 80a in a dotted box in FIG. 1 (a).

FIG. 1 (c) shows enlarged views of a first sidewall 81, a second sidewall 82, a third sidewall 91, and a fourth sidewall 92 in FIG. 1 (a) in dotted boxes.

FIG. 1 (d) shows a gate structure 80b according to some embodiments of the present invention.

FIG. 1 (e) shows a three-dimensional configuration of a gate structure 80b in a dotted box in FIG. 1 (d).

FIG. 1 (f) shows enlarged views of a third sidewall 91 and a fourth sidewall 92 in FIG. 1 (d) in dotted boxes.

FIG. 1 (g) shows a gate structure 80c according to some embodiments of the present invention.

FIG. 1 (h) shows a three-dimensional configuration of a gate structure 80c in a dotted box in FIG. 1 (g).

FIG. 2 (b) shows a gate structure 80b according to some embodiments of the present invention.

FIG. 2 (c) shows a gate structure 80c according to some embodiments of the present invention.

FIG. 3 (b) shows a gate structure 80b according to some embodiments of the present invention.

FIG. 3 (c) shows a gate structure 80c according to some embodiments of the present invention.

PREFERRED EMBODIMENT OF THE PRESENT INVENTION

Figure 1A:
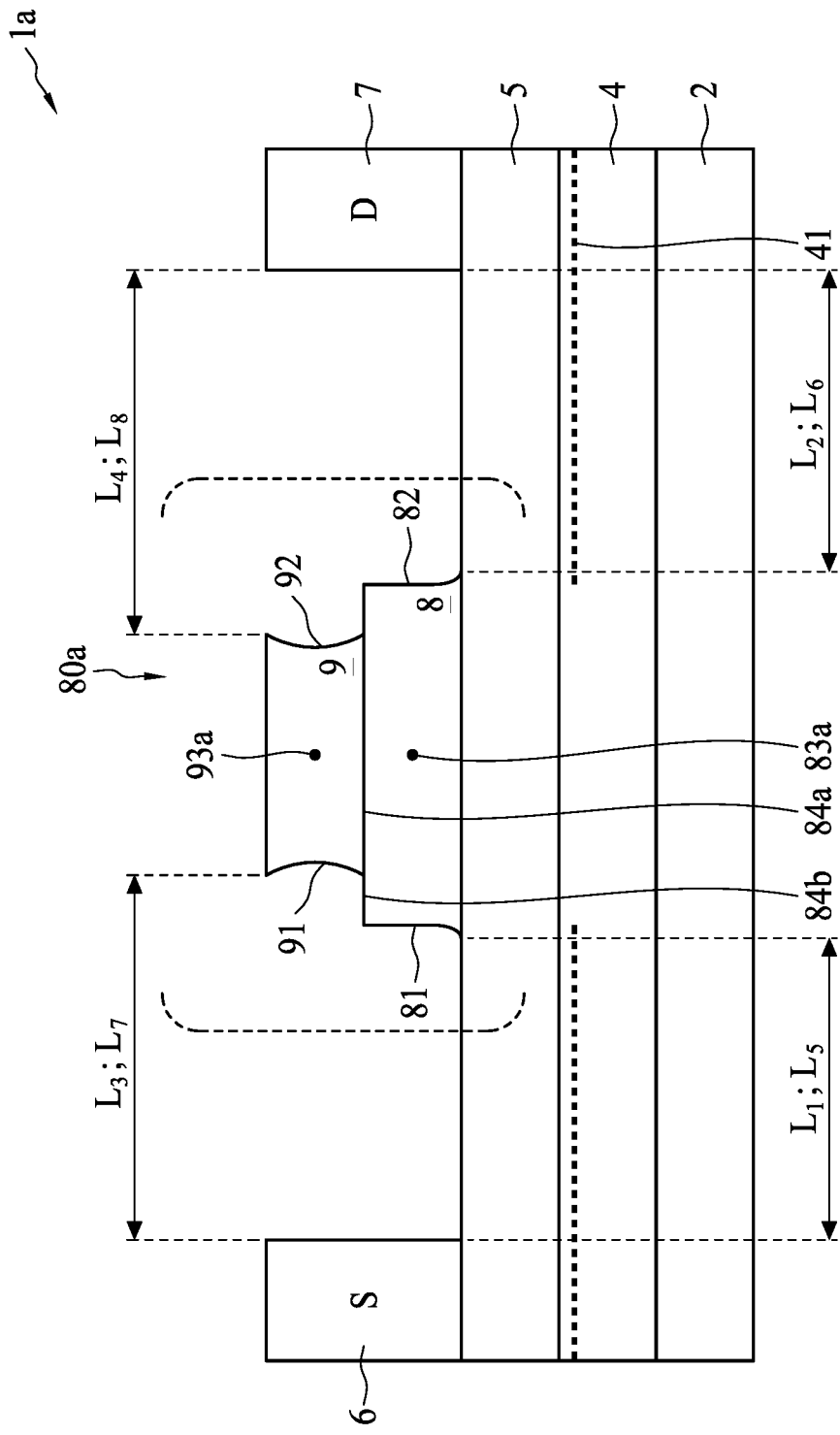
FIG. 1 (a) shows a gate structure 80a according to some embodiments of the present invention.
Figure 1C:
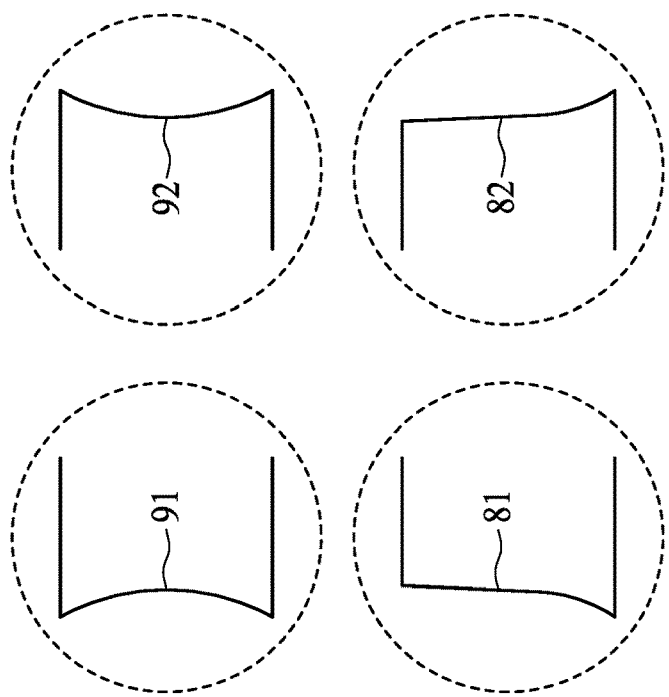
Figure 1B:
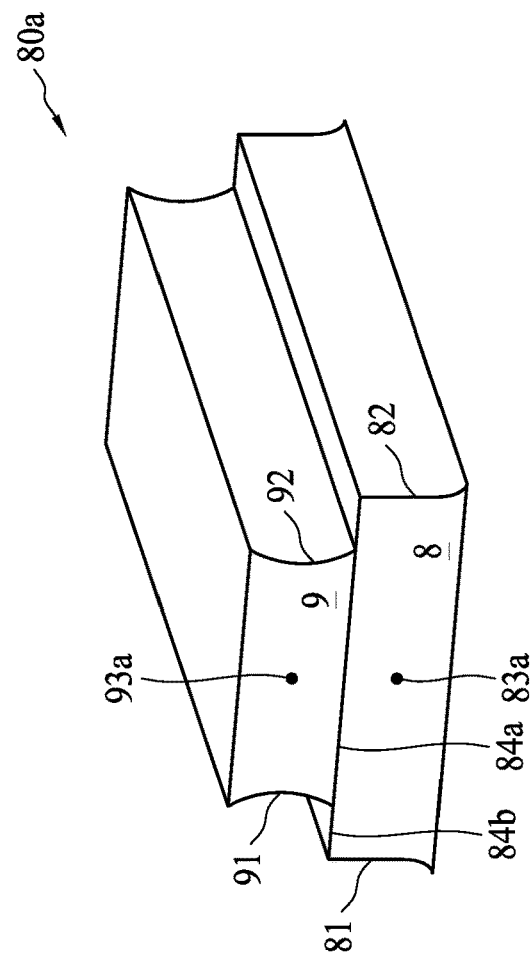
Figure 1D:
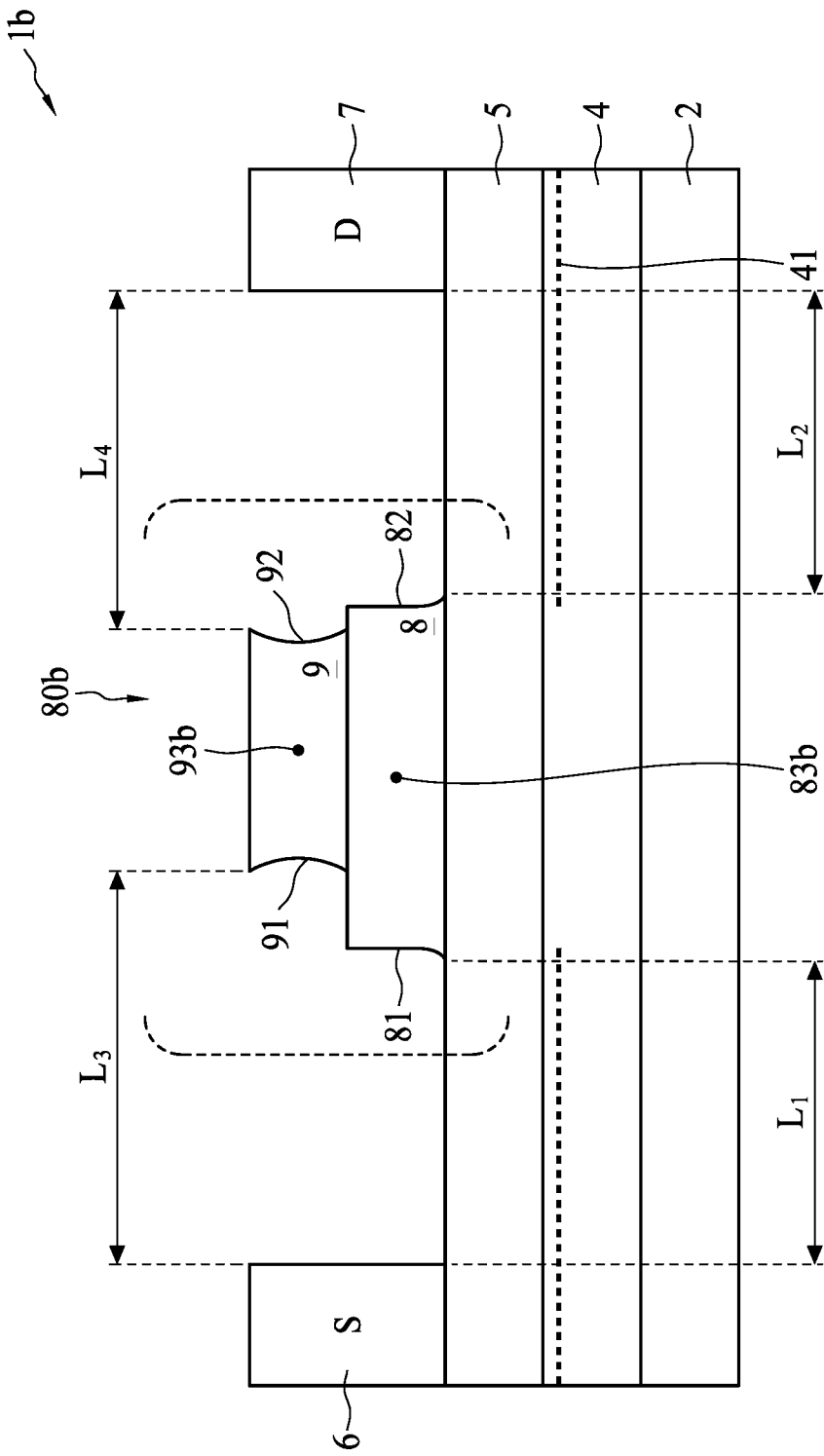
Figure 1F:
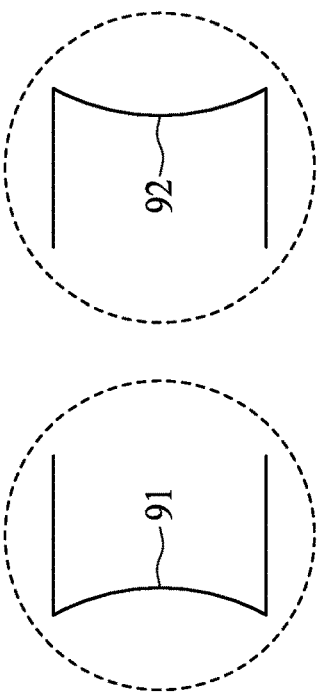
Figure 1E:
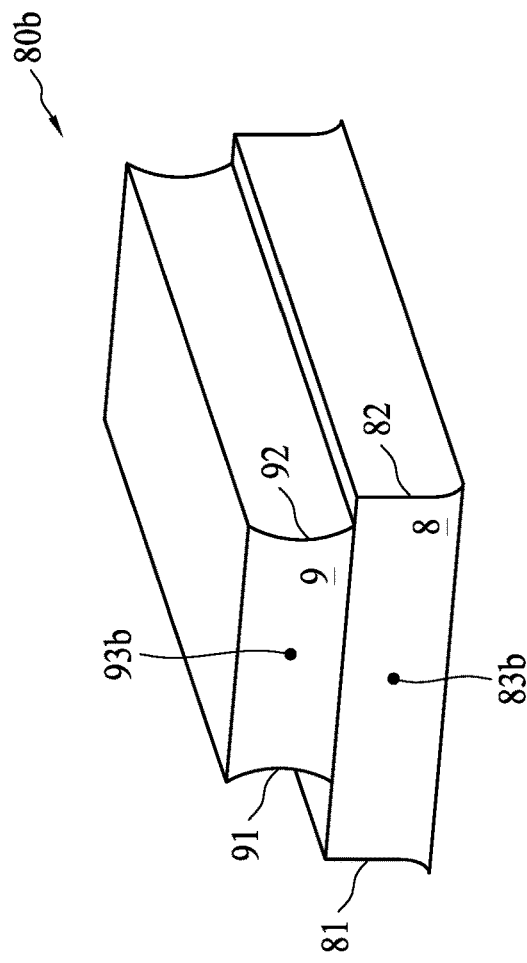
Figure 1G:
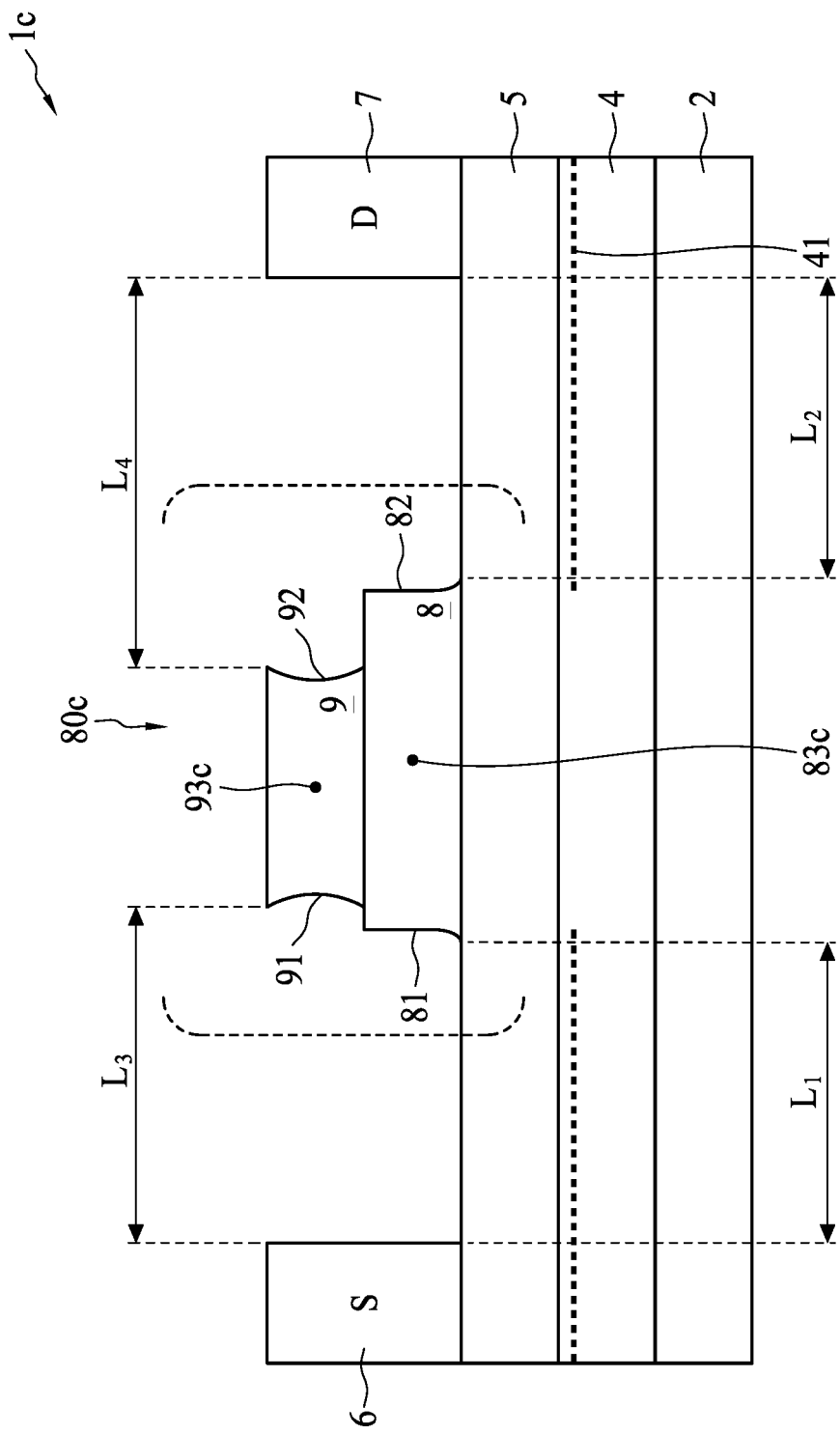
Figure 1H:
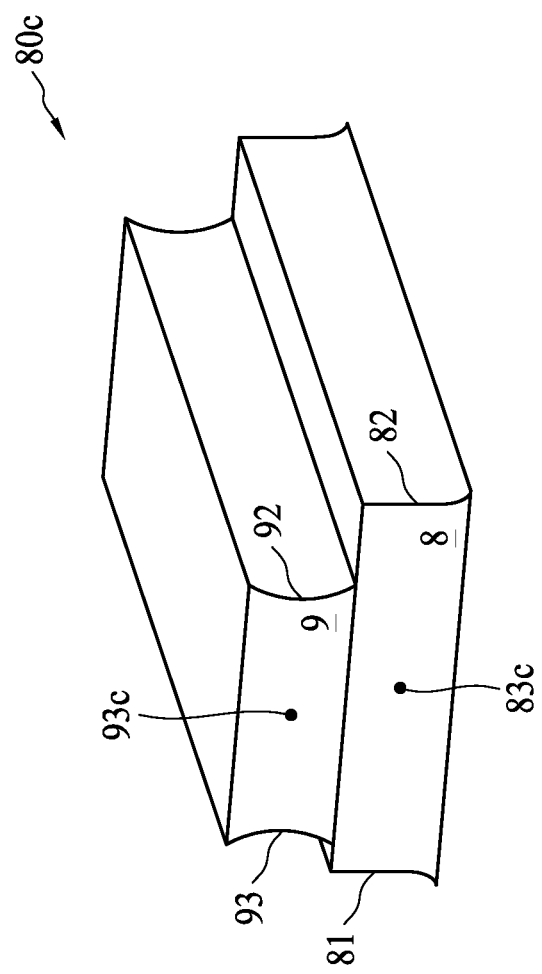

To make the figures clear and concise, unless otherwise specified, the same reference numerals in different figures indicate the same components. In addition, to simplify the description, descriptions and details of well-known steps and components may be omitted. Although devices may be described herein as some n-channel or p-channel devices or some n-type or p-type doping devices, a person of ordinary skill in the art shall understand that complementary devices according to the present invention may also be used. The word "substantially" or "basically" used herein means that a value of a component has a parameter that is expected to be close to a stated value or position. However, as is well known in the art, there are always small differences that prevent a value or position from being exactly the stated value or position. It is acknowledged in the art that a deviation of up to at least ten percent (10%) (and even to twenty percent (20%) for some components including semiconductor doping concentrations) is a reasonable deviation from an ideal target exactly as described. The terms "first", "second", "third", and the like (as used in part of a component name) in the claims and/or specific embodiments are used to distinguish similar components, and do not necessarily describe an order in time, space, rank, or any other way. It should be understood that, such terms may be interchanged under appropriate circumstances, and the embodiments described herein may be operated in other orders than that described or exemplified herein. The phrase "some embodiments" means that specific features, structures, or characteristics described in combination with the embodiments are included in at least one implementation of the present invention. Therefore, the phrase "in some embodiments" appearing at different positions throughout this specification does not necessarily refer to the same implementation, but in some cases, may refer to the same implementation. In addition, it is apparent to a person of ordinary skill in the art that, in one or more embodiments, specific features, structures, or characteristics may be combined in any appropriate manner.

The following disclosure provides many different embodiments or examples for implementing different features of the provided subject matter. Specific examples of components and arrangements are described below. Certainly, these descriptions are merely examples and are not intended to be limiting. In this application, in the following descriptions, the description of the first feature being formed on or above the second feature may include an embodiment formed by direct contact between the first feature and the second feature, and may further include an embodiment in which an additional feature may be formed between the first feature and the second feature to enable the first feature and the second feature to be not in direct contact. In addition, in this application, reference numerals and/or letters may be repeated in examples. This repetition is for the purpose of simplification and clarity, and does not indicate a relationship between the described various embodiments and/or configurations.

The embodiments of the present invention are described in detail below. However, it should be understood that many applicable concepts provided by the present invention may be implemented in a plurality of specific environments. The described specific embodiments are only illustrative and do not limit the scope of the present invention.

Figure 2A:
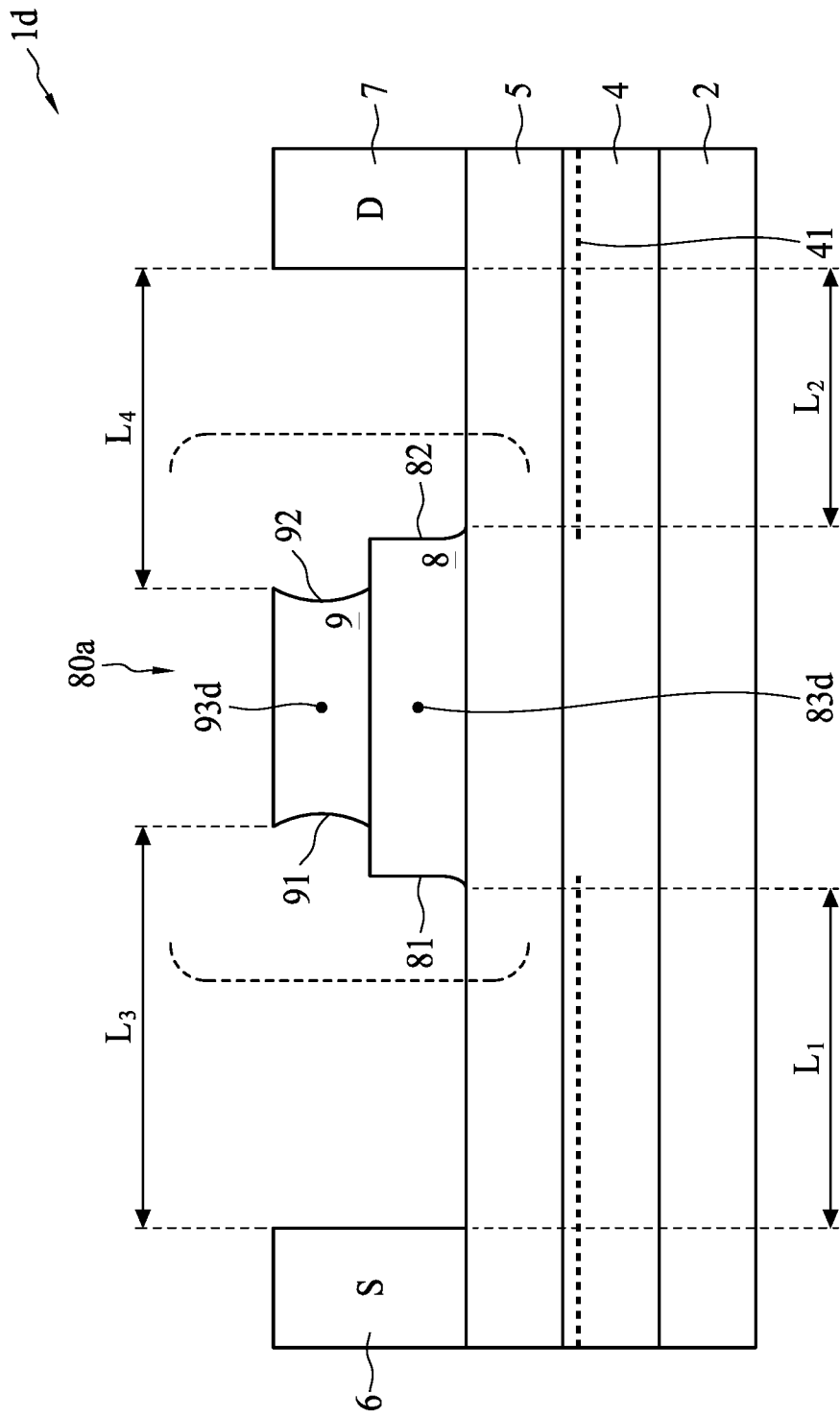
FIG. 2 (a) shows a gate structure 80a according to some embodiments of the present invention.
Figure 2B:
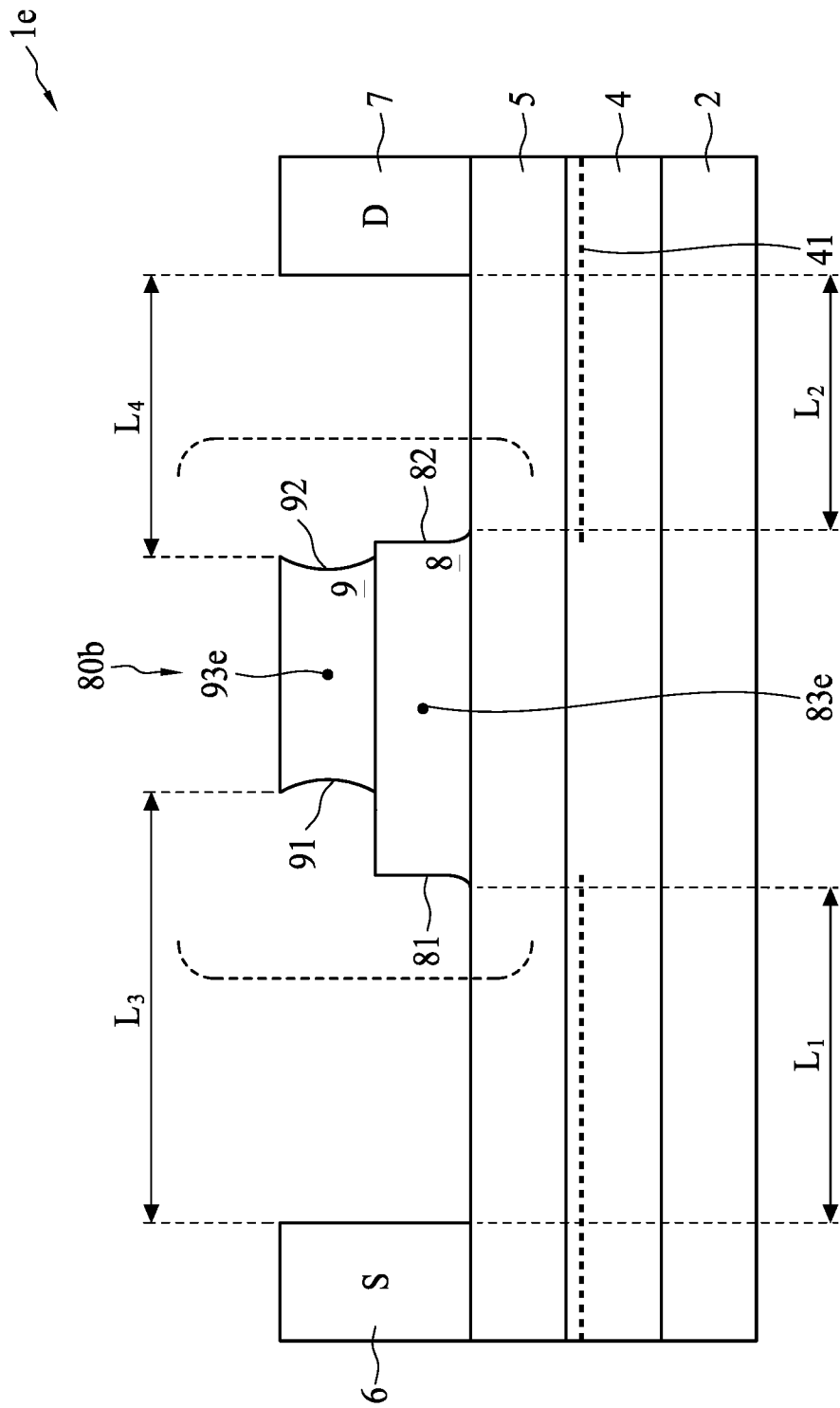
Figure 2C:
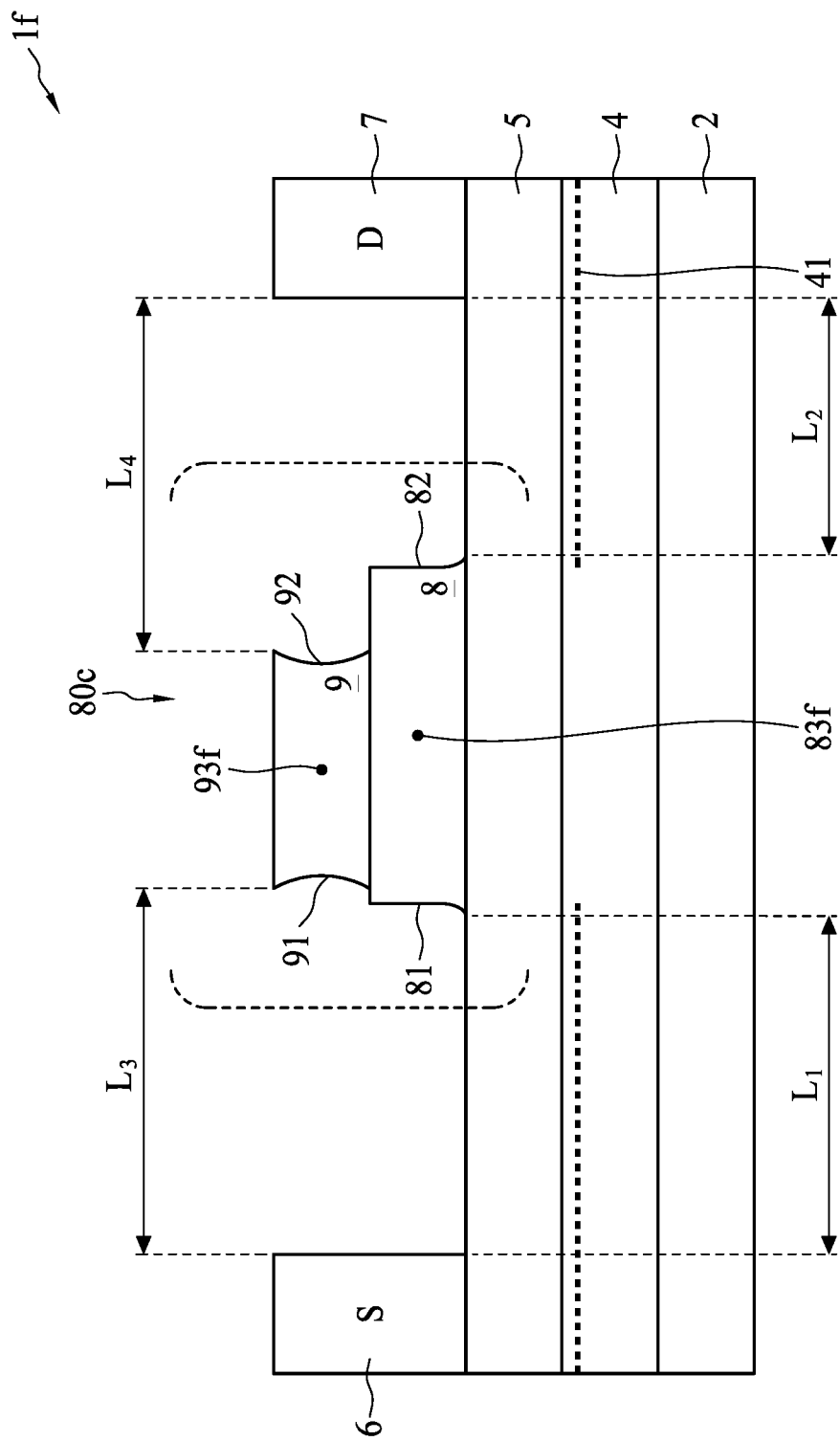
Figure 3A:
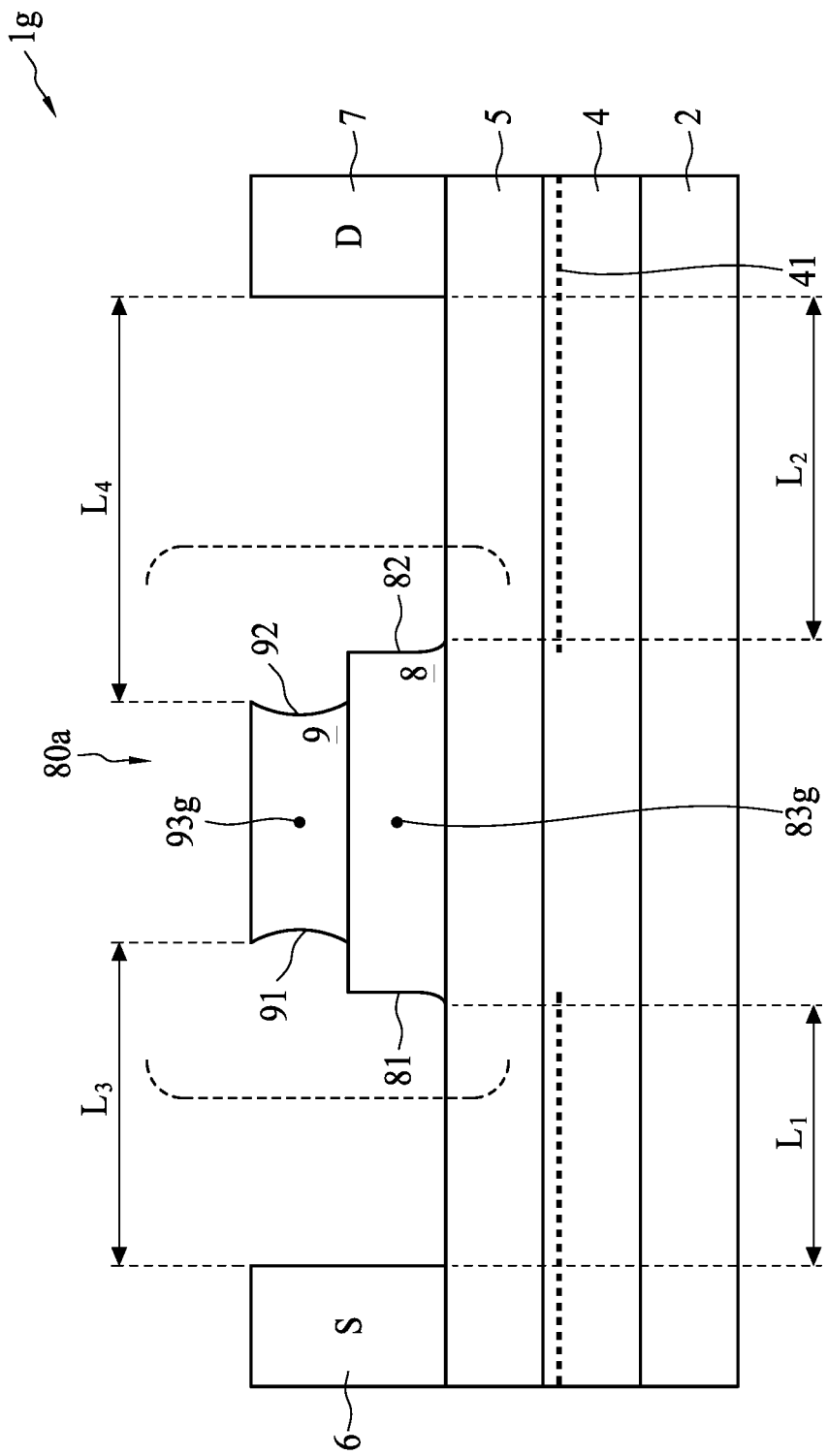
FIG. 3 (a) shows a gate structure 80a according to some embodiments of the present invention.
Figure 3B:
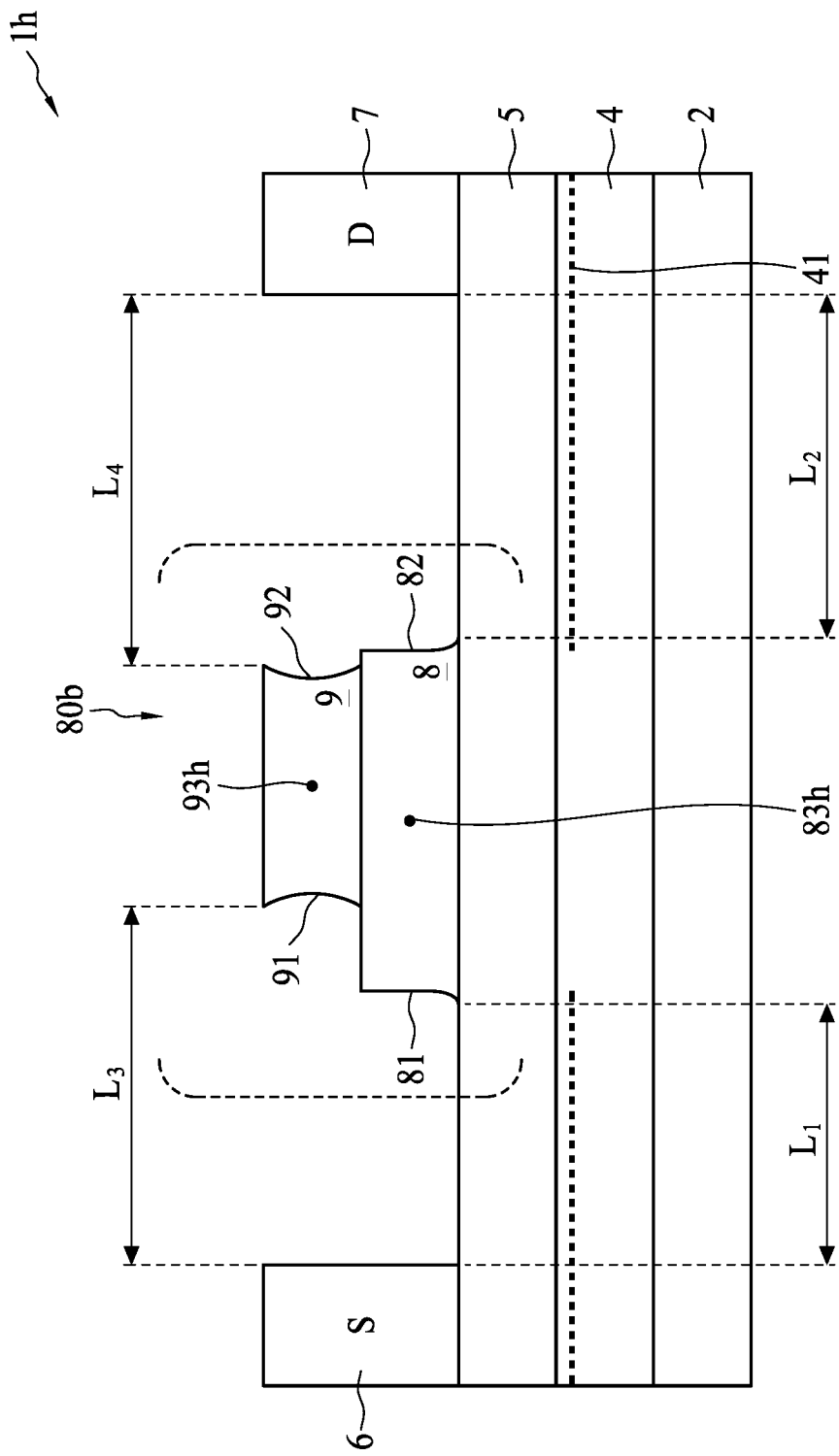
Figure 3C:
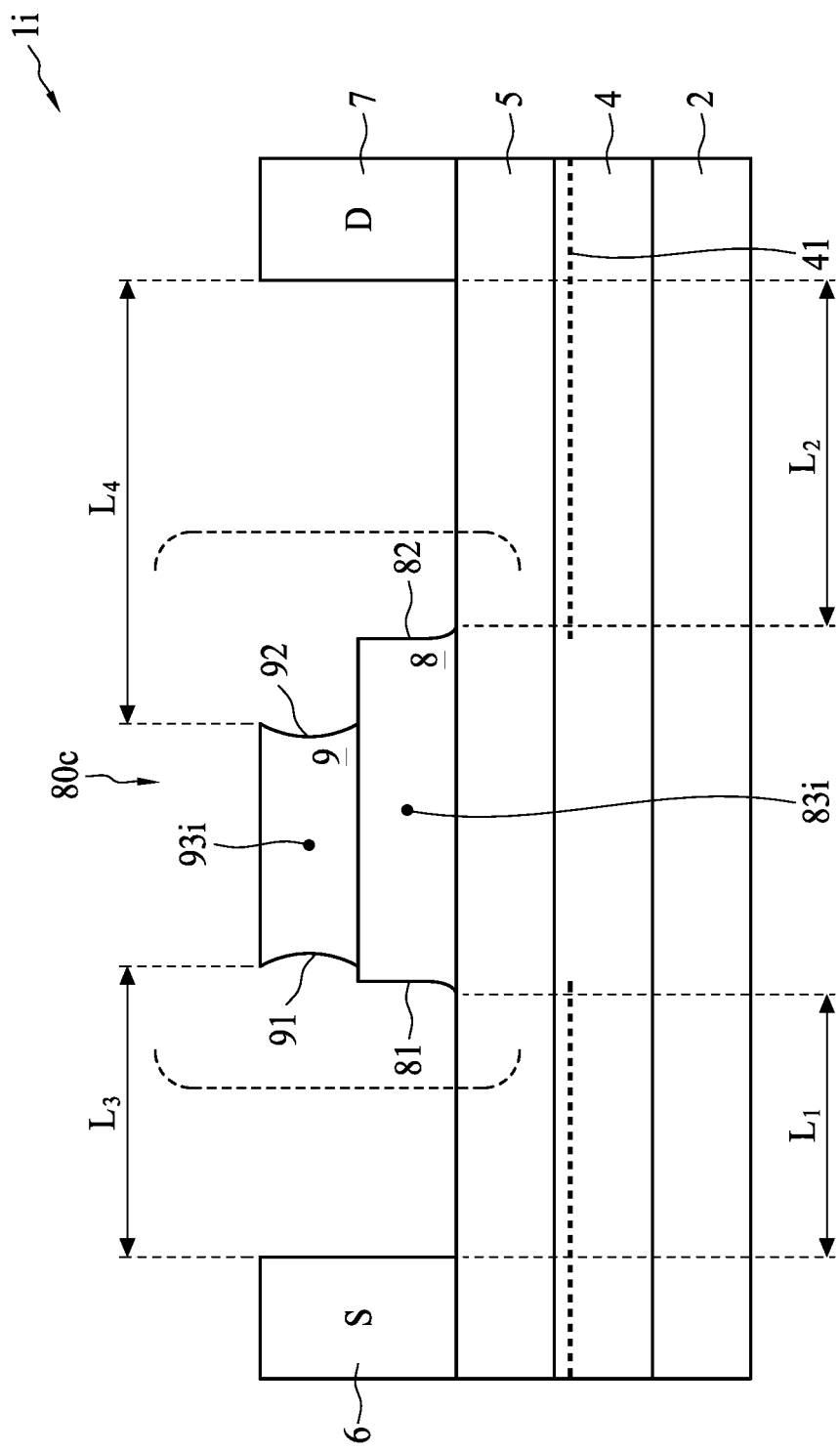
Figure 4A:
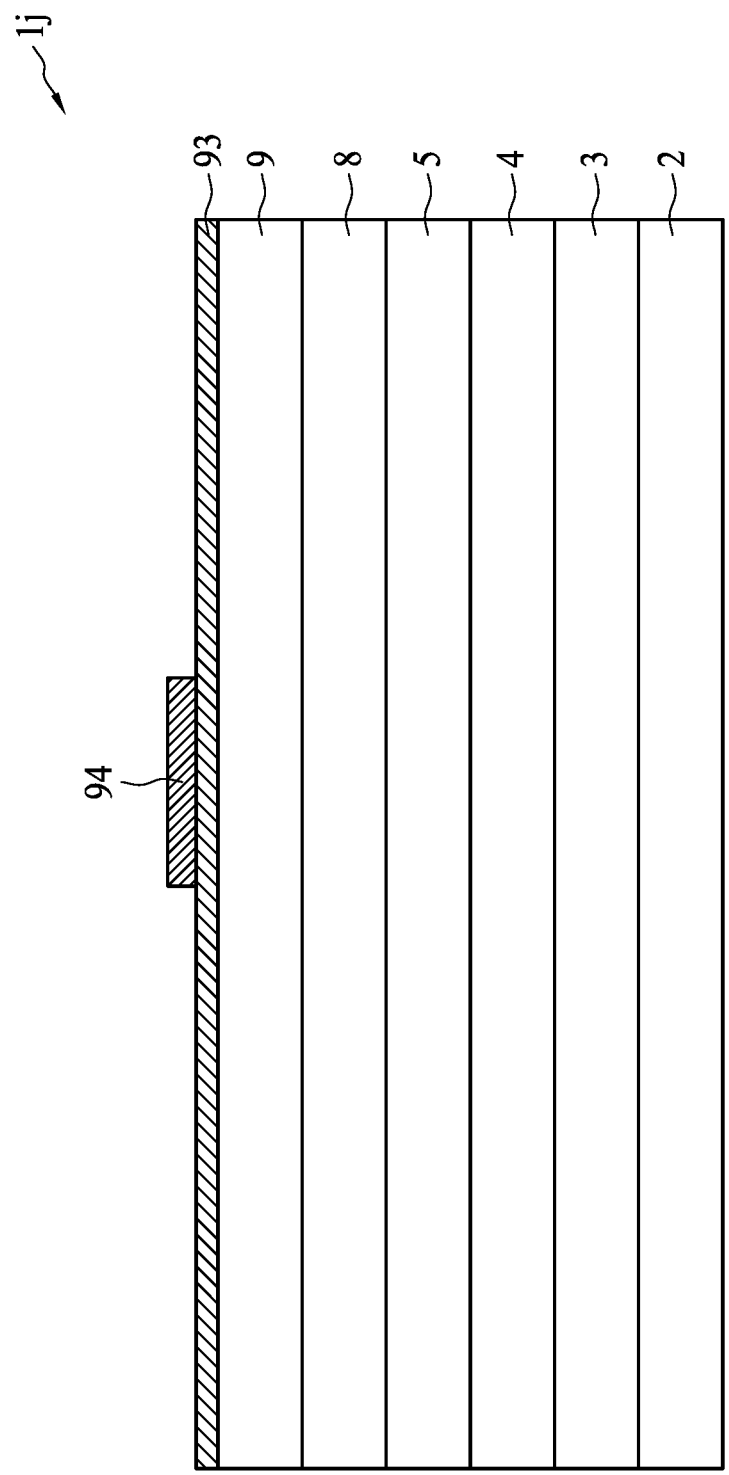
FIGS. 4 (a) to (h) show several operations for manufacturing a semiconductor device according to some embodiments of the present invention.
Figure 4B:
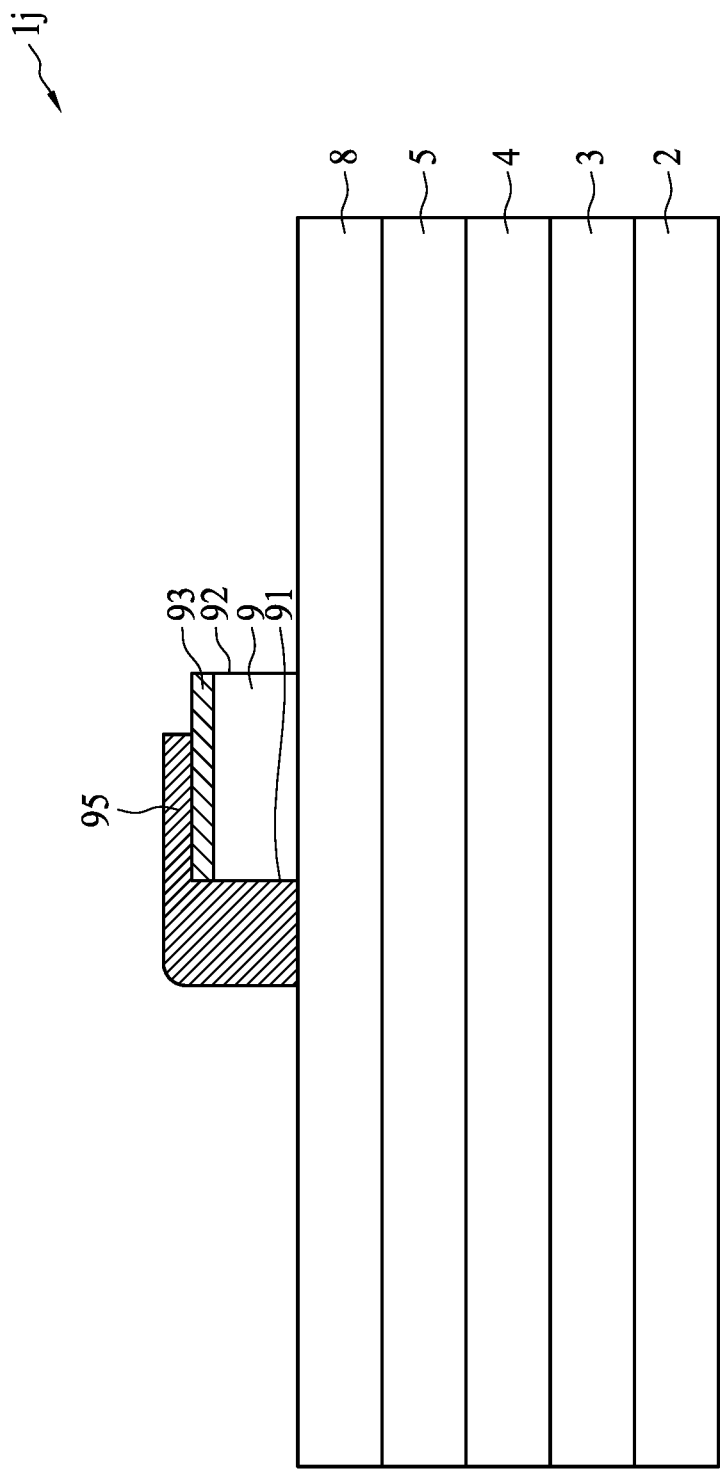
Figure 4C:
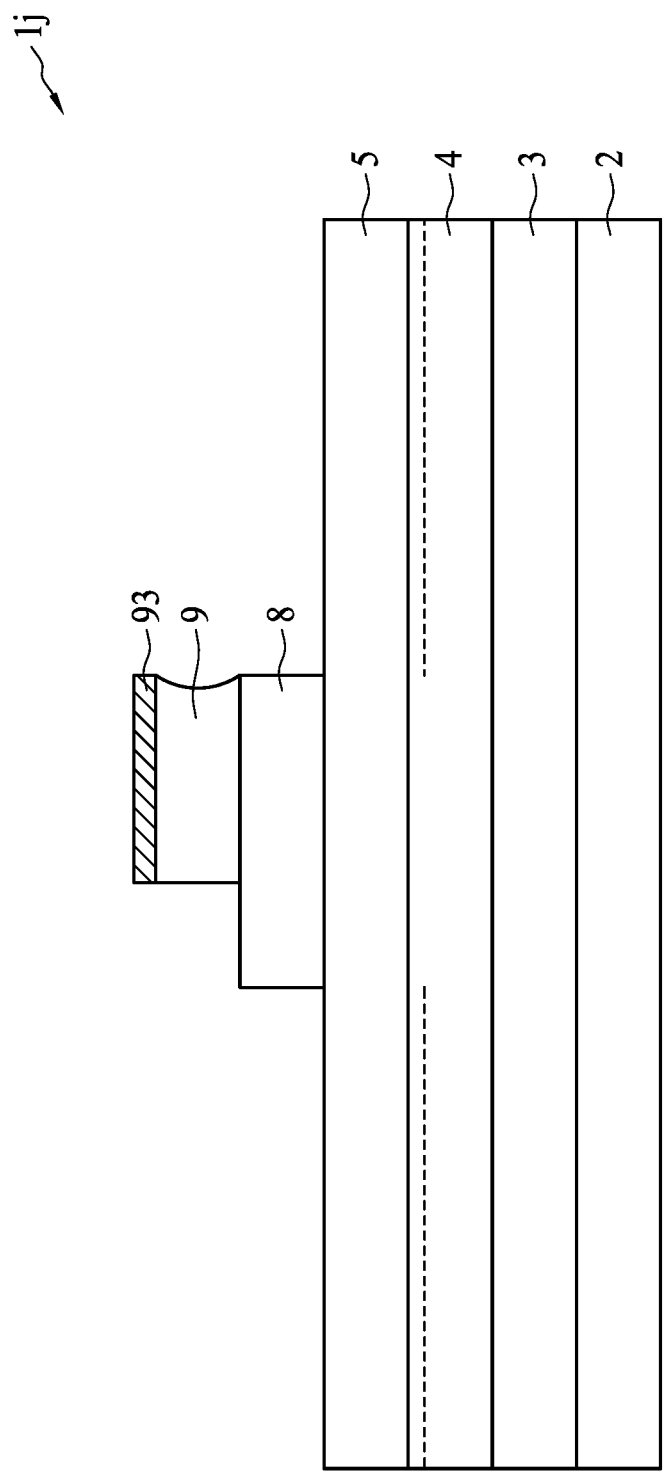
Figure 4D:
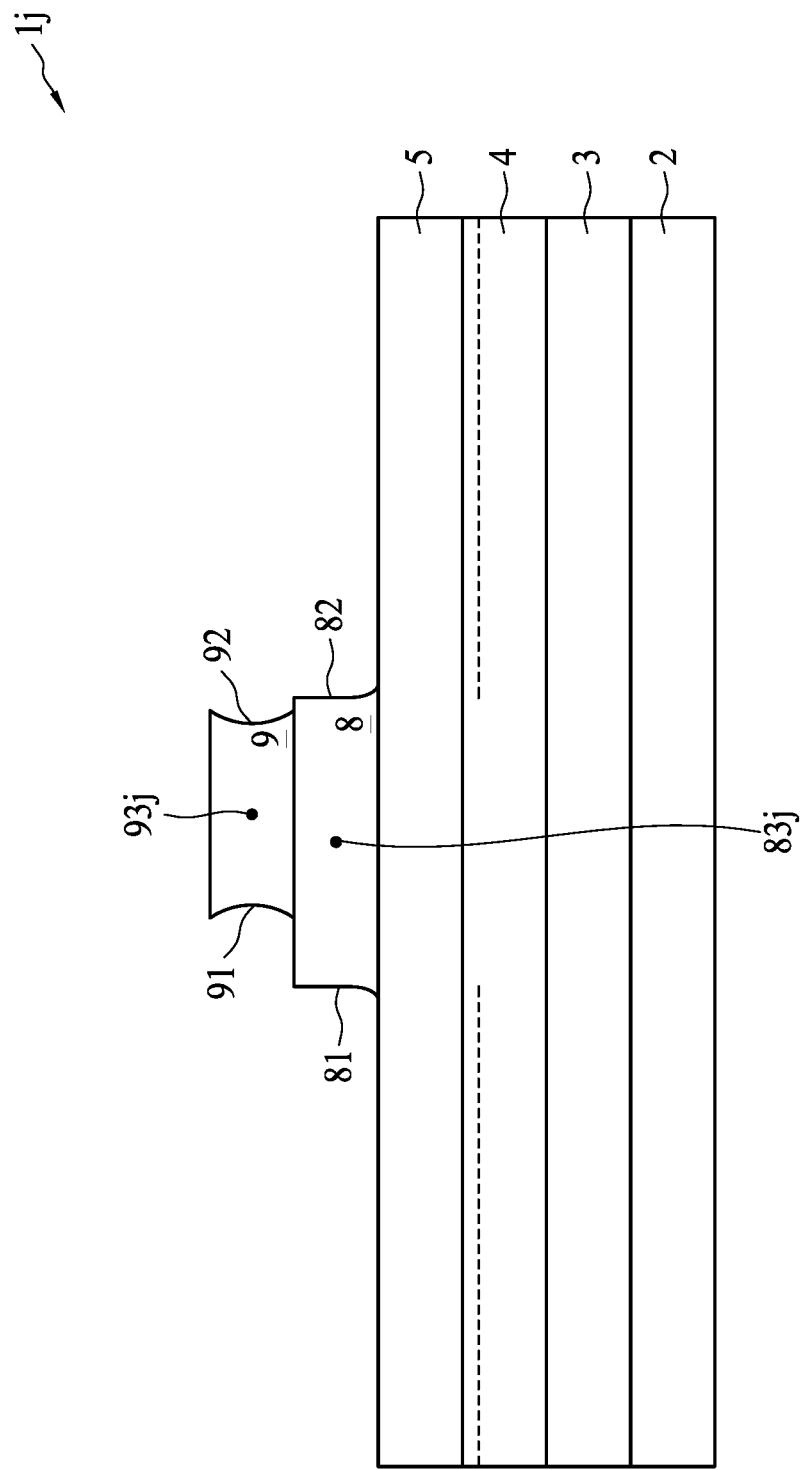
Figure 4E:
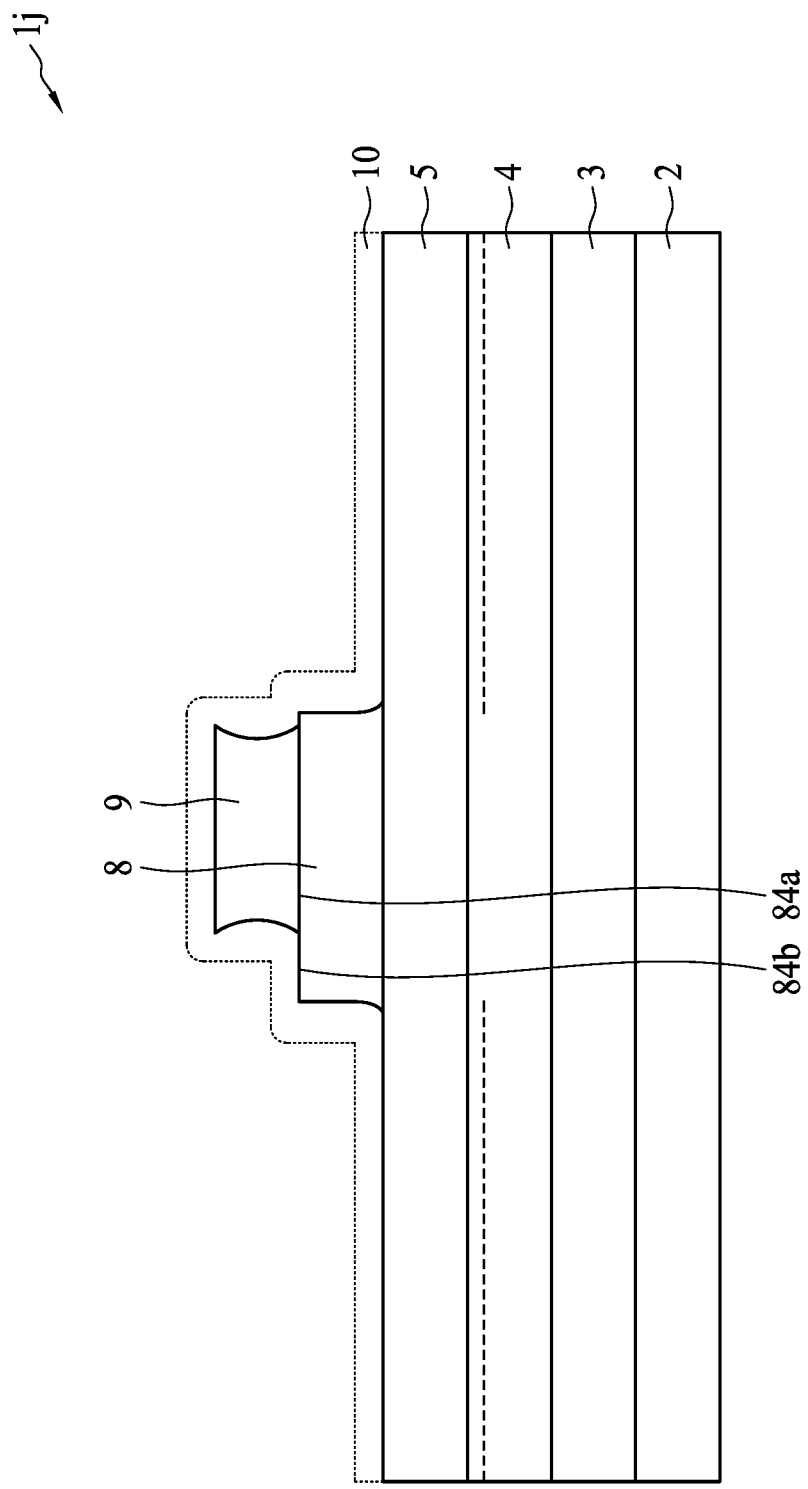
Figure 4F:
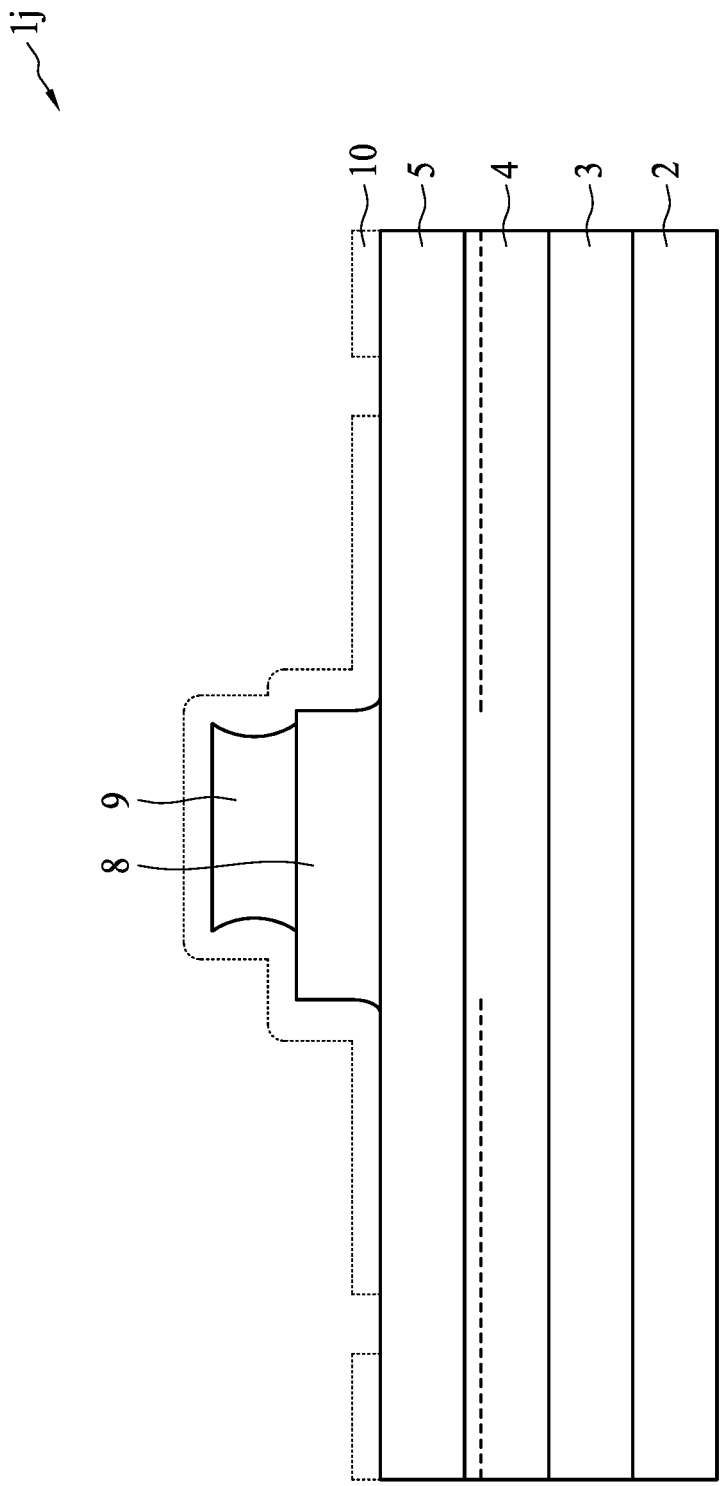
Figure 4G:
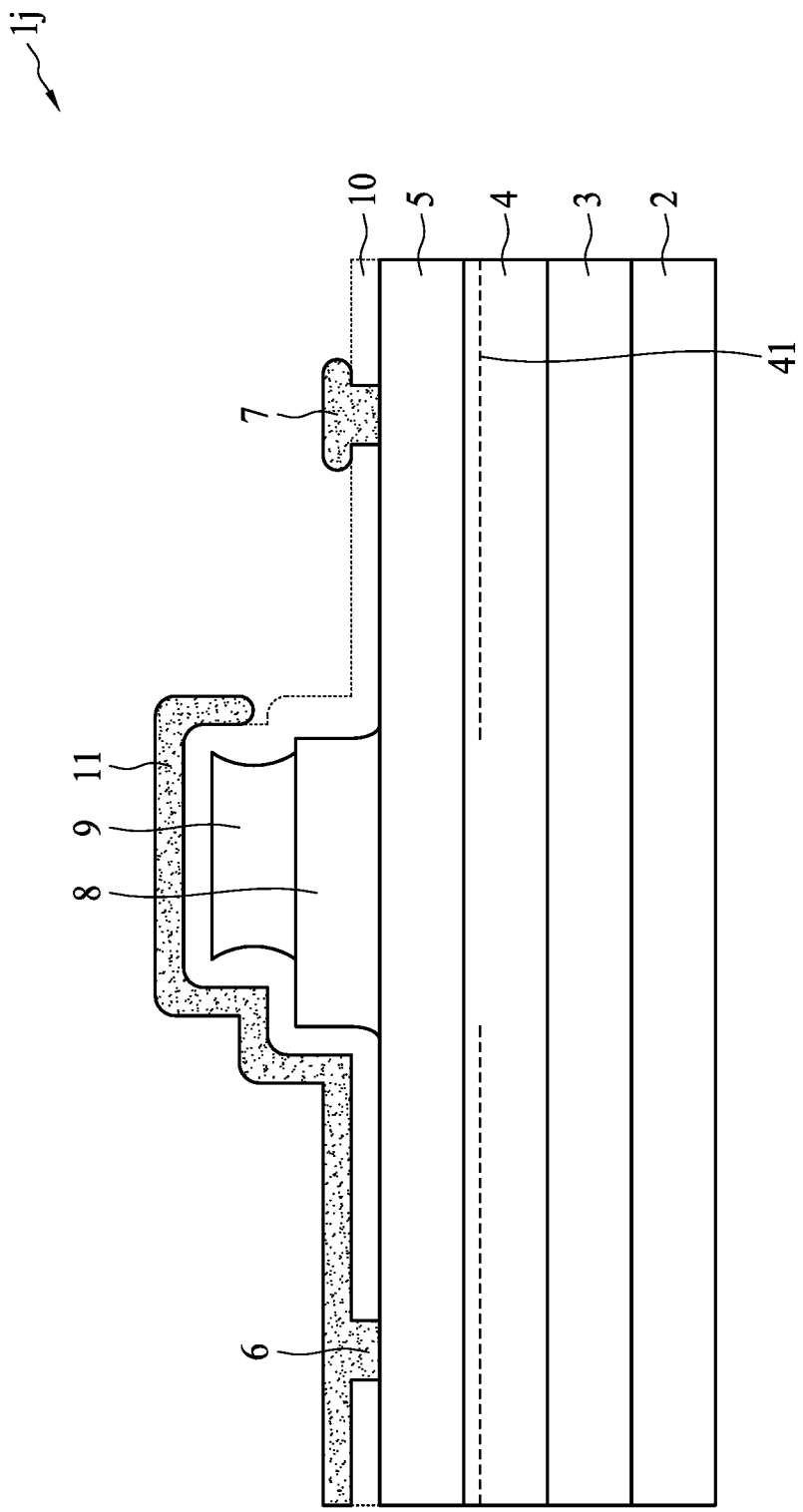
Figure 4H:
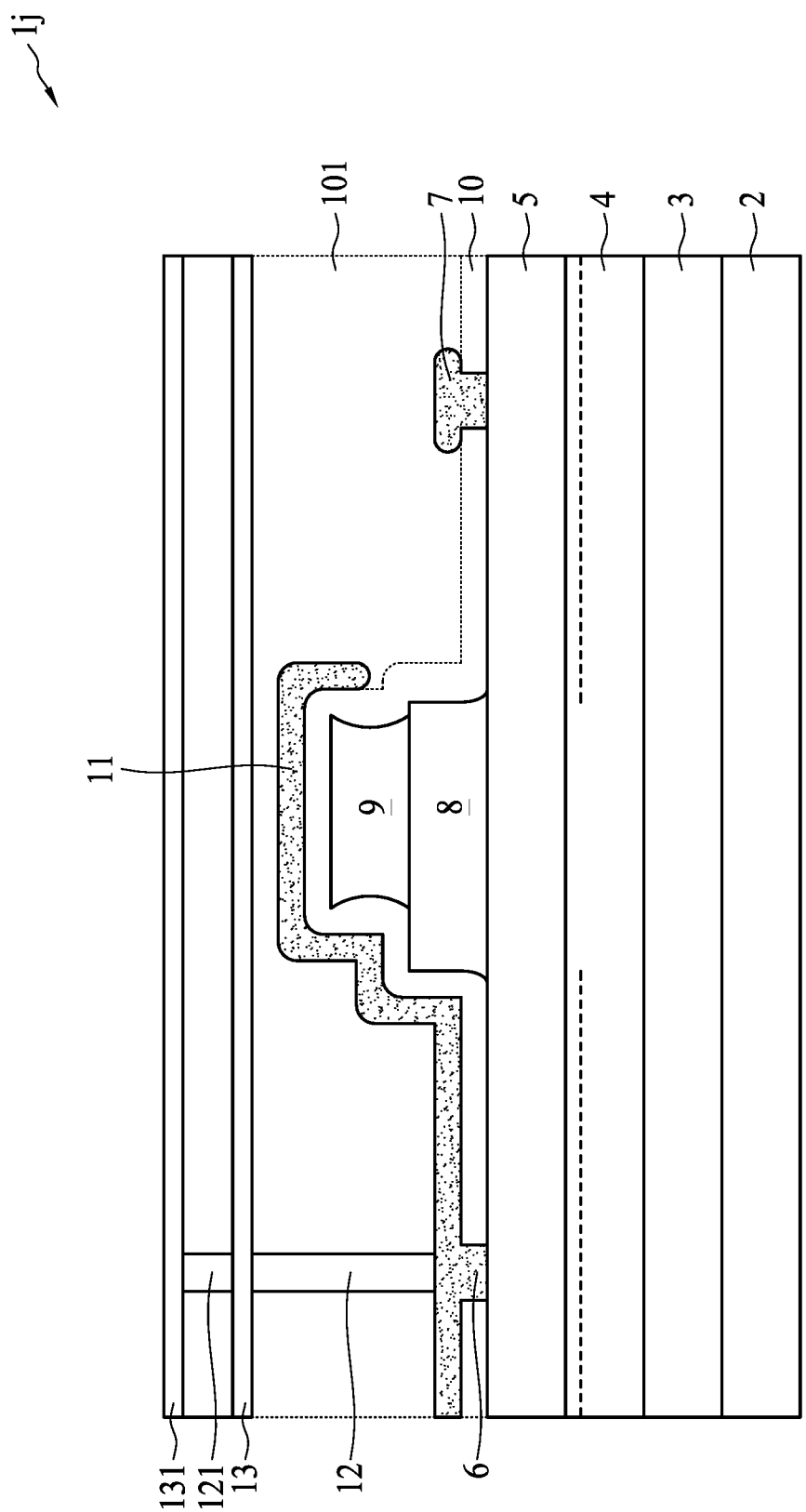

FIGS. 1 to 3 show the HEMT devices 1a to 1i according to some embodiments of the present invention. The structures are substantially drawn along a tangent plane of a connecting line of a source contact 6 and a drain contact 7.

Generally, the HEMT device is constructed on a substrate 2. A channel layer 4 and a barrier layer 5 are arranged on the substrate 2. The barrier layer 5 and the channel layer 4 are configured to form two-dimensional electron gas (2DEG) 41 in the channel layer 4 along an interface between the channel layer 4 and the barrier layer 5. The source contact 6, gate structures 80a, 80b, and 80c, and the drain contact 7 are additionally arranged on the barrier layer 5. The gate structures 80a, 80b, and 80c are positioned between the source contact 6 and the drain contact 7 substantially in a direction of the two-dimensional electron gas 41, and include a doped group III-V layer 8 and a gate electrode 9.

The substrate 2 may include, but is not limited to, silicon (Si), doped silicon (doped Si), gallium nitride, zinc oxide, silicon carbide (SiC), silicon germanium (SiGe), gallium arsenide (GaAs), sapphire, silicon on an insulator (SOI), or other suitable materials, preferably silicon. In some embodiments, the substrate 2 may also include a doped region (not shown in the figure), for example, p-well and/or n-well. The substrate 2 has an active layer and a back layer opposite to the active layer. An integrated circuit may be formed above the active layer.

As mentioned above, a leakage current $J_{gd}$ between a source and a drain determines the power consumption of $C_{gd}$. The inventors of the present application have unexpectedly found that the magnitude of $J_{gd}$ may be modulated by precisely designing geometric shapes of the gate structures 80a, 80b, and 80c. The inventors have found that under the condition that the total gate leakage current cannot be further reduced due to the limitation by a manufacturing process technology, a proportion between $J_{gd}$ and $J_{sd}$ may be regulated by a technical measure of changing the symmetry of the gate structure of the present invention, thus achieving the effects of increasing $J_{gs}$, reducing $J_{gd}$ and decreasing $C_{gd}$, and further achieving the goal of reducing the power consumption of $C_{gd}$.

On the other hand, a leakage current $J_{gs}$ between the gate and the source determines the charging time of $C_{gs}$. Therefore, under the condition that the total gate leakage current cannot be further reduced due to the limitation by the manufacturing process technology, a proportion between $J_{gd}$ and $J_{sd}$ may be regulated by a technical measure of changing the symmetry of the gate structure of the present invention, thus achieving the effects of increasing $J_{gd}$, reducing $J_{gs}$ and decreasing the charging time of $C_{gs}$, and further achieving the goal of reducing the circuit delay.

In some embodiments, having generated a practical channel (electron channel region) under the gate electrode 9, the channel layer 4 is preset to be in an ON state when the gate electrode 9 is in a zero-bias state. Such a device may also be called as a depletion mode device.

An enhancement mode device is contrary to the depletion mode device. The enhancement mode device is preset to be in an OFF state when the gate electrode 9 is in the zero-bias state. To form the enhancement mode device, the doped group III-V layer 8 is necessarily disposed between the gate electrode 9 and the barrier layer 5 so as to deplete or remove part of the two-dimensional electron gas 41.

In some embodiments, the doped group III-V layer 8 and the channel layer 4 may form a pn junction used to deplete the two-dimensional electron gas 41. Since the pn junction deplete the two-dimensional electron gas 41, when the gate electrode 9 is in the zero-bias state, no current passes through the HEMT devices 1a to 1i, i.e., a threshold voltage of the HEMT devices 1a to 1i is a positive value. The doped group III-V layer 8 is favorable for reducing the leakage current, and increasing the threshold voltage.

In some embodiments, the gate electrode 9 may be used as a stop layer or a protective layer to protect the whole top surface of the doped group III-V layer 8, so that the surface of the doped group III-V layer 8 cannot generate bulges or recesses (or relatively uneven surfaces) due to the removal operation (such as etching).

FIGS. 1 (a) to 1 (h) show one or more embodiments of some gate structures 80a, 80b, and 80c according to the present invention. As shown in FIG. 1 (a), the gate structure 80a may include a doped group III-V layer 8 and a gate electrode 9. The doped group III-V layer 8 may have a top surface. The top surface has a portion 84a and another portion 84b surrounding the portion 84a. In some embodiments, the portion 84a of the doped group III-V layer 8 is in direct contact with the gate electrode 9, and the second portion 84b may be in direct contact with the passivation layer (not shown in FIGS. 1 (a) to 1 (h)). The doped group III-V layer 8 has a first sidewall 81 adjacent to a source contact 6 and a second sidewall 82 adjacent to a drain contact. Substantially in a tangential direction of the two-dimensional electron gas 41, the shortest distance between the first sidewall 81 and the source contact 6 is substantially equal to the shortest distance between the second sidewall 82 and the drain contact 7, i.e., $L_1 \approx L_2$. $L_1$ is the shortest distance between the first sidewall 81 and the source contact 6 substantially in the tangential direction of the two-dimensional electron gas 41, and $L_2$ is the shortest distance between the second sidewall 82 and the drain contact 7 substantially in the tangential direction of the two-dimensional electron gas 41.

The gate electrode 9 has a third sidewall 91 adjacent to the source contact 6 and a fourth sidewall 92 adjacent to the drain contact. Substantially in the tangential direction of the two-dimensional electron gas 41, a distance between the third sidewall 91 and the first sidewall 81 is substantially equal to a distance between the fourth sidewall 92 and the second sidewall 82. Therefore, under the condition that $L_1 \approx L_2$, $(L_3-L_1) \approx (L_4-L_2)$. $L_3$ is the shortest distance between the third sidewall 91 and the source contact 6 substantially in the tangential direction of the two-dimensional electron gas 41, and $L_4$ is the shortest distance between the fourth sidewall 92 and the drain contact 7 substantially in the tangential direction of the two-dimensional electron gas 41.

In some embodiments, a doped group III-V layer 8 and a gate electrode 9 in the gate structure 80a may be subjected to a three-dimensional configuration in the manner as shown in FIG. 1 (b). The relative position of the doped group III-V layer 8 and the gate electrode 9 is as described above. The doped group III-V layer 8 and the gate electrode 9 substantially extend in a direction vertical to a connecting line of the source contact 6 and the drain contact 7 and in the tangential direction of the two-dimensional electron gas 41.

FIG. 1 (c) shows enlarged views of the first sidewall 81, the second sidewall 82, the third sidewall 91, and the fourth sidewall 92 in FIG. 1 (a) in dotted boxes. With reference to FIG. 1 (c), if the distance between the third sidewall 91 and the first sidewall 81 is substantially equal to the distance between the fourth sidewall 92 and the second sidewall 82, i.e., $(L_3-L_1) \approx (L_4-L_2)$, the HEMT device 1a is generally formed by a self-aligned manufacturing process. The formed gate structure 80a is called as a self-aligned gate structure. The self-aligned manufacturing process only uses a single mask, the first sidewall 81 and the second sidewall 82 of the doped group III-V layer 8 are etched at the same time in one step of manufacturing process, and the third sidewall 91 and the fourth sidewall 92 of the gate electrode 9 are etched at the same time in another step of manufacturing process, thus forming the doped group III-V layer 8 and the gate electrode 9 with the minimum critical dimension (CD). Therefore, the self-aligned gate structure 80a is characterized in that the first sidewall 81 and the second sidewall 82 of the doped group III-V layer 8 are substantially in specular symmetry with respect to the geometric center 83a of the doped group III-V layer 8. The third sidewall 91 and the fourth sidewall 92 of the gate electrode 9 are substantially in specular symmetry with respect to the geometric center 93a of the gate electrode 9. In some embodiments, the surface roughness of the third sidewall 91 is similar to the surface roughness of the fourth sidewall 92.

As shown in FIG. 1 (d), under the condition that $L_1 \approx L_2$, the distance between the third sidewall 91 and the first sidewall 81 is greater than the distance between the fourth sidewall 92 and the second sidewall 82, i.e., $(L_3-L_1) > (L_4-L_2)$.

In some embodiments, a doped group III-V layer 8 and a gate electrode 9 in the gate structure 80b may be subjected to a three-dimensional configuration in the manner as shown in FIG. 1 (*e*). The relative position of the doped group III-V layer 8 and the gate electrode 9 is as described above. The doped group III-V layer 8 and the gate electrode 9 substantially extend in the direction vertical to the connecting line of the source contact 6 and the drain contact 7 and in the tangential direction of the two-dimensional electron gas 41.

FIG. 1 (*f*) shows enlarged views of the third sidewall 91 and the fourth sidewall 92 in FIG. 1 (*d*) in dotted boxes. Although the shortest distance between the first sidewall 81 and the source contact 6 is substantially equal to the shortest distance between the second sidewall 82 and the drain contact 7, i.e., $L_1 \approx L_2$, the distance between the third sidewall 91 and the first sidewall 81 is greater than the distance between the fourth sidewall 92 and the second sidewall 82, i.e., $(L_3-L_1)>(L_4-L_2)$. The gate structure 80*b* of such a HEMT device 1*b* cannot be formed by the self-aligned manufacturing process (a manufacturing process using the single mask), that is, it is necessary for the third sidewall 91 and the fourth sidewall 92 to be respectively formed in different steps of photolithography and etching manufacturing processes. Therefore, the structures shown in FIGS. 1 (*d*) to (*f*) are characterized in that the third sidewall 91 and the fourth sidewall 92 of the gate electrode 9 are substantially in non-specular symmetry with respect to the geometric center 93*a* of the gate electrode 9. Additionally, the geometric center 93*b* of the gate electrode 9 does not coincide with the geometric center 83*b* of the doped group III-V layer 8 substantially in a normal direction of the two-dimensional electron gas, and geometric/etching shielding environments around the first sidewall 81 and the second sidewall 82 of the doped group III-V layer 8 are different, so that the first sidewall 81 and the second sidewall 82 of the doped group III-V layer 8 are substantially in non-specular symmetry with respect to the geometric center 83*b* of the doped group III-V layer 8. In some embodiments, the surface roughness of the third sidewall 91 is substantially different from the surface roughness of the fourth sidewall 92.

As shown in FIG. 1 (*g*), under the condition that $L_1 \approx L_2$, the distance between the third sidewall 91 and the first sidewall 81 is smaller than the distance between the fourth sidewall 92 and the second sidewall 82, i.e., $(L_3-L_1)<(L_4-L_2)$.

In some embodiments, a doped group III-V layer 8 and a gate electrode 9 in the gate structure 80*c* may be subjected to a three-dimensional configuration in the manner as shown in FIG. 1 (*h*). The relative position of the doped group III-V layer 8 and the gate electrode 9 is as described above. The doped group III-V layer 8 and the gate electrode 9 substantially extend in the direction vertical to the connecting line of the source contact 6 and the drain contact 7 and in the tangential direction of the two-dimensional electron gas 41.

As mentioned above, in the gate structure 80*c* of the HEMT device 1*c* shown in FIG. 1 (*g*), the geometric center 93*b* of the gate electrode 9 does not coincide with the geometric center 83*b* of the doped group III-V layer 8 substantially in the normal direction of the two-dimensional electron gas, so that the gate structure 80*b* of the HEMT device 1*c* cannot be formed by the self-aligned manufacturing process (a manufacturing process using the single mask). That is, it is necessary for the first sidewall 81, the second sidewall 82, the third sidewall 91, and the fourth sidewall 92 to be respectively formed in different steps of photolithography and etching manufacturing processes, and the geometric/etching shielding environments around the first sidewall 81 and the second sidewall 82 are different. Therefore, the structure shown in FIG. 1 (*g*) is characterized in that the first sidewall 81 and the second sidewall 82 of the doped group III-V layer 8 are substantially in non-specular symmetry with respect to the geometric center 83*c* of the doped group III-V layer 8. The third sidewall 91 and the fourth sidewall 92 of the gate electrode 9 are substantially in non-specular symmetry with respect to the geometric center 93*c* of the gate electrode 9. In some embodiments, the surface roughness of the third sidewall 91 is substantially different from the surface roughness of the fourth sidewall 92.

As shown in FIGS. 2 (*a*) to (*c*), substantially in the tangential direction of the two-dimensional electron gas 41, the shortest distance between the first sidewall 81 and the source contact 6 is greater than the shortest distance between the second sidewall 82 and the drain contact 7, i.e., $L_1>L_2$.

Under the condition that $L_1>L_2$, as shown in FIG. 2 (*a*), the distance between the third sidewall 91 and the first sidewall 81 is substantially equal to the distance between the fourth sidewall 92 and the second sidewall 82, i.e., $(L_3-L_1) \approx (L_4-L_2)$. As mentioned above, if the distance between the third sidewall 91 and the first sidewall 81 is substantially equal to the distance between the fourth sidewall 92 and the second sidewall 82, i.e., $(L_3-L_1) \approx (L_4-L_2)$, the HEMT device 1*d* has a self-aligned gate structure 80*a*. The first sidewall 81 and the second sidewall 82 of the doped group III-V layer 8 are substantially in specular symmetry with respect to the geometric center 83*d* of the doped group III-V layer 8. The third sidewall 91 and the fourth sidewall 92 of the gate electrode 9 are substantially in specular symmetry with respect to the geometric center 93*d* of the gate electrode 9. In some embodiments, the three-dimensional configuration of the doped group III-V layer 8 and the gate electrode 9 may be as shown in FIG. 1 (*b*). In some embodiments, the surface roughness of the third sidewall 91 is similar to the surface roughness of the fourth sidewall 92.

Under the condition that $L_1>L_2$, as shown in FIG. 2 (*b*), the distance between the third sidewall 91 and the first sidewall 81 is greater than the distance between the fourth sidewall 92 and the second sidewall 82, i.e., $(L_3-L_1)>(L_4-L_2)$. As mentioned above, in the gate structure 80*b* of the HEMT device 1*e*, the geometric center 93*e* of the gate electrode 9 does not coincide with the geometric center 83*e* of the doped group III-V layer 8 substantially in the normal direction of the two-dimensional electron gas, so that the gate structure 80*b* of the HEMT device 1*e* cannot be formed by the self-aligned manufacturing process (a manufacturing process using the single mask). That is, it is necessary for the first sidewall 81, the second sidewall 82, the third sidewall 91, and the fourth sidewall 92 to be respectively formed in different steps of photolithography and etching manufacturing processes, and the geometric/etching shielding environments around the first sidewall 81 and the second sidewall 82 are different. Therefore, the structure shown in FIG. 2 (*b*) is characterized in that the first sidewall 81 and the second sidewall 82 of the doped group III-V layer 8 are substantially in non-specular symmetry with respect to the geometric center 83*e* of the doped group III-V layer 8, and the third sidewall 91 and the fourth sidewall 92 of the gate electrode 9 are substantially in non-specular symmetry with respect to the geometric center 93*e* of the gate electrode 9. In some embodiments, the three-dimensional configuration of the doped group III-V layer 8 and the gate electrode 9 may be as shown in FIG. 1 (*e*). In some embodiments, the surface roughness of the third sidewall 91 is substantially different from the surface roughness of the fourth sidewall 92.

Under the condition that $L_1>L_2$, as shown in FIG. 2 (*c*), the distance between the third sidewall 91 and the first sidewall 81 is smaller than the distance between the fourth sidewall 92 and the second sidewall 82, i.e., $(L_3-L_1)<(L_4-L_2)$. As mentioned above, in the gate structure 80c of the HEMT device 1f, the geometric center 93f of the gate electrode 9 does not coincide with the geometric center 83f of the doped group III-V layer 8 substantially in the normal direction of the two-dimensional electron gas, so that the gate structure 80c of the HEMT device if cannot be formed by the self-aligned manufacturing process (a manufacturing process using the single mask). That is, it is necessary for the first sidewall 81, the second sidewall 82, the third sidewall 91, and the fourth sidewall 92 to be respectively formed in different steps of photolithography and etching manufacturing processes, and the geometric/etching shielding environments around the first sidewall 81 and the second sidewall 82 are different. Therefore, the structure shown in FIG. 2 (c) is characterized in that the first sidewall 81 and the second sidewall 82 of the doped group III-V layer 8 are substantially in non-specular symmetry with respect to the geometric center 83f of the doped group III-V layer 8, and the third sidewall 91 and the fourth sidewall 92 of the gate electrode 9 are substantially in non-specular symmetry with respect to the geometric center 93f of the gate electrode 9. In some embodiments, the three-dimensional configuration of the doped group III-V layer 8 and the gate electrode 9 may be as shown in FIG. 1 (h). In some embodiments, the surface roughness of the third sidewall 91 is substantially different from the surface roughness of the fourth sidewall 92.

As shown in FIGS. 3 (a) to (c), substantially in the tangential direction of the two-dimensional electron gas 41, the shortest distance between the first sidewall 81 and the source contact 6 is smaller than the shortest distance between the second sidewall 82 and the drain contact 7, i.e., $L_1<L_2$.

Under the condition that $L_1<L_2$, as shown in FIG. 3 (a), the distance between the third sidewall 91 and the first sidewall 81 is substantially equal to the distance between the fourth sidewall 92 and the second sidewall 82, i.e., $(L_3-L_1) \approx (L_4-L_2)$. As mentioned above, if the distance between the third sidewall 91 and the first sidewall 81 is substantially equal to the distance between the fourth sidewall 92 and the second sidewall 82, i.e., $(L_3-L_1) \approx (L_4-L_2)$, the HEMT device 1g has a self-aligned gate structure 80a. The first sidewall 81 and the second sidewall 82 of the doped group III-V layer 8 are substantially in specular symmetry with respect to the geometric center 83g of the doped group III-V layer 8. The third sidewall 91 and the fourth sidewall 92 of the gate electrode 9 are substantially in specular symmetry with respect to the geometric center 93g of the gate electrode 9. In some embodiments, the three-dimensional configuration of the doped group III-V layer 8 and the gate electrode 9 may be as shown in FIG. 1 (b). In some embodiments, the surface roughness of the third sidewall 91 is similar to the surface roughness of the fourth sidewall 92.

Under the condition that $L_1<L_2$, as shown in FIG. 3 (b), the distance between the third sidewall 91 and the first sidewall 81 is greater than the distance between the fourth sidewall 92 and the second sidewall 82, i.e., $(L_3-L_1)>(L_4-L_2)$. As mentioned above, in the gate structure 80b of the HEMT device 1h, the geometric center 93h of the gate electrode 9 does not coincide with the geometric center 83h of the doped group III-V layer 8 substantially in the normal direction of the two-dimensional electron gas, so that the gate structure 80b of the HEMT device 1h cannot be formed through the self-aligned manufacturing process (a manufacturing process using the single mask). That is, it is necessary for the first sidewall 81, the second sidewall 82, the third sidewall 91, and the fourth sidewall 92 to be respectively formed in different steps of photolithography and etching manufacturing processes, and the geometric/etching shielding environments around the first sidewall 81 and the second sidewall 82 are different. Therefore, the structure shown in FIG. 2 (b) is characterized in that the first sidewall 81 and the second sidewall 82 of the doped group III-V layer 8 are substantially in non-specular symmetry with respect to the geometric center 83h of the doped group III-V layer 8, and the third sidewall 91 and the fourth sidewall 92 of the gate electrode 9 are substantially in non-specular symmetry with respect to the geometric center 93h of the gate electrode 9. In some embodiments, the three-dimensional configuration of the doped group III-V layer 8 and the gate electrode 9 may be as shown in FIG. 1 (e). In some embodiments, the surface roughness of the third sidewall 91 is substantially different from the surface roughness of the fourth sidewall 92.

Under the condition that $L_1<L_2$, as shown in FIG. 3 (c), the distance between the third sidewall 91 and the first sidewall 81 is smaller than the distance between the fourth sidewall 92 and the second sidewall 82, i.e., $(L_3-L_1)<(L_4-L_2)$. As mentioned above, in the gate structure 80c of the HEMT device 1i, the geometric center 93i of the gate electrode 9 does not coincide with the geometric center 83i of the doped group III-V layer 8 substantially in the normal direction of the two-dimensional electron gas, so that the gate structure 80c of the HEMT device 1i cannot be formed by the self-aligned manufacturing process (a manufacturing process using the single mask). That is, it is necessary for the first sidewall 81, the second sidewall 82, the third sidewall 91, and the fourth sidewall 92 to be respectively formed in different steps of photolithography and etching manufacturing processes, and the geometric/etching shielding environments around the first sidewall 81 and the second sidewall 82 are different. Therefore, the structure shown in FIG. 2 (c) is characterized in that the first sidewall 81 and the second sidewall 82 of the doped group III-V layer 8 are substantially in non-specular symmetry with respect to the geometric center 83i of the doped group III-V layer 8, and the third sidewall 91 and the fourth sidewall 92 of the gate electrode 9 are substantially in non-specular symmetry with respect to the geometric center 93i of the gate electrode 9. In some embodiments, the three-dimensional configuration of the doped group III-V layer 8 and the gate electrode 9 may be as shown in FIG. 1 (h). In some embodiments, the surface roughness of the third sidewall 91 is substantially different from the surface roughness of the fourth sidewall 92.

In some embodiments, an included angle between any tangent plane of the first sidewall 81 mentioned above and the substantially tangential direction of the two-dimensional electron gas is 30 to 90°, for example, but not limited to, 35°, 40°, 45°, 50°, 55°, 60°, 65°, 70°, 75°, 80°, or 85°. In some embodiments, an included angle between any tangent plane of the second sidewall 82 mentioned above and the substantially tangential direction of the two-dimensional electron gas is 30 to 90°, for example, but not limited to, 35°, 40°, 45°, 50°, 55°, 60°, 65°, 70°, 75°, 80°, or 85°. In some embodiments, an included angle between any tangent plane of the third sidewall 91 mentioned above and the substantially tangential direction of the two-dimensional electron gas is 30 to 90°, for example, but not limited to, 35°, 40°, 45°, 50°, 55°, 60°, 65°, 70°, 75°, 80, or 85°. In some embodiments, an included angle between any tangent plane of the four sidewall 92 mentioned above and the substantially tangential direction of the two-dimensional electron gas is 30 to 90°, for example, but not limited to, 35°, 40°, 45°, 50°, 55°, 60°, 65°, 70°, 75°, 80°, or 85°.

The distance between the doped group III-V layer 8 and the source contact 6 and the distance between the doped group III-V layer and the drain contact 7, i.e., $L_1$ and $L_2$ may be defined by a mask. The sizes of $L_1$ and $L_2$ are related to not only a gate leakage current path, but also the operating voltage of the gate electrode. During application to a low-voltage device (for example, a component applicable to 10 V to 200 V), $L_1$ is generally 200 to 1200 nm, for example, but not limited to, 200 nm, 300 nm, 400 nm, 500 nm, 600 nm, 700 nm, 800 nm, 900 nm, 1000 nm, 1100 nm, or 1200 nm, and $L_2$ is generally 1 to 4 µm, for example, but not limited to, 1 µm, 1.2 µm, 1.4 µm, 1.5 µm, 1.6 µm, 1.8 µm, 2.0 µm, 2.2 µm, 2.4 µm, 2.5 µm, 2.6 µm, 2.8 µm, 3.0 µm, 3.2 µm, 3.4 µm, 3.5 µm, 3.6 µm, 3.8 µm, or 4.0 µm. During application to a high-voltage device (for example, a component applicable to 200 V or higher), in order to improve the voltage tolerance, a distance between conductor structures (for example, a distance between a gate and a drain) may be generally designed to $L_1$ of 1 to 3 µm, for example, but not limited to, 1 µm, 1.2 µm, 1.4 µm, 1.5 µm, 1.6 µm, 1.8 µm, 2.0 µm, 2.2 µm, 2.4 µm, 2.5 µm, 2.6 µm, 2.8 µm, or 3.0 µm, and $L_2$ of 5 to 20 µm, for example, but not limited to, 5 µm, 6 µm, 8 µm, 10 µm, 12 µm, 14 µm, 15 µm, 16 µm, 18 µm, or 20 µm. Such distances are generally 5 times of those of a relatively-low-voltage component (for example, the component applicable to 10 V to 200 V). For example, if the semiconductor components 1a to 1i are applicable to 600 V or above, the distances between the gate structures 80a, 80b, and 80c and the drain contact 7 are generally greater than 15 µm.

In the gate structure 80b, the distance between the third sidewall 91 and the first sidewall 81 is greater than the distance between the fourth sidewall 92 and the second sidewall 82, so that the geometric centers 93b, 93e, and 93h of the gate electrode 9 deviate to the side of the drain contact 7 relative to the geometric centers 83b, 83e, and 83h of the doped group III-V layer 8. Under some conditions, $(L_3-L_1)/(L_4-L_2)$ is greater than 1.1, for example, but not limited to, 1.1, 1.15, 1.25, 1.3, 1.35, 1.4, 1.45, 1.5, 1.55, 1.6, 1.65, 1.7, 1.75, 1.8, 1.85, 1.9, 1.95, and 2.

Under some conditions, the fourth sidewall 92 is substantially coplanar with the second sidewall 82, and in this case, $L_4 \approx L_2$ (the difference is smaller than 10 nm). Under some conditions, the fourth sidewall 92 is substantially not coplanar with the second sidewall 82, and in this case, $L_4-L_2$ is, for example, but not limited to, 10 nm, 12 nm, 14 nm, 15 nm, 16 nm, 18 nm, 20 nm, 25 nm, 30 nm, 35 nm, 40 nm, 45 nm, 50 nm, 60 nm, 70 nm, 80 nm, 90 nm, 100 nm, 120 nm, 140 nm, 150 nm, 160 nm, 180 nm, or 200 nm.

In the gate structure 80c, the distance between the third sidewall 91 and the first sidewall 81 is smaller than the distance between the fourth sidewall 92 and the second sidewall 82, so that the geometric centers 93c, 93f, and 93i of the gate electrode 9 deviate to the side of the source contact 6 relative to the geometric centers 83c, 83f, and 83i of the doped group III-V layer 8. Under some conditions, $(L_4-L_2)/(L_3-L_1)$ is greater than 1.1, for example, but not limited to, 1.1, 1.15, 1.25, 1.3, 1.35, 1.4, 1.45, 1.5, 1.55, 1.6, 1.65, 1.7, 1.75, 1.8, 1.85, 1.9, 1.95, and 2.

Under some conditions, the third sidewall 91 is substantially coplanar with the first sidewall 81, and in this case, $L_3 \approx L_1$ (the difference is smaller than 10 nm). Under some conditions, the third sidewall 91 is substantially not coplanar with the first sidewall 81, and in this case, $L_3-L_1$ is, for example, but not limited to, 10 nm, 12 nm, 14 nm, 15 nm, 16 nm, 18 nm, 20 nm, 25 nm, 30 nm, 35 nm, 40 nm, 45 nm, 50 nm, 60 nm, 70 nm, 80 nm, 90 nm, 100 nm, 120 nm, 140 nm, 150 nm, 160 nm, 180 nm, or 200 nm.

The doped group III-V layer 8 may include, but is not limited to, doped gallium nitride (doped GaN), doped aluminum gallium nitride (doped AlGaN), doped indium gallium nitride (doped InGaN), and other doped group III-V compounds. The doped group III-V layer 8 may include, but is not limited to, a p-type dopant, an n-type dopant, or other dopants. In some embodiments, an exemplary dopant may include, but is not limited to, magnesium (Mg), zinc (Zn), cadmium (Cd), silicon (Si), and germanium (Ge).

In low-voltage application (for example, the component applicable to 10 V to 200 V), the doped group III-V group layer 8 has the width greater than about 0.5 µm substantially in the tangential direction of the two-dimensional electron gas 41. In some embodiments, the width of the doped group III-V layer 8 may be about 0.5 µm to about 1.5 µm. In some embodiments, the width of the doped group III-V layer 8 may be about 0.8 µm to about 1.2 µm. In some embodiments, the width of the doped group III-V layer 8 may be about 1.0 µm.

In high-voltage application (for example, the component applicable to 200 V or higher), the doped group III-V group layer 8 has the width greater than about 1.8 µm substantially in the tangential direction of the two-dimensional electron gas 41.

The channel layer 4 may include a group III-V material, for example, but not limited to, group III nitrides, such as a compound $In_xAl_yGa_{1-x-y}N$, where $x+y \leq 1$, for example, x=0.1, 0.2, 0.3, 0.4, 0.5, 0.6, 0.7, 0.8, or 0.9. The group III nitrides may also include, for example, but are not limited to, a compound $Al_yGa_{(1-y)}N$, where $y \leq 1$, for example, y=0.1, 0.2, 0.3, 0.4, 0.5, 0.6, 0.7, 0.8, or 0.9.

The HEMT devices 1a to 1i also include a barrier layer 5 disposed on the channel layer 4. The barrier layer 5 may include, for example, but is not limited to, group III nitrides, such as a compound $In_xAl_yGa_{1-x-y}N$, where $x+y \leq 1$. The group III nitrides may also include, but are not limited to, a compound $Al_yGa_{(1-y)}N$, where $y \leq 1$, for example, y=0.1, 0.2, 0.3, 0.4, 0.5, 0.6, 0.7, 0.8, or 0.9. The barrier layer 5 may have a greater bandgap than the channel layer 4. For example, the channel layer 4 may include a GaN layer. GaN may have a bandgap of about 3.4 eV. The barrier layer 5 may include AlGaN. The AlGaN may have a bandgap of about 4 eV. The 2DEG region 41 is generally formed in a layer with a smaller bandgap (for example GaN). A heterojunction is formed between the barrier layer 5 and the channel layer 4. The 2DEG region 41 is formed in the channel layer 4 through polarization of the heterojunction of different nitrides. The channel layer 4 can provide or remove electrons in the 2DEG region, and conduction of the HEMT devices 1a to 1i can be further controlled.

The higher the aluminum content is, the higher the concentration of the two-dimensional electron gas in a gallium nitride buffer layer, and the higher the carrier concentration of the channel for high-current operation, which is a very important index for high-power components. In some embodiments, if AlGaN is used as a material of the barrier layer 5, the Al content is generally 20 to 40%. If the Al content is too high, crystalline blocks can be easily produced, and a problem of stress release of the epitaxial layer may also be generated.

The channel layer 4 may have an electron channel region shown by dotted lines (a two-dimensional electron gas 41 region), and the two-dimensional electron gas 41 region is generally easy to obtain in the heterostructure. In this region, the electron gas may freely move in a two-dimensional direction, and is limited in a third-dimensional direction (for example, substantially in the normal direction of the two-dimensional electron gas). It should be understood by those skilled in the art that as shown by disconnection in dotted lines, part of the two-dimensional electron gas 41 under the doped group III-V layer 8 has been exhausted. It should also be understood by those skilled in the art that as shown by the dotted line 41, the two-dimensional electron gas 41, including its exhausted region, in the channel layer 4 forms a channel region of the channel layer 4, and flowing of electrons through the channel region is controlled through a gate voltage applied onto the gate structures 80a, 80b, and 80c during operation. The channel layer 4 may be of a single-layer structure or a multi-layer structure. The channel layer 4 may also include a heterostructure.

The gate electrode 9 may be formed on the doped group III-V layer 8, for example, formed on the surface of the doped group III-V layer 8 so as to provide electric connection for the gate structures 80a, 80b, and 80c of the HEMT devices 1a to 1i. In some embodiments, the gate electrode 9 may include, but is not limited to, titanium (Ti), tantalum (Ta), tungsten (W), aluminum (Al), cobalt (Co), copper (Cu), nickel (Ni), platinum (Pt), plumbum (Pb), molybdenum (Mo) and compounds thereof (for example, but not limited to, titanium nitride (TiN), tantalum nitride (TaN), other conductive nitrides, or conductive oxides), metal alloy (such as Al—Cu alloy), or other suitable materials. It should be understood by those skilled in the art that the gate electrode 9 may be formed by a single metal or a metal stack (such as tungsten and/or titanium or other well-known electrode materials).

The gate electrode 9 may be in direct contact with the doped group III-V layer 8. The gate electrode 9 may also be electrically connected with the doped group III-V layer 8. In some embodiments, substantially in the normal direction of the two-dimensional electron gas 41, the doped barrier layer 5 is disposed under the gate electrode 9, and the gate electrode 9 is positioned above the doped group III-V layer 8. Under some conditions, the first gate electrode is configured to form a Schottky junction with the first doped group III-V layer to further reduce the gate leakage current.

In low-voltage application (for example, the component applicable to 10 V to 200 V), the gate electrode 9 has a width greater than about 0.4 μm substantially in the tangential direction of the two-dimensional electron gas 41. In some embodiments, the width of the gate electrode 9 may be about 0.4 μm to about 1.2 μm. In some embodiments, substantially in the tangential direction of the two-dimensional electron gas 41, the width of the gate electrode 9 is smaller than the width of the doped group III-V layer.

In high-voltage application (for example, the component applicable to 200 V or higher), the gate electrode 9 has a width greater than about 1.6 μm substantially in the tangential direction of the two-dimensional electron gas 41.

The HEMT devices 1a to 1i may also include the source contact 6 and the drain contact 7, and the source contact and the drain contact may be formed into a metal region disposed on the portion of the barrier layer 5. The metal of the source contact 6 and the drain contact 7 forms ohmic contact with the barrier layer 5 so as to collect electrons or provide electrons to the channel region. In some embodiments, metal for forming the source contact or the drain contact may include refractory metals or compounds thereof, for example, but not limited to, metals such as aluminum (Al), titanium (Ti), niobium (Nb), molybdenum (Mo), tantalum (Ta), tungsten (W), rhenium (Re), titanium (Ti), vanadium (V), chromium (Cr), zirconium (Zr), hafnium (Hf), ruthenium (Ru), osmium (Os) and iridium (Ir) or compounds of these metals, such as tantalum nitride (TaN), titanium nitride (TiN), and tungsten carbide (WC). It should be understood by those skilled in the art that the source contact 6 and the drain contact 7 may be formed by a single metal or a metal stack (such as tungsten and/or titanium or other well-known electrode materials).

In some embodiments, the channel layer 4 and the substrate 2 may be of homogeneous materials, for example, but not limited to GaN. No lattice constant or thermal expansion coefficient mismatch problem exists between the channel layer 4 and the substrate 2 during epitaxial growth. Therefore, the channel layer 4 may directly grow on the substrate 2 and is in direct contact with the substrate 2 without the need of using a buffer layer.

In some embodiments, the channel layer 4 and the substrate 2 are of heterogeneous materials. The channel layer 4 and the substrate 2 have different lattice constants and thermal expansion coefficients. During epitaxial growth, a great quantity of dislocation and cracks may be generally generated, thus further reducing the efficiency of the HEMT devices 1a to 1i or even causing dysfunction of the HEMT devices. In order to avoid the above conditions, the buffer layer (not shown in the figure) disposed between the substrate 2 and the channel layer 4 may be optionally used. The buffer layer may be used to promote lattice match between the substrate 2 and the channel layer 4 so as to reduce the interface stress and/or thermal stress of the heterogeneous materials, thus reducing the defects and crack density in the channel layer 4. Materials suitable to be used as the buffer layer include, for example, but are not limited to, oxides (such as zinc oxide) or nitrides (such as aluminum nitride (AlN) and aluminum gallium nitride (AlGaN)).

The HEMT devices 1a to 1i may also include a superlattice layer (not shown in FIGS. 1 to 3) disposed between the substrate 2 and the channel layer 4. The superlattice layer may be positioned between the channel layer 4 and the substrate 2. The superlattice layer may be multiple layers or a multi-layer stack, for example an AlGaN/GaN pair or a multi-layer stack of AlN/GaN. In some embodiments, the superlattice layer may reduce the tensile stress of the HEMT devices 1a to 1i. In some embodiments, the superlattice layer may also prevent defects (such as dislocation) from propagating into the channel layer 4 from a layer (such as the buffer layer) under the superlattice layer, so as to enhance the crystallization quality to the channel layer 4 and avoid the dysfunction of the HEMT devices 1a to 1i. In some embodiments, the superlattice layer may trap electrons diffused from the substrate 2 to the channel layer 4, thus further improving the efficiency and reliability of the device. In some embodiments, the superlattice layer may reduce electron trap.

In high-voltage application, in order to avoid direct breakdown of the voltage to the substrate 2, the superlattice layer may increase the integral size of the HEMT devices or structures to increase the breakdown voltage. The thickness of the superlattice layer is generally about 1 μm to 4 μm, and is greater than that of the buffer layer. When the superlattice layer is disposed, defects, such as delamination or peeling off, caused by lattice number and/or thermal expansion coefficient difference of the superlattice layer from adjacent materials still need to be considered. Additionally, the manufacturing cost will be greatly increased due to use of the superlattice layer.

In high-voltage application, in order to avoid direct breakdown of the voltage to the substrate 2, the buffer layer or the superlattice layer may be doped with other heterogeneous elements, for example, but not limited to, carbon, oxygen, or nitrogen, and they may be intentionally doped or unintentionally doped.

Application of Low-Voltage HEMT Devices

In some embodiments, the gate structure of the present invention may be applied to low-voltage HEMT devices. FIGS. 4 (a) to 4 (h) show several operations for manufacturing a low-voltage HEMT device 1j according to some embodiments of the present invention. Although FIGS. 4 (a) to 4 (h) show several operations for manufacturing the low-voltage HEMT device 1j, similar operations are also applicable.

With reference to FIG. 4 (a), a substrate 2 is provided. In some embodiments, a buffer layer 3 is disposed on the substrate 2. A channel layer 4, a barrier layer 5, and a doped group III-V layer 8 are disposed on the substrate 2 through epitaxial growth. A gate electrode 9 is additionally disposed on the doped group III-V layer 8. The gate electrode 9 is configured to form a Schottky junction with the doped group III-V layer 8. Additionally, photoresist 94 is applied to a hard mask 93 so as to position the position of the gate electrode 9 after the photolithography and etching processes. The patterned hard mask 93 is formed above the gate electrode 9. Then, a required portion of the gate electrode 9 may be retained, for example, in photolithography and etching modes.

The doped group III-V layer 8 and the gate electrode 9 are disposed on the substrate 2. In some embodiments, the doped group III-V layer 8 may be formed through metal organic chemical vapor deposition (MOCVD) or in any known epitaxial growth mode, and is doped with a dopant. Then, the gate electrode 9 is deposited onto the doped group III-V layer 8. In some embodiments, the gate electrode 9 may be formed through physical vapor deposition (PVD), chemical vapor deposition (CVD), atomic layer deposition (ALD), plating, and/or other proper deposition steps. In some embodiments, the gate electrode 9 is formed by a gate first process, i.e., the gate electrode 9 is formed before a source contact 6 and a drain contact 7 are formed.

In some embodiments, the hard mask 93 may include (but is not limited to) silicon dioxide ($SiO_2$), silicon nitride (SiN), silicon oxynitride (SiON), and silicon carbide (SiC). In some embodiments, the etching step may be performed through dry etching, wet etching, or a combination of the dry etching and the wet etching.

An etching agent for etching the gate electrode 9 may be ammonium hydroxide ($NH_4OH$), hydrogen peroxide ($H_2O_2$), sulfuric acid ($H_2SO_4$), hydrofluoric acid (HF), ammonium fluoride ($NH_4F$), or a mixture of the above compounds. The doped group III-V group layer 8 may be subjected to anisotropic etching in a dry etching mode.

With reference to FIG. 4 (b), patterned photoresist 95 is applied to the hard mask 93 and the gate electrode 9, and is enabled to coat a third sidewall 91 and/or a fourth sidewall 92 of the gate electrode 9.

With reference to FIG. 4 (c), the exposed doped group III-V layer 8 is etched. The etching of the exposed doped group III-V layer 8 and the gate electrode 9 may be performed by any known manufacturing process such as plasma etching. Then, the photoresist 95 is peeled off. As shown in FIGS. 4 (b) to (c), in some non-limiting embodiments, the fourth sidewall 92 of the gate electrode 9 is not protected by the photoresist, so that the fourth sidewall 92 may be etched together when the exposed doped group III-V layer 8 is etched, thus causing a lateral etching phenomenon of the fourth sidewall 92. Therefore, the width of the gate electrode may be reduced by about 50 to 100 nm, and the roughness of the fourth sidewall 92 is increased accordingly.

With reference to FIG. 4 (d), the gate electrode 9 may be optionally overetched so as to further recede the third sidewall 91 and the fourth sidewall 92 of the gate electrode 9 for increasing the size of ($L_4$–$L_2$) and ($L_3$–$L_1$), and then, the hard mask 93 is peeled off. The fourth sidewall 92 of the gate electrode 9 is etched for more than twice, an asymmetrical gate design is used, and the geometric/etching shielding environments around the third sidewall 91 and the fourth sidewall 92 of the gate electrode 9 and around a first sidewall 81 and a second sidewall 82 of the doped group III-V layer 8 are different, so that the first sidewall 81 and the second sidewall 82 of the doped group III-V layer 8 obtained after the hard mask 93 is removed are substantially in non-specular symmetry with respect to the geometric center 83j of the doped group III-V layer 8, and the third sidewall 91 and the fourth sidewall 92 of the gate electrode 9 are substantially in non-specular symmetry with respect to the geometric center 93j of the gate electrode 9.

With reference to FIG. 4 (e), the HEMT device 1j may also include a passivation layer 10 disposed on the gate electrode 9. In some embodiments, the top surface of the doped group III-V layer 8 has a portion 84a and another portion 84b surrounding the portion 84a. The portion 84a of the doped group III-V layer 8 is in direct contact with the gate electrode 9, and the second portion 84b is in direct contact with the passivation layer 10. The passivation layer 10 may surround the doped group III-V layer 8. The passivation layer 10 may cover the doped group III-V layer 8. The passivation layer 10 may surround the gate electrode 9. The passivation layer 10 may cover the gate electrode 9. The passivation layer 10 may cover part of the gate electrode 9.

In some embodiments, the passivation layer 10 may include, for example, but is not limited to, oxides or nitrides, such as silicon nitride (SiN) and silicon oxide ($SiO_2$). The passivation layer 10 may include, for example, but is not limited to, a compound layer of oxides and nitrides, such as $Al_2O_3$/SiN, $Al_2O_3$/$SiO_2$, AlN/SiN, and AlN/$SiO_2$.

With reference to FIG. 4 (f), the passivation layer 10 uses the photolithography and etching processes to define the position of the drain.

With reference to FIG. 4 (g), a conductor material is deposited onto the passivation layer 10. The conductor material is patterned by using the photolithography and etching processes to form a source 6, a drain 7, and a gate field plate 11. Rapid annealing (RTA) is performed so as to form the deposited material and the channel layer 4 into an intermetallic compound and to further form an ohmic contact from the source 6 to the two-dimensional electron gas 41 and the drain 7 to the two-dimensional electron gas 41.

The objective of providing the field plate 11 on the gate electrode 9 is to reduce an electric field nearest to the drain 7 and at a corner position of the doped group III-V layer 8, thus improving the stability of the HEMT device 1j and increasing the breakdown voltage between the gate and the drain. The field plate 11 is generally disposed above the passivation layer 10, the doped group III-V layer 8, and the gate electrode 9. In some embodiments, the field plate 11 has a common potential with the source contact 6 or has a common potential with the gate electrode 9. In some embodiments, the field plate 11 is directly connected with the source contact 6. In some embodiments, the field plate 11 is electrically connected with the source contact 6. By using the field plate, the electric field intensity distribution of the channel may be reconstructed, and an electric field peak value of the gate (at the side near the drain) is reduced, thus increasing the breakdown voltage of the HEMT device $1j$ and reducing the electron trap effect caused by the high electric field, and improving the power density.

In some embodiments, the length range of the field plate in the low-voltage device is 0.4 to 1.2 μm. A too long field plate may improve the capacitance effect between the gate and the drain, thus causing negative Miller feedback, and reducing the cut-off frequency of current gain and power gain. Additionally, if the field plate approaches to the drain, the electric field intensity of the field plate at the end point of the side near the drain may be improved, and the breakdown voltage is further reduced.

In some embodiments, the source contact 6 and the drain contact 7 may include, for example, but are not limited to, a conductor material. The conductor material may include, FIG. 5 (b) is a low-voltage HEMT device with a gate structure 80b. $L_1$=500 nm. $L_2$=2000 nm. $L_3$=650 nm. $L_4$=2050 nm. Therefore, $(L_3-L_1)>(L_4-L_2)$.

FIG. 5 (c) is a low-voltage HEMT device with a gate structure 80b. $L_1$=500 nm. $L_2$=2000 nm. $L_3$=700 nm. $L_4$=2000 nm. Therefore, $(L_3-L_1)>(L_4-L_2)$, and FIG. 5 (d) is a low-voltage HEMT device with a gate structure 80c. $L_1$=500 nm. $L_2$=2000 nm. $L_3$=550 nm. $L_4$=2150 nm. Therefore, $(L_4-L_2)>(L_3-L_1)$.

FIG. 5 (e) is a low-voltage HEMT device with a gate structure 80c. $L_1$=500 nm. $L_2$=2000 nm. $L_3$=500 nm. $L_4$=2200 nm. Therefore, $(L_4-L_2)>(L_3-L_1)$, and $L_3 \approx L_1$.

Figure 5A:
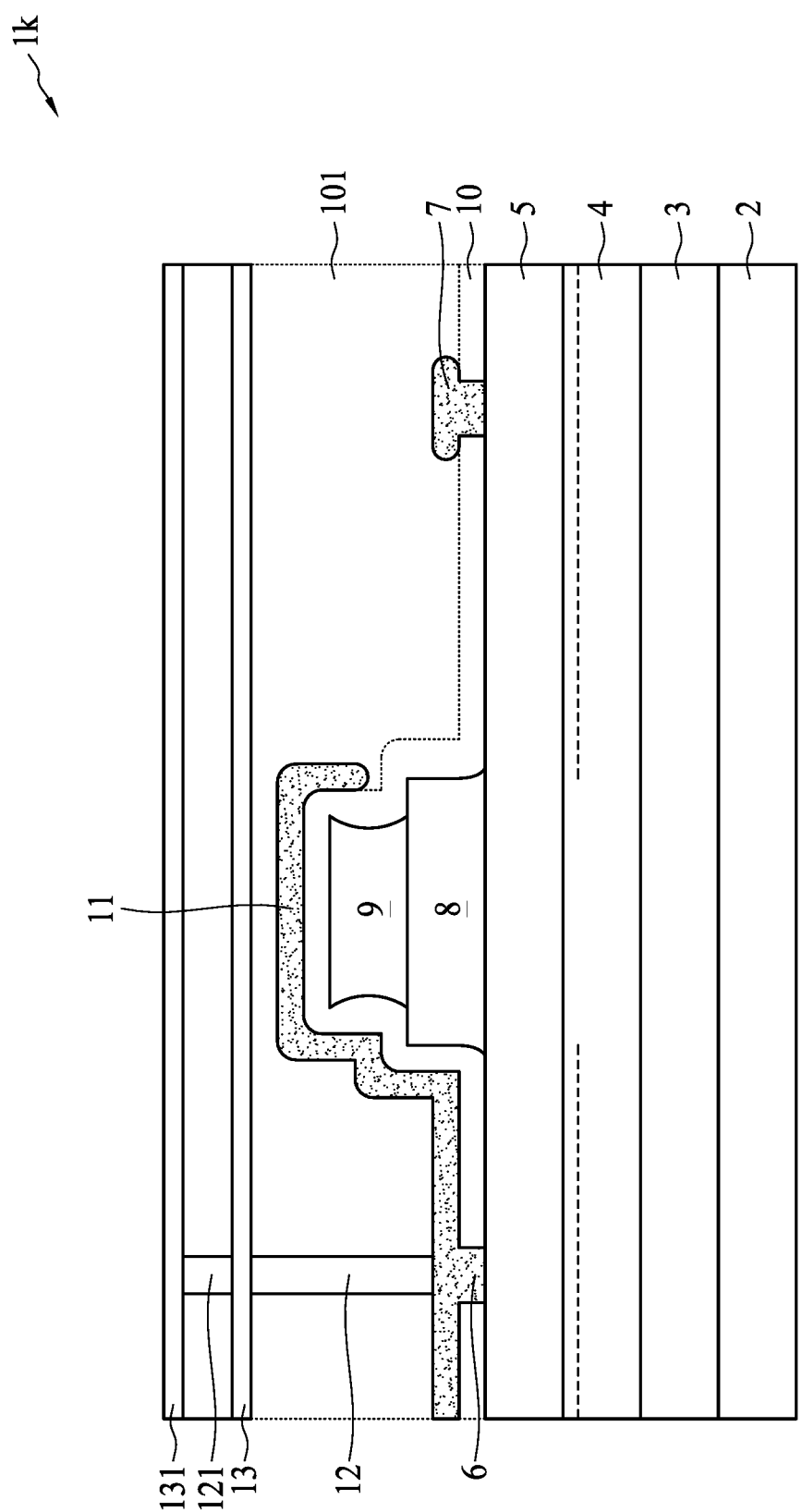
FIGS. 5 (a) to (e) show a semiconductor device according to some embodiments of the present invention.
Figure 5B:
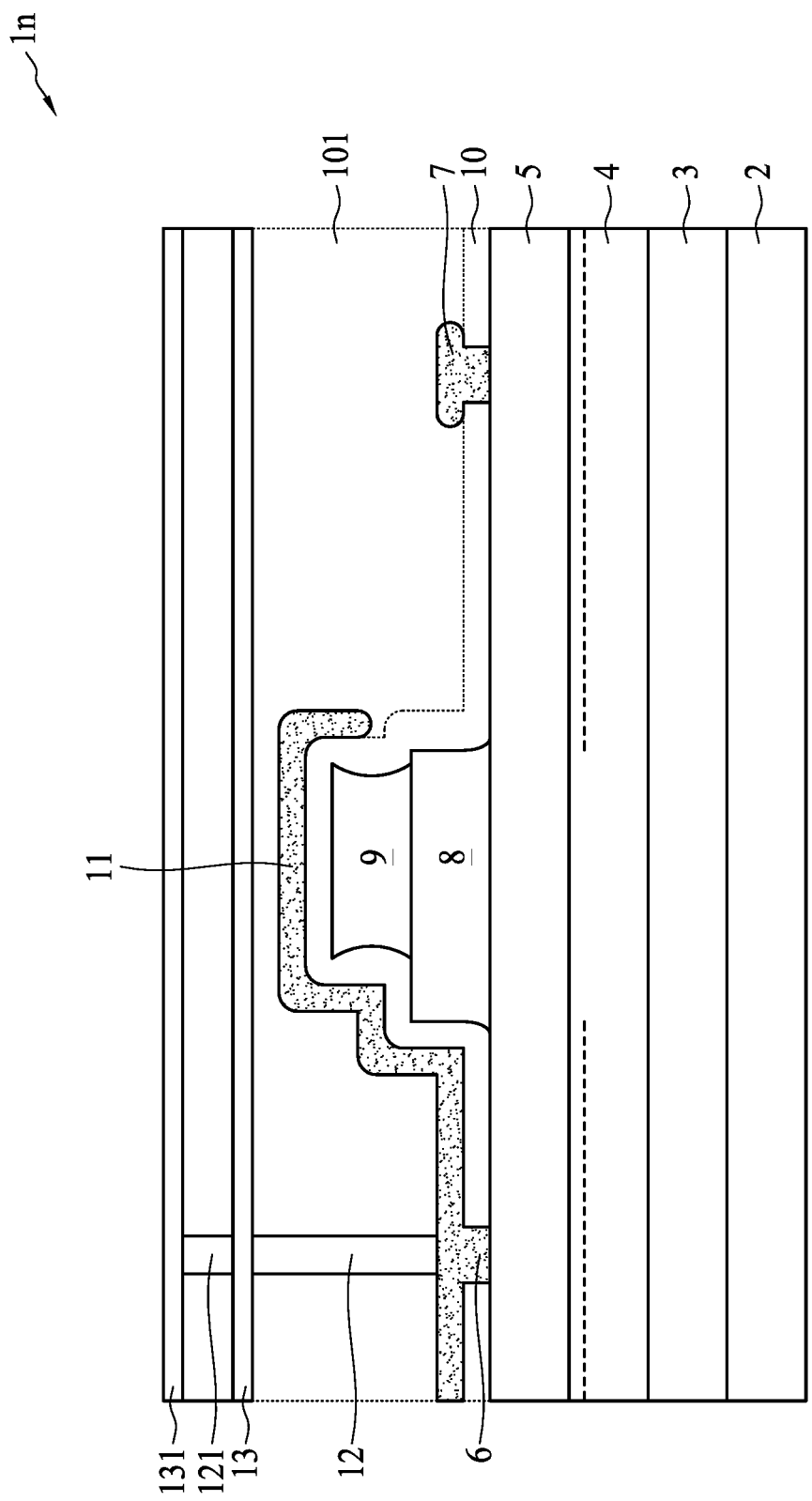
Figure 5C:
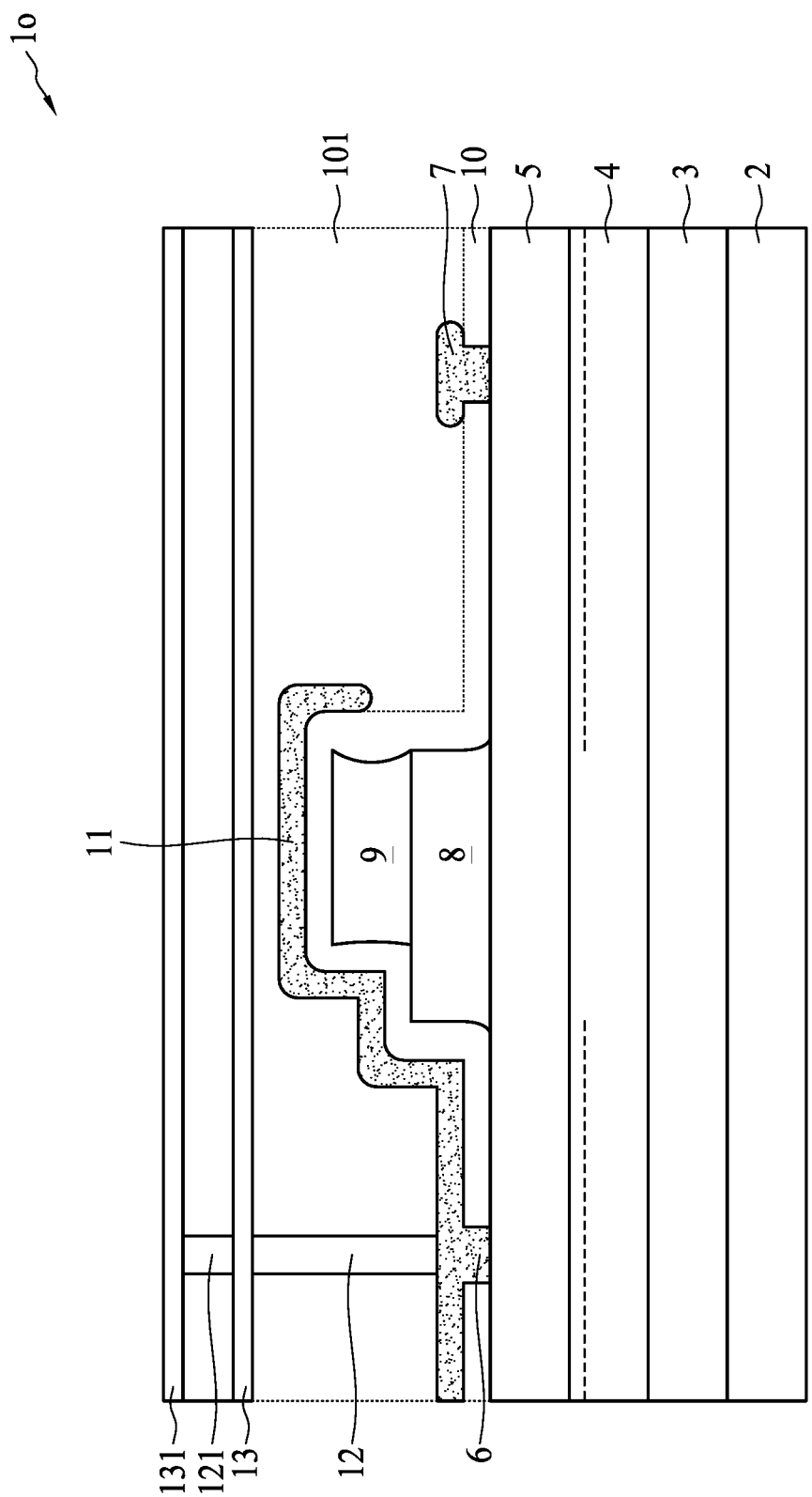
Figure 5D:
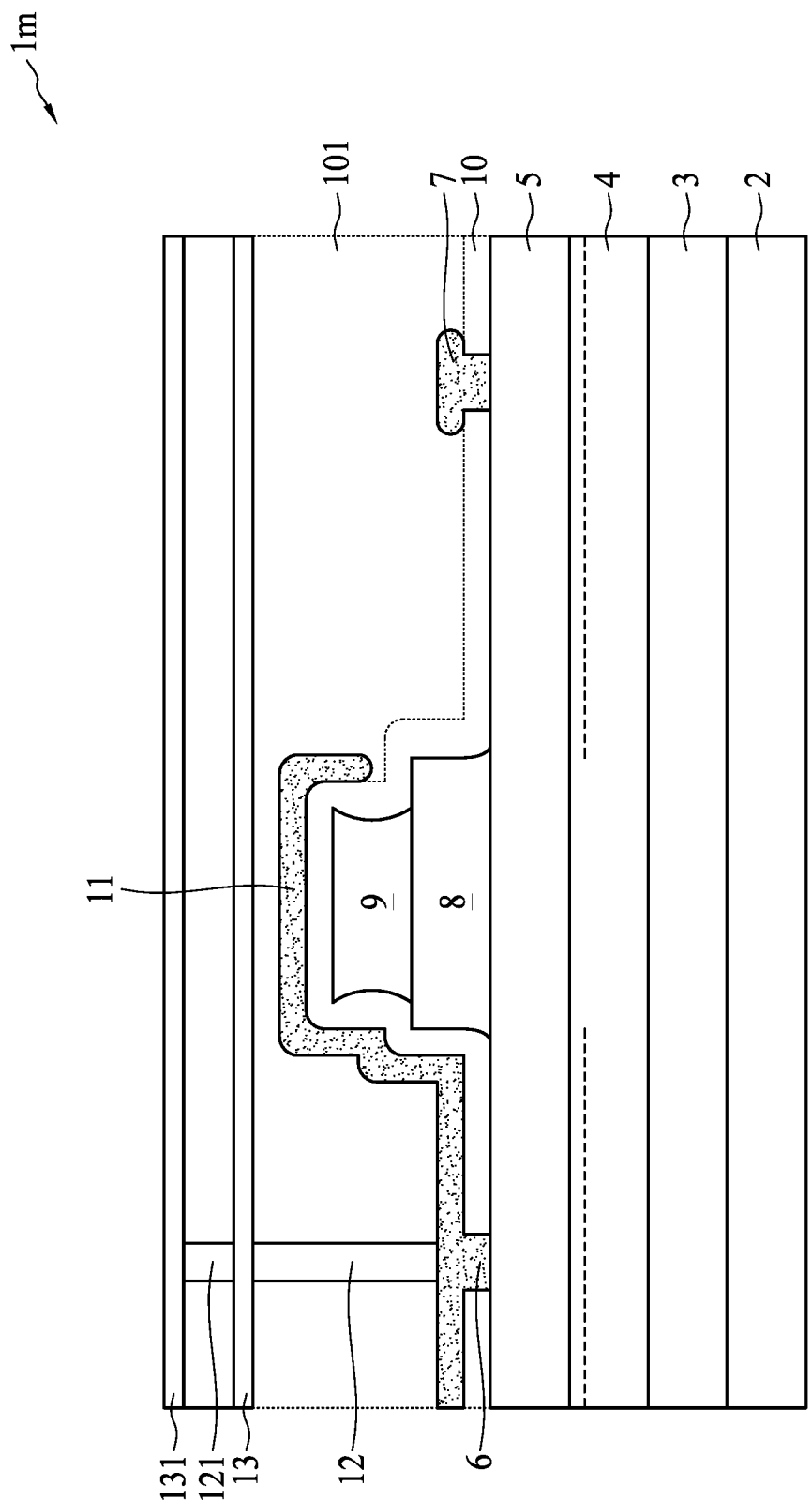
Figure 5E:
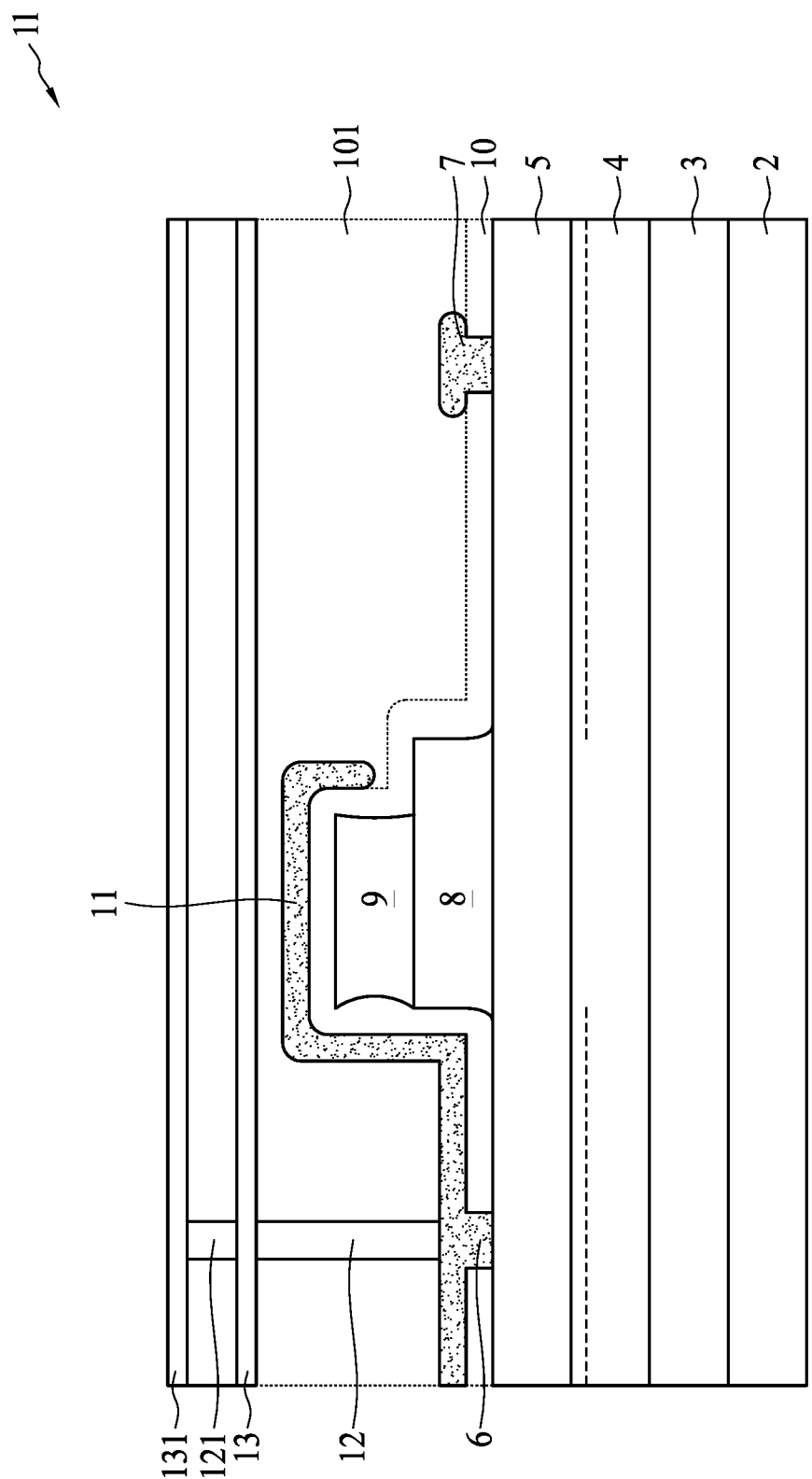
Figure 6A:
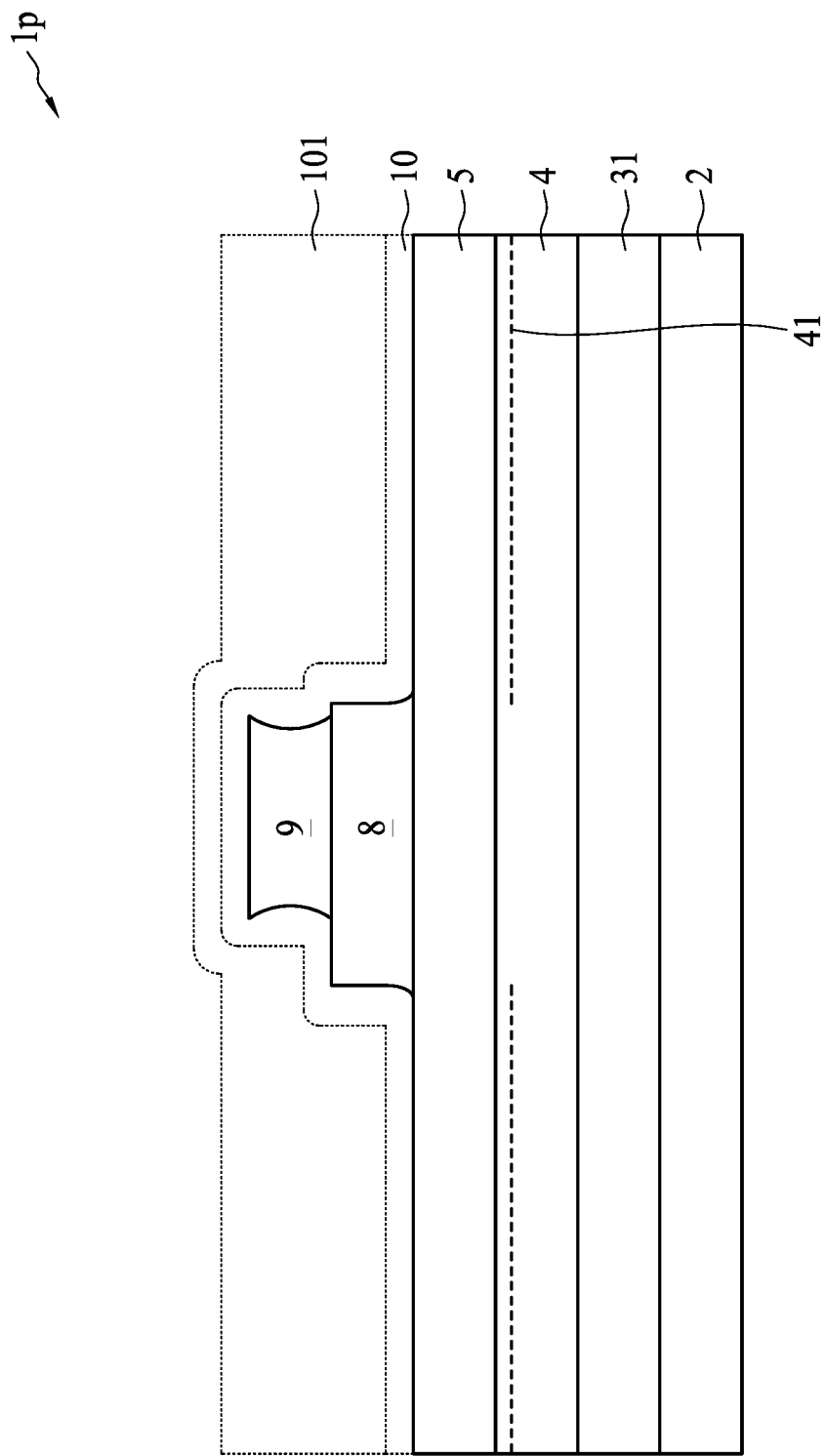
FIGS. 6 (a) to (g) show several operations for manufacturing a semiconductor device according to some embodiments of the present invention.
Figure 6B:
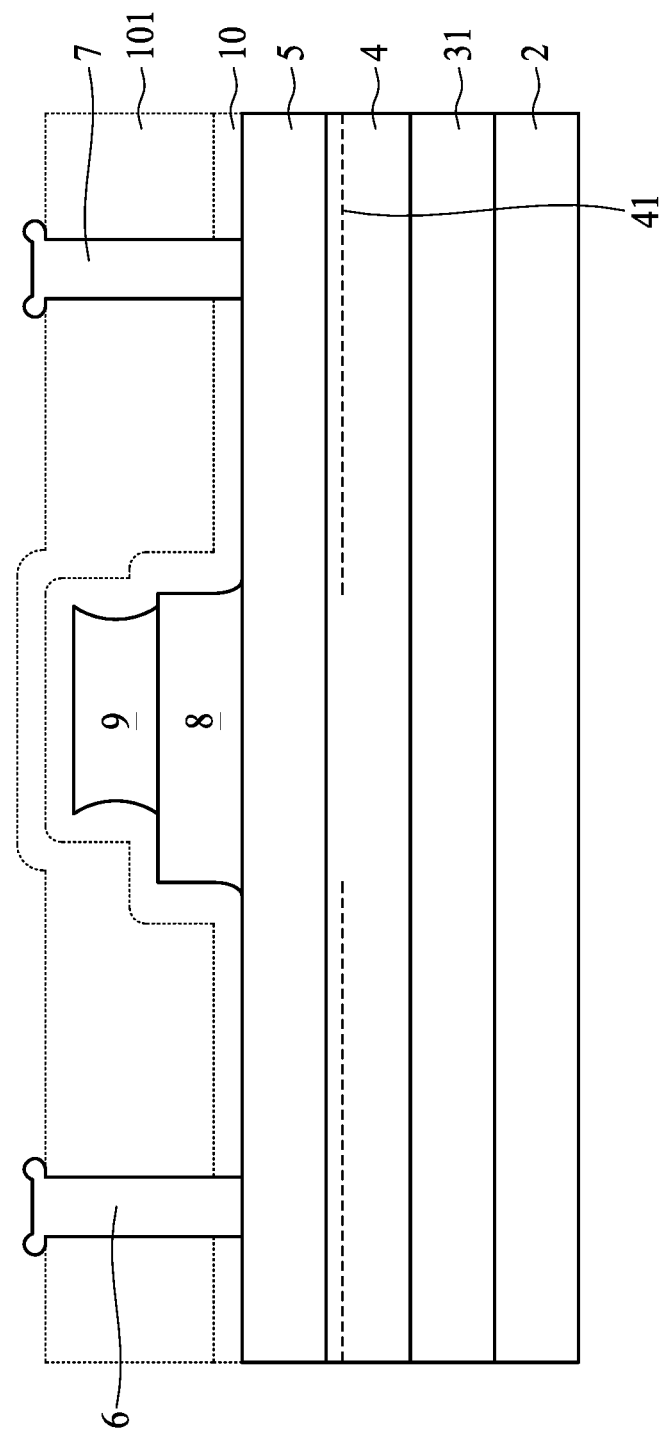
Figure 6C:
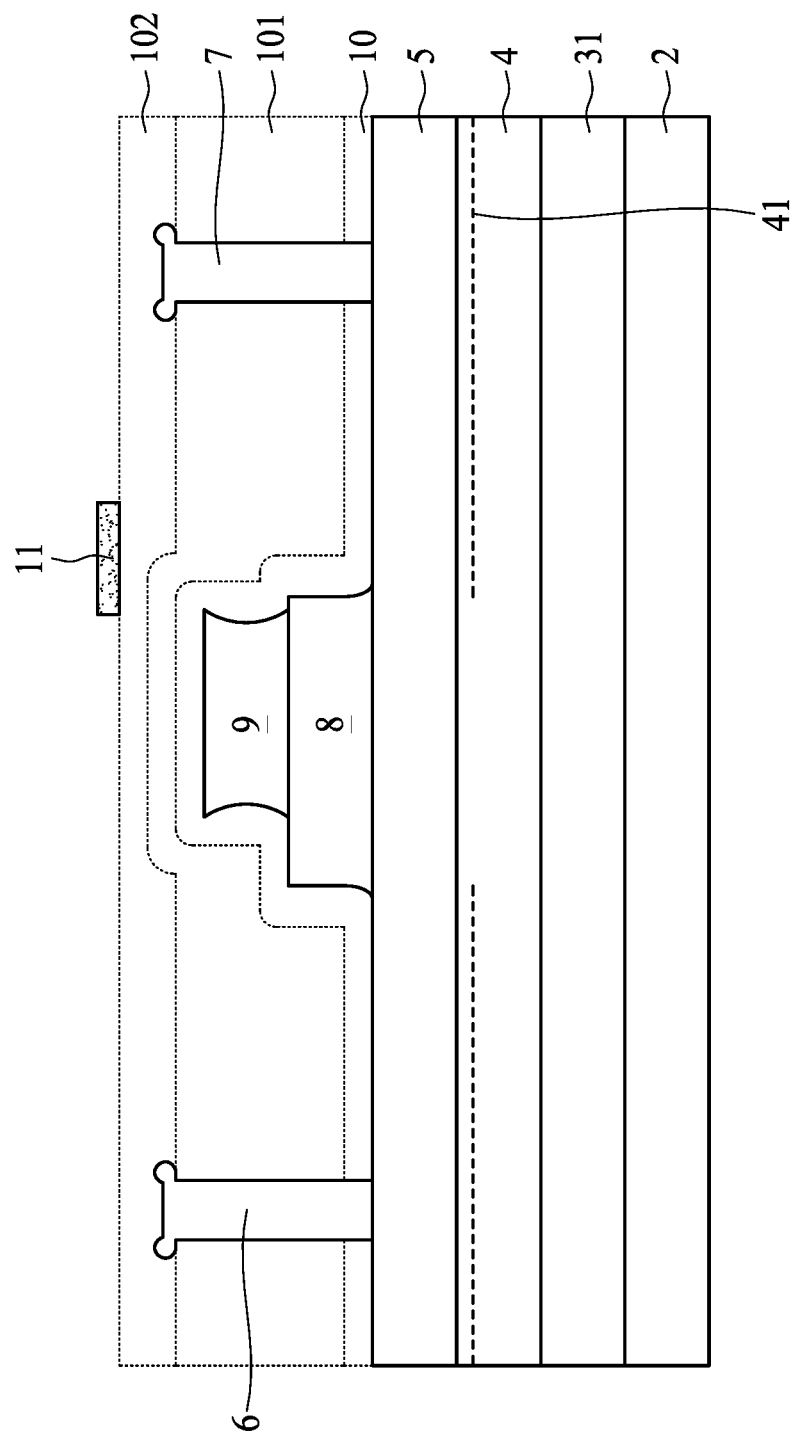
Figure 6D:
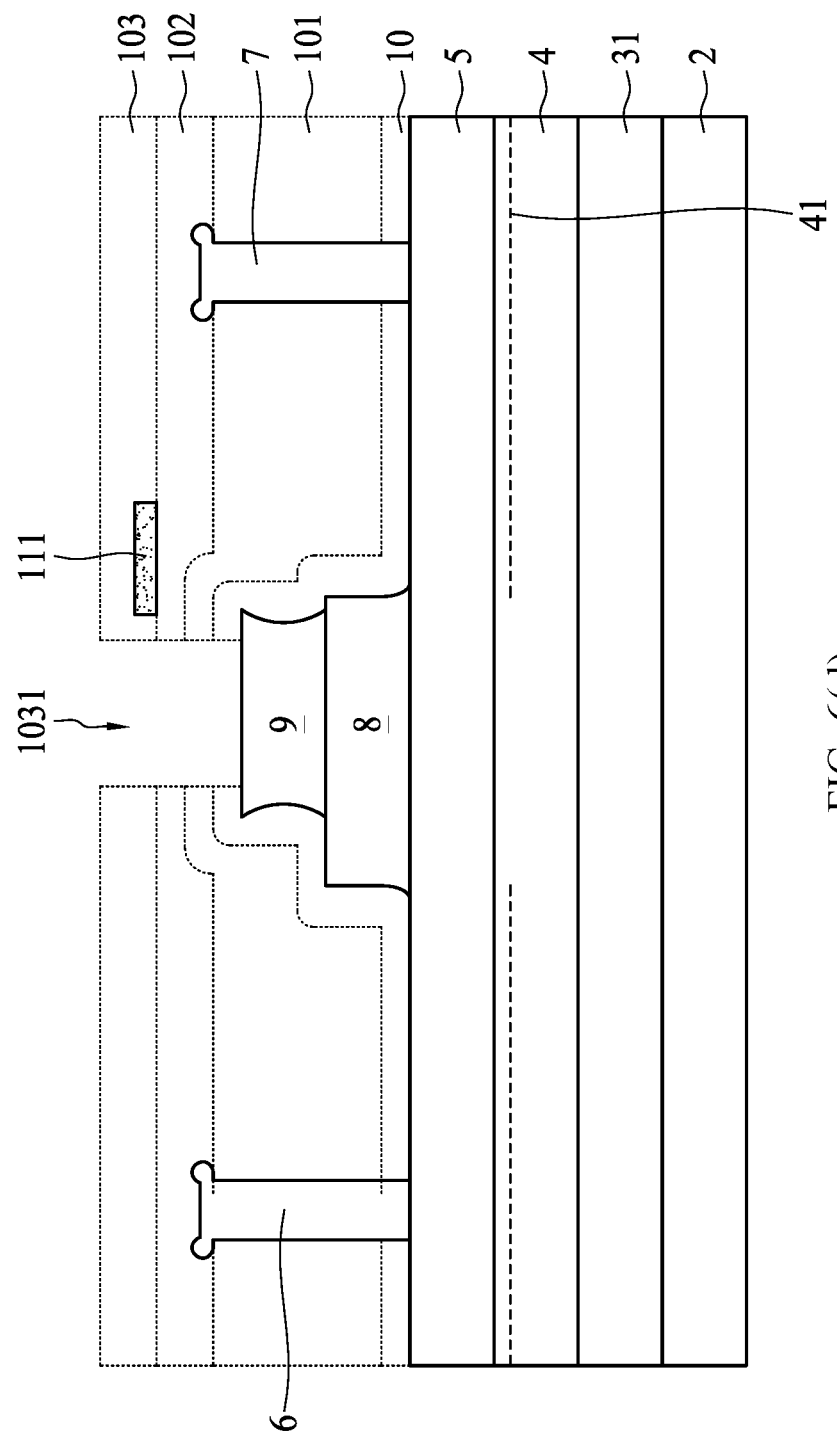
Figure 6E:
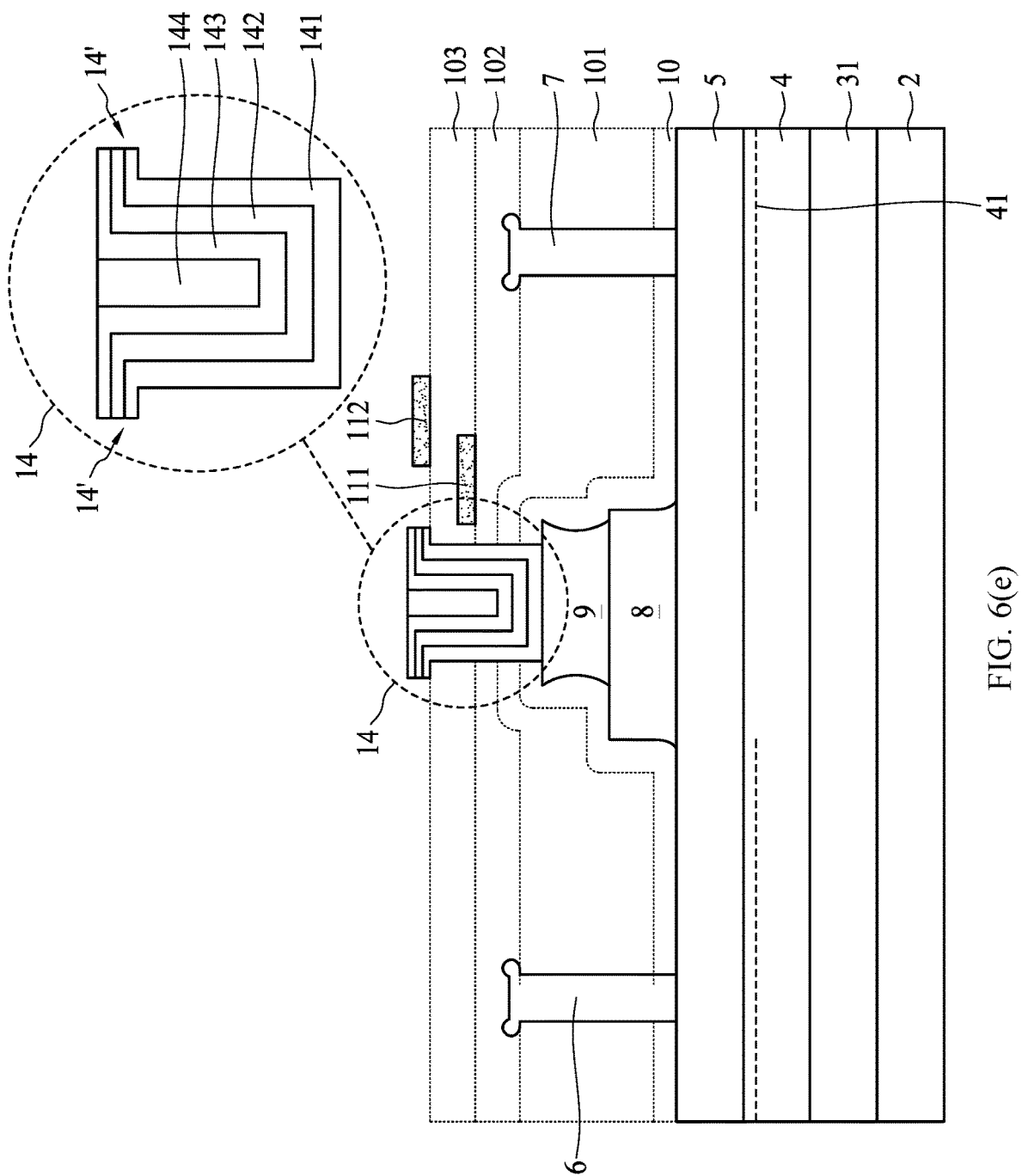
Figure 6F:
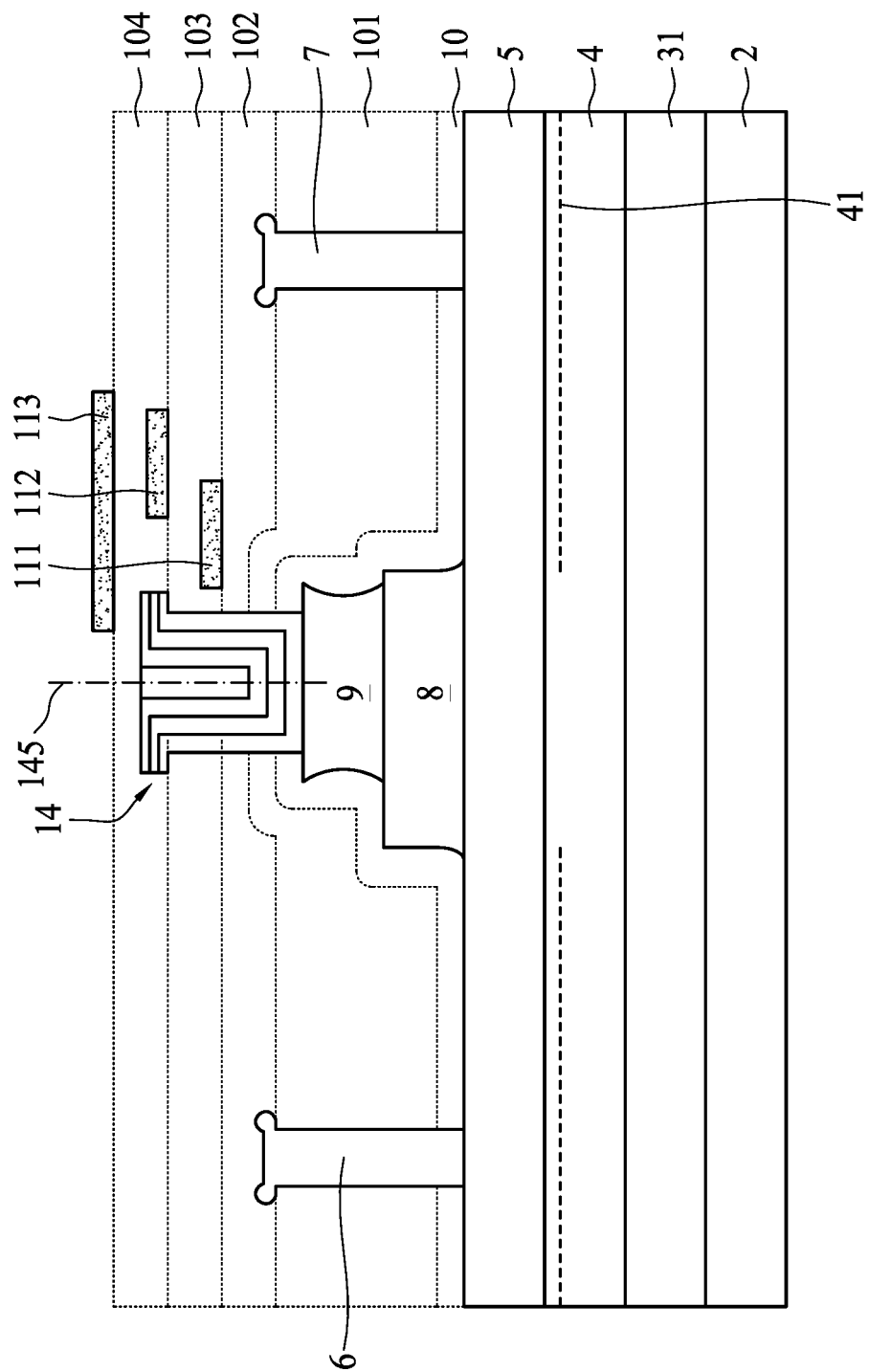
Figure 6G:
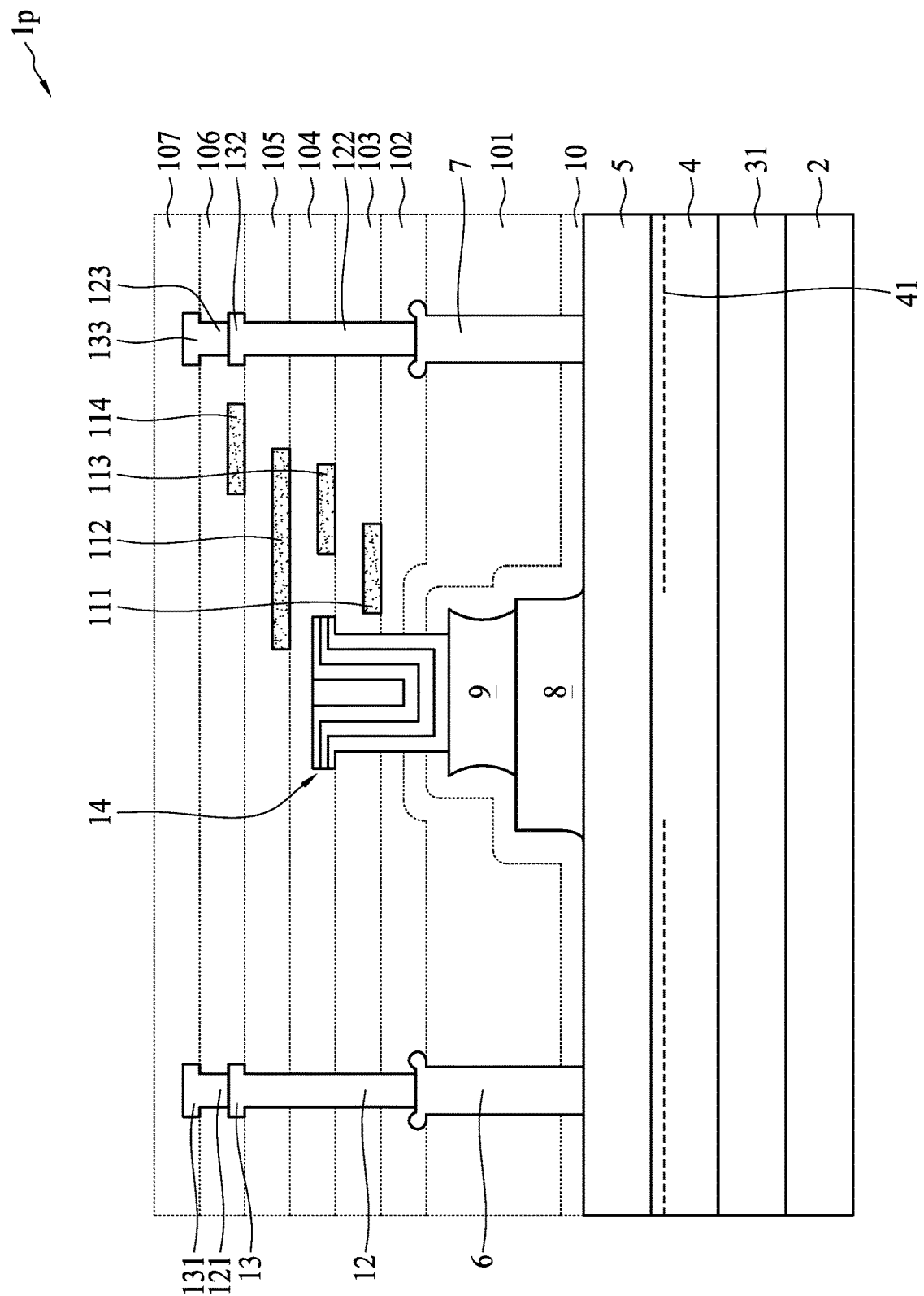
Figure 7A:
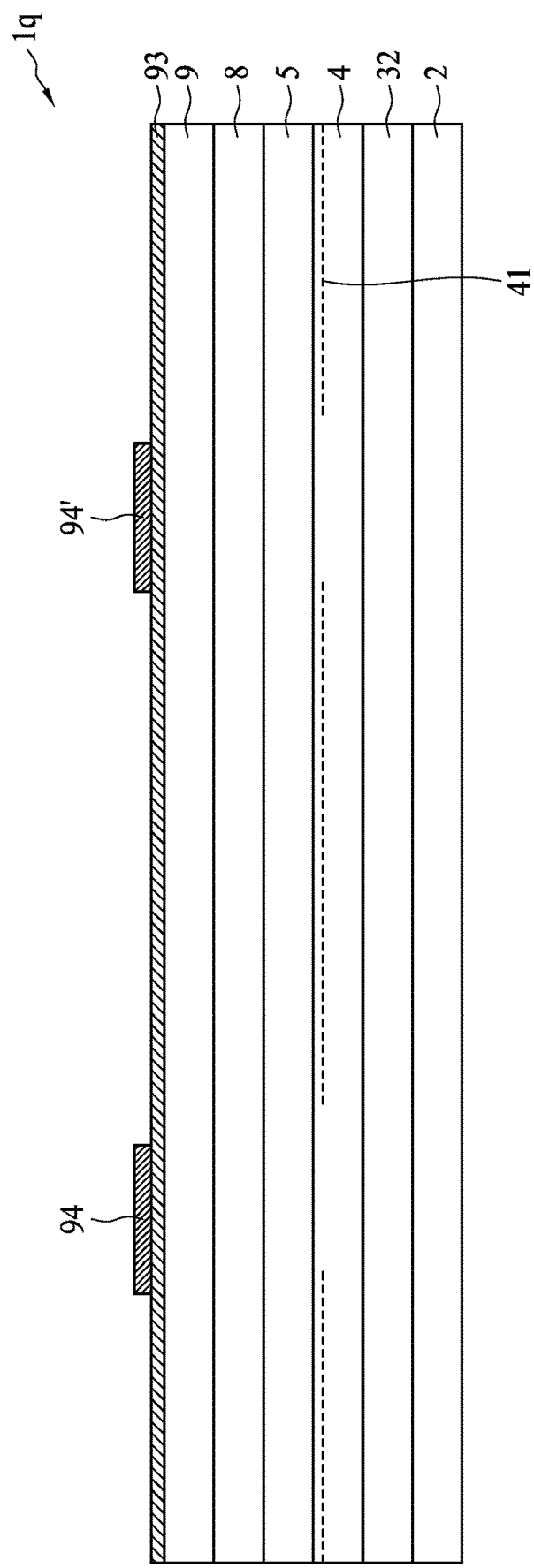
FIGS. 7 (a) to (l) show several operations for manufacturing a semiconductor device according to some embodiments of the present invention.
Figure 7B:
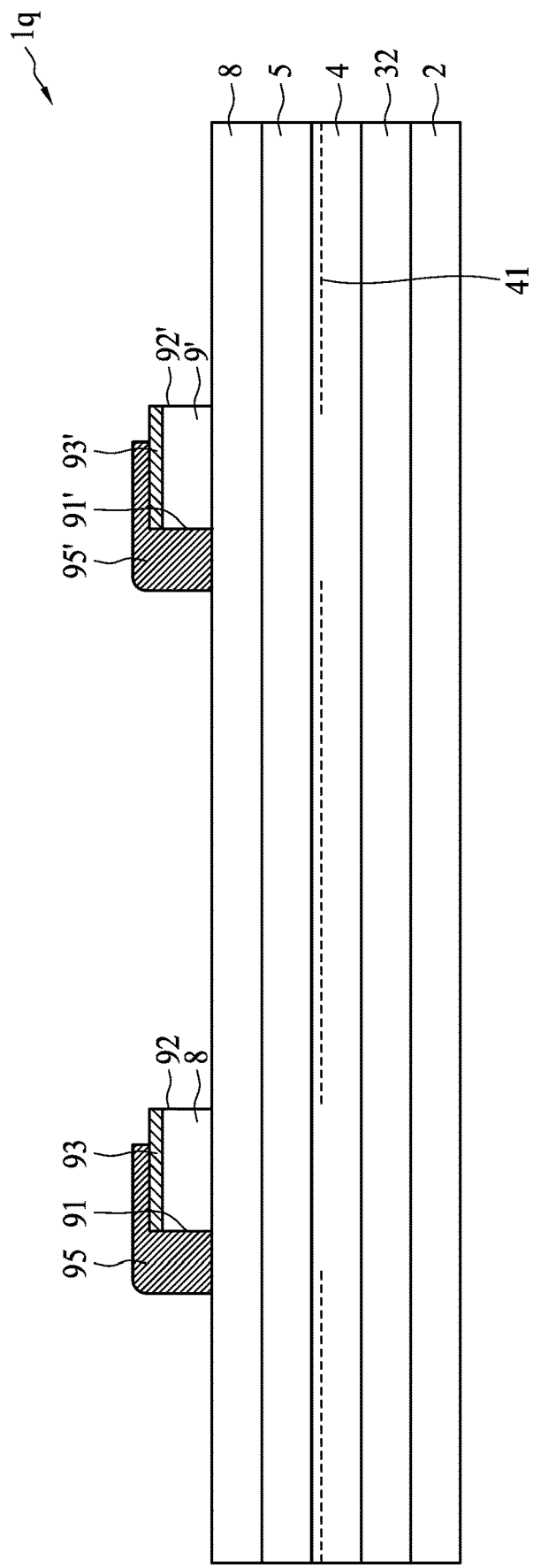
Figure 7C:
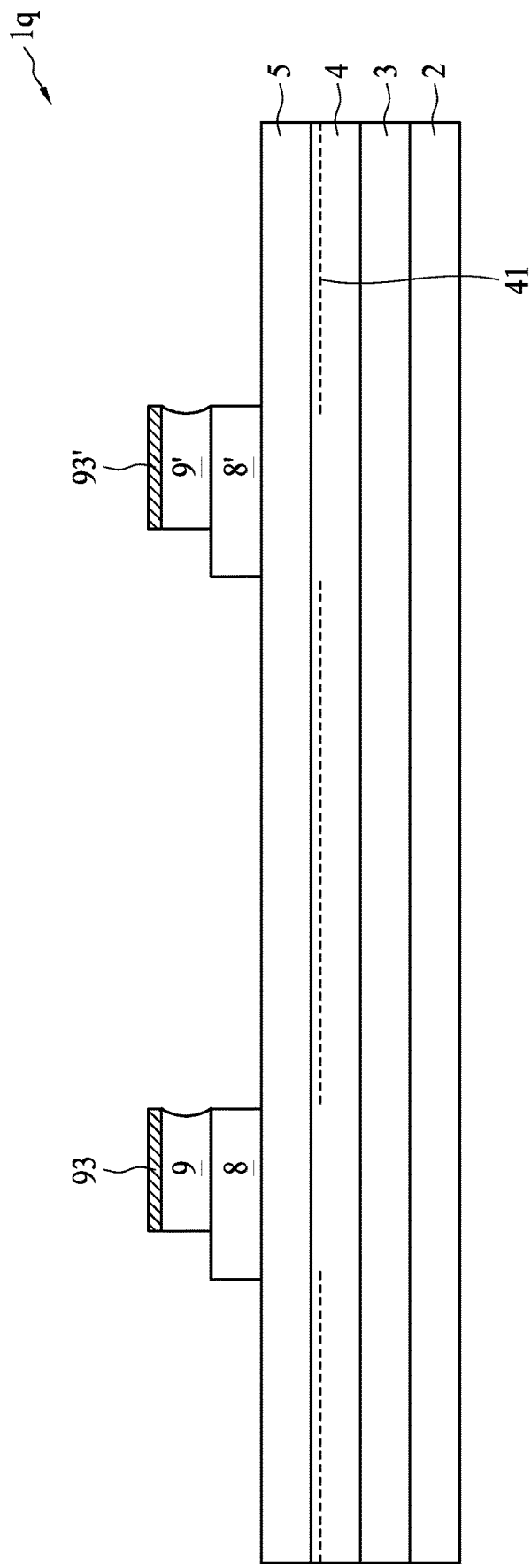
Figure 7D:
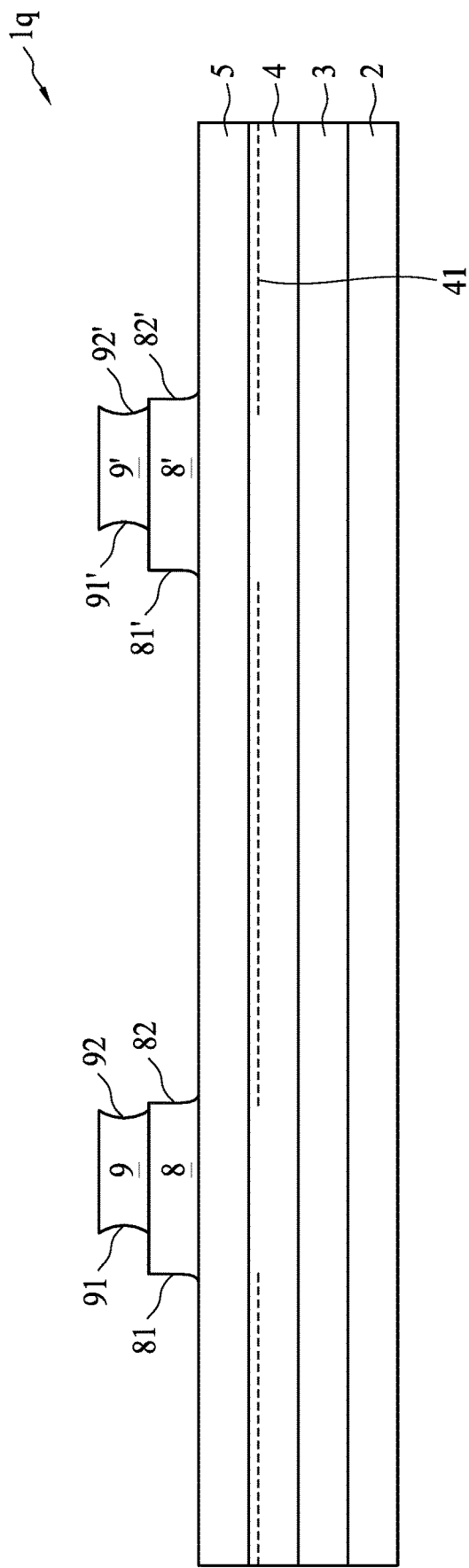
Figure 7E:
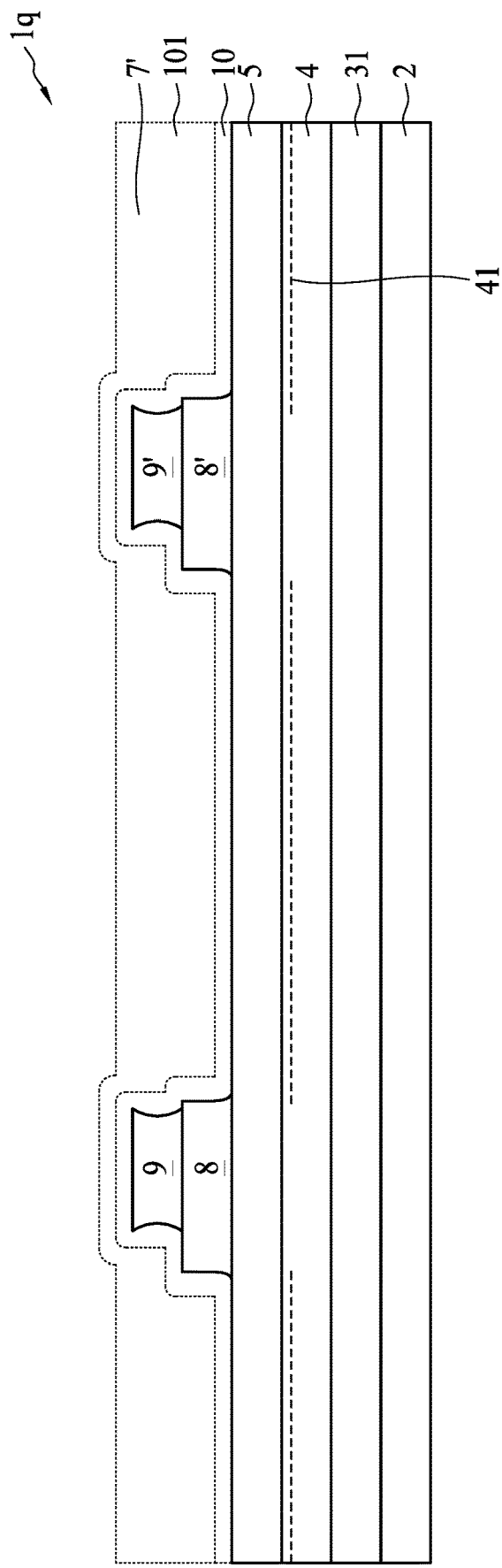
Figure 7F:
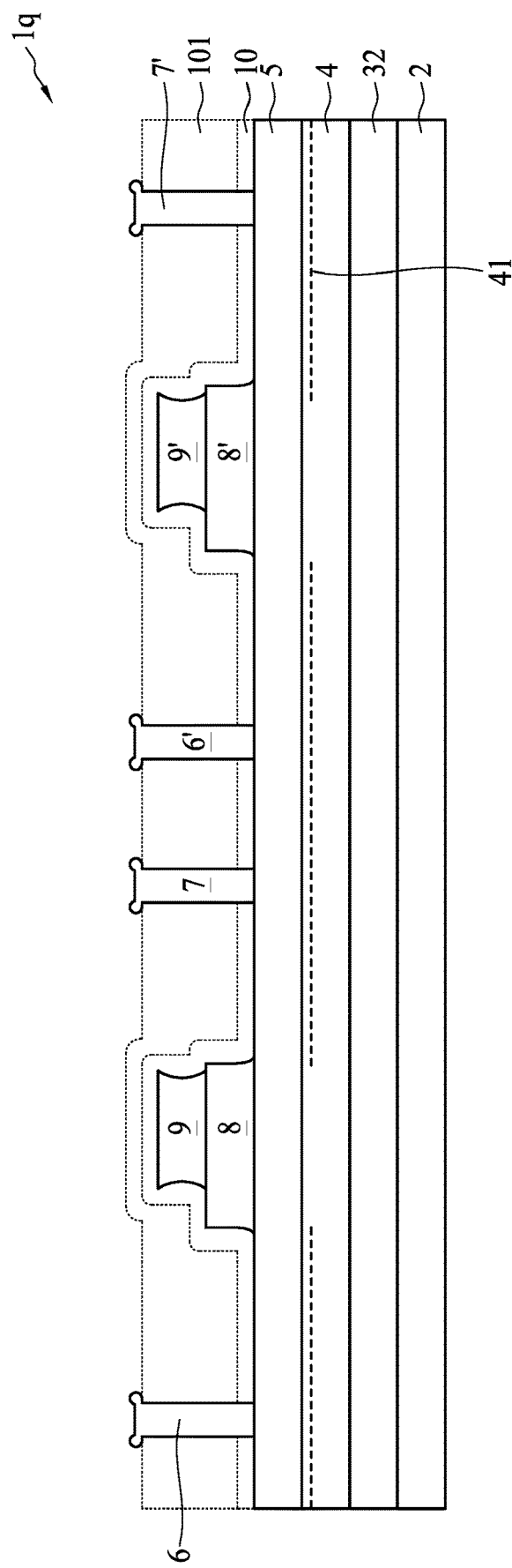
Figure 7G:
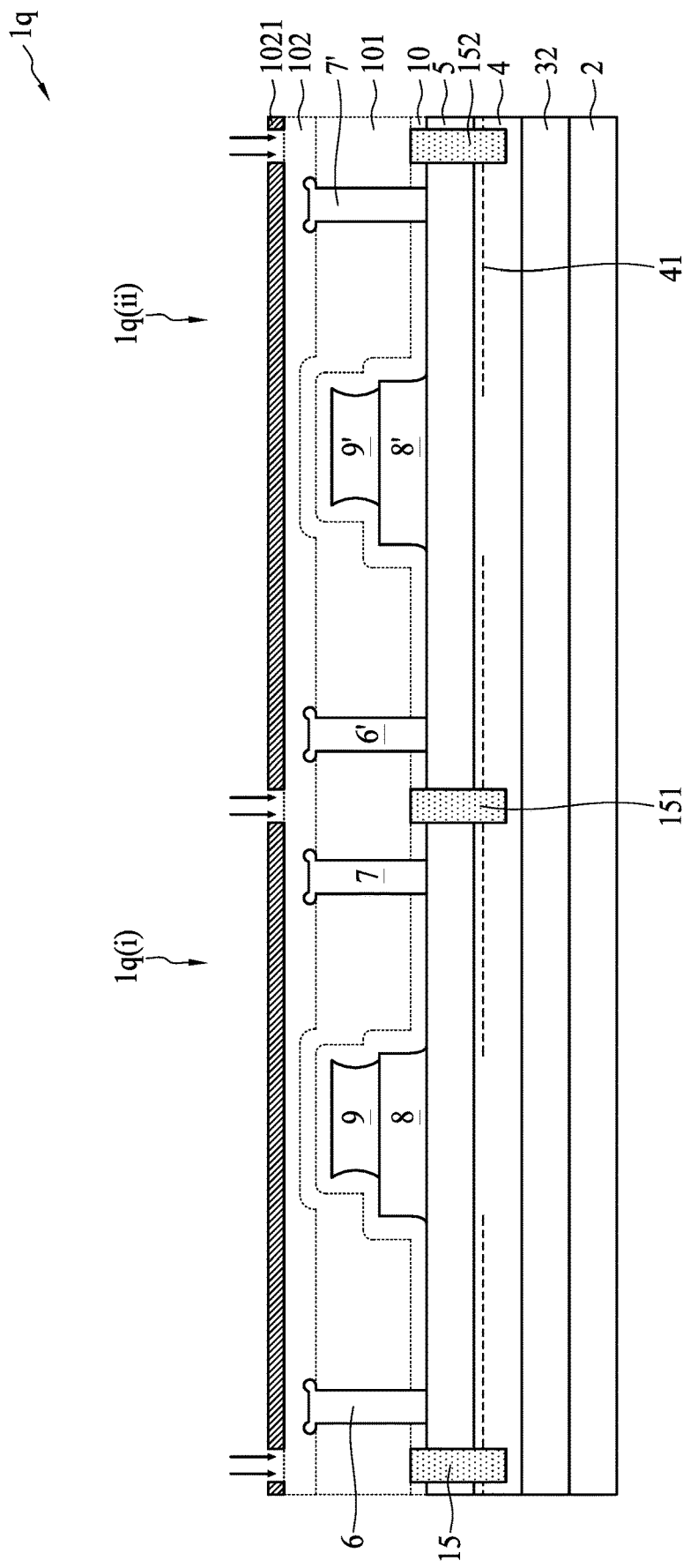
Figure 7H:
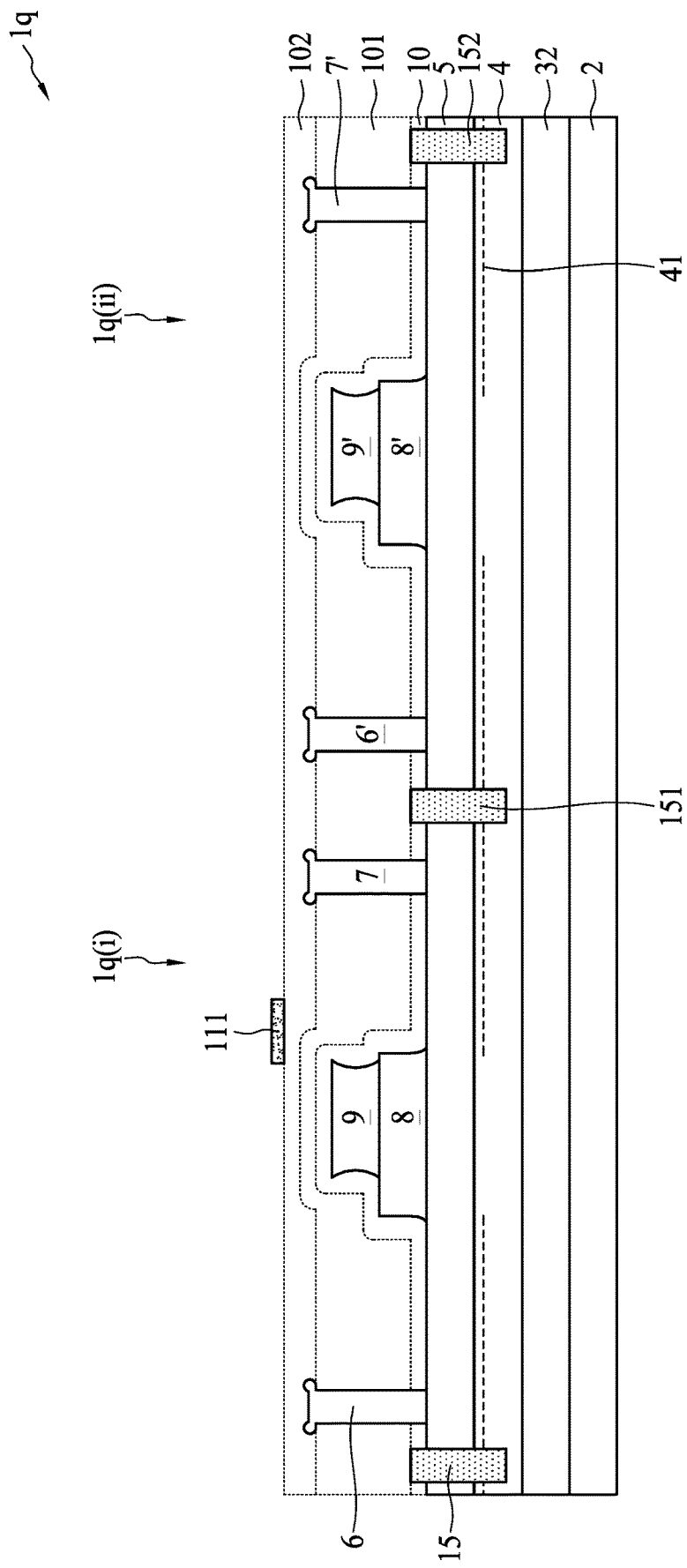
Figure 7I:
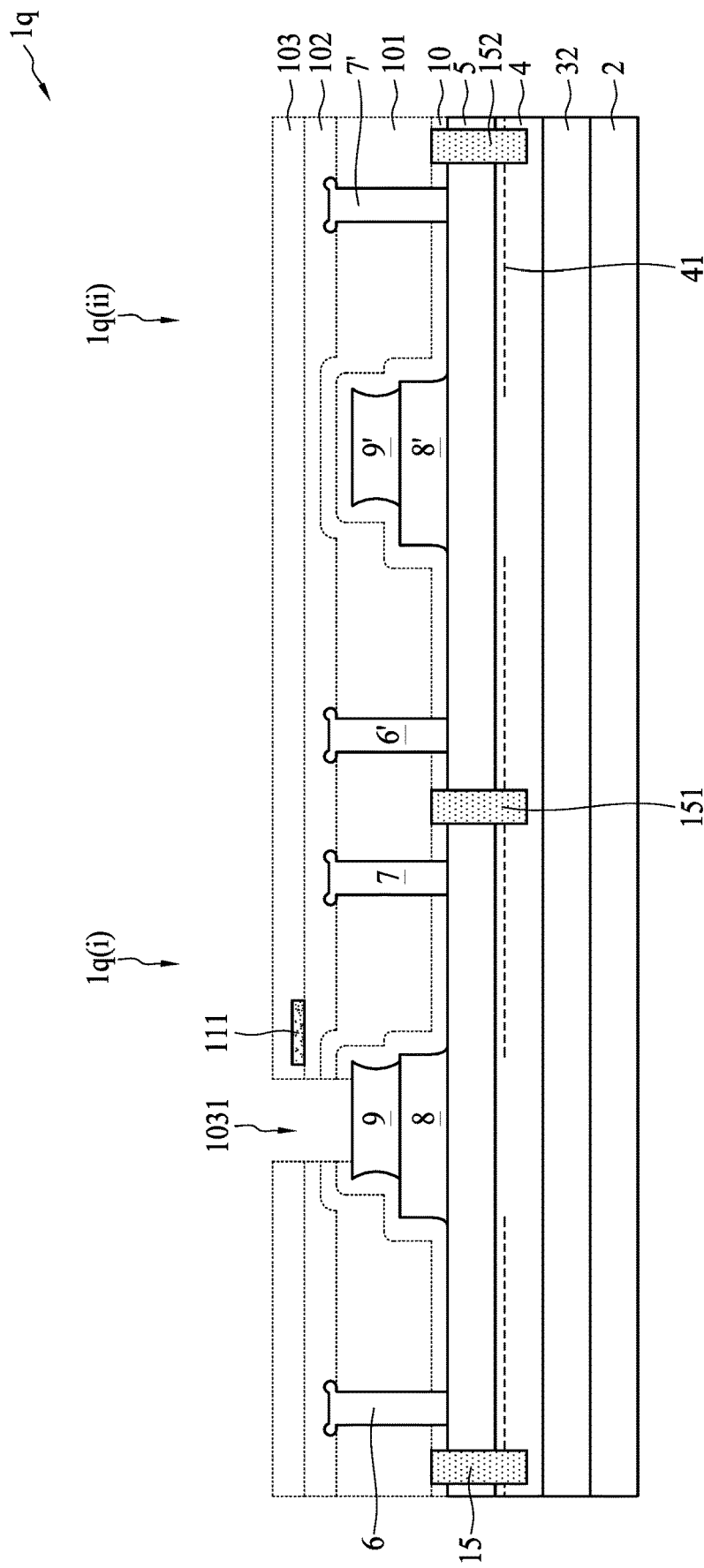
Figure 7J:
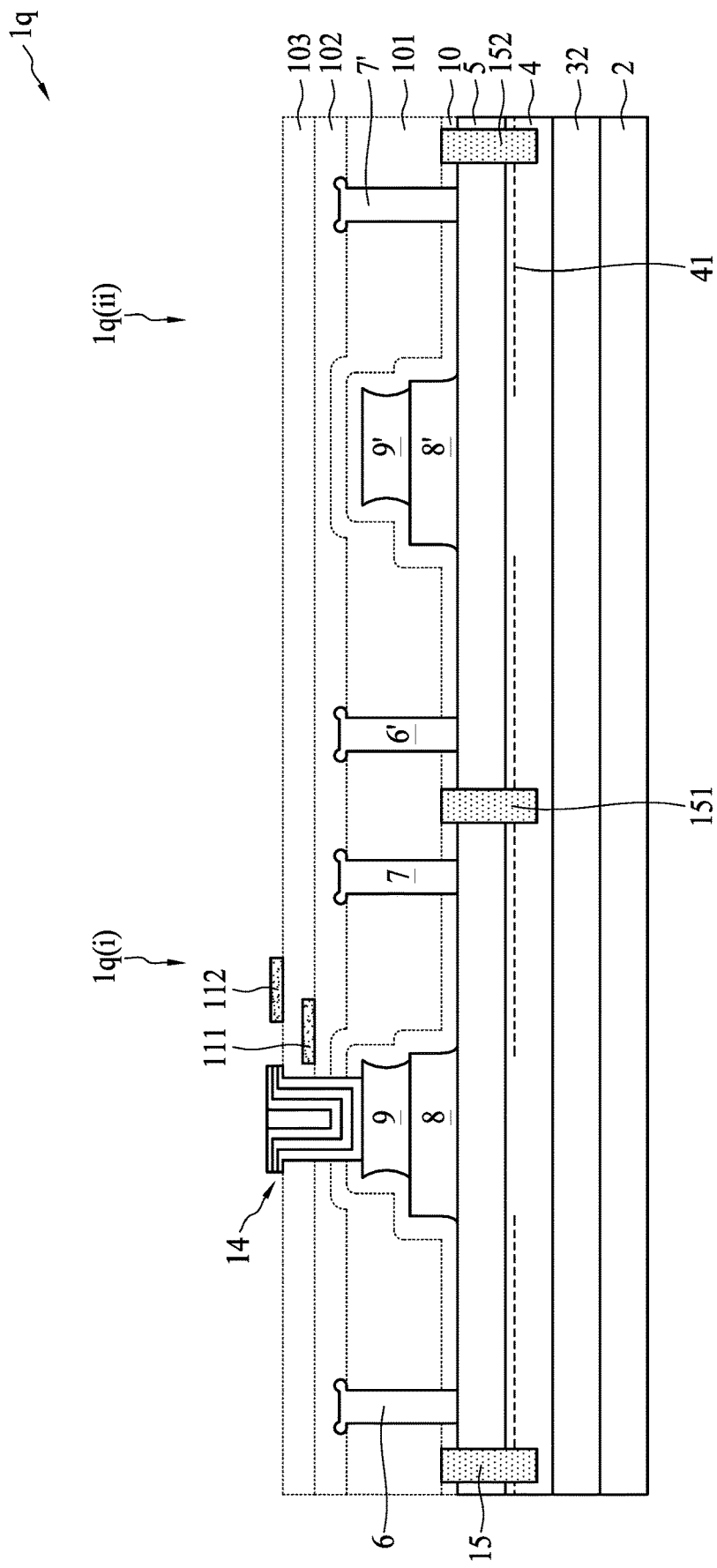
Figure 7K:
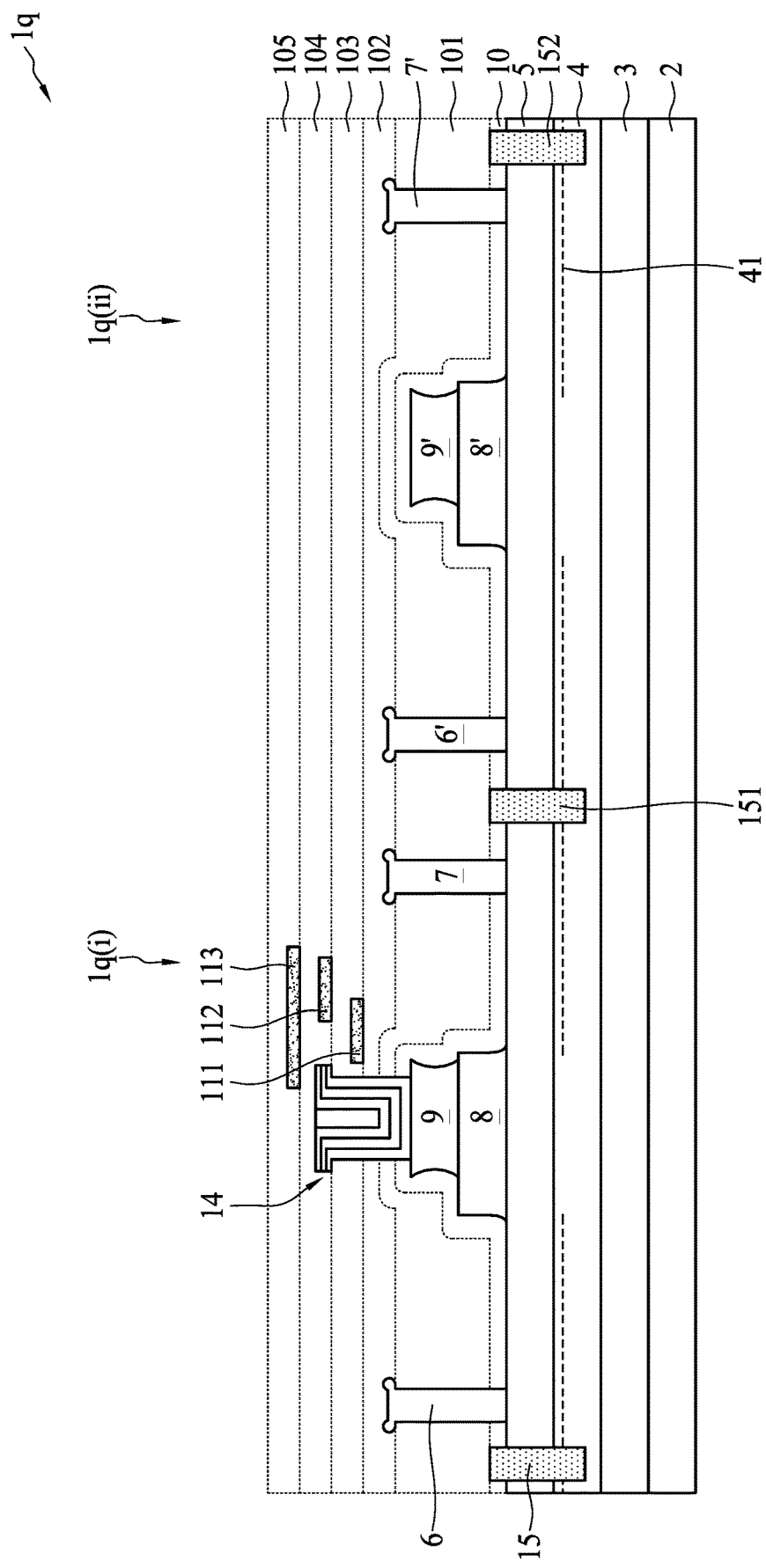
Figure 7L:
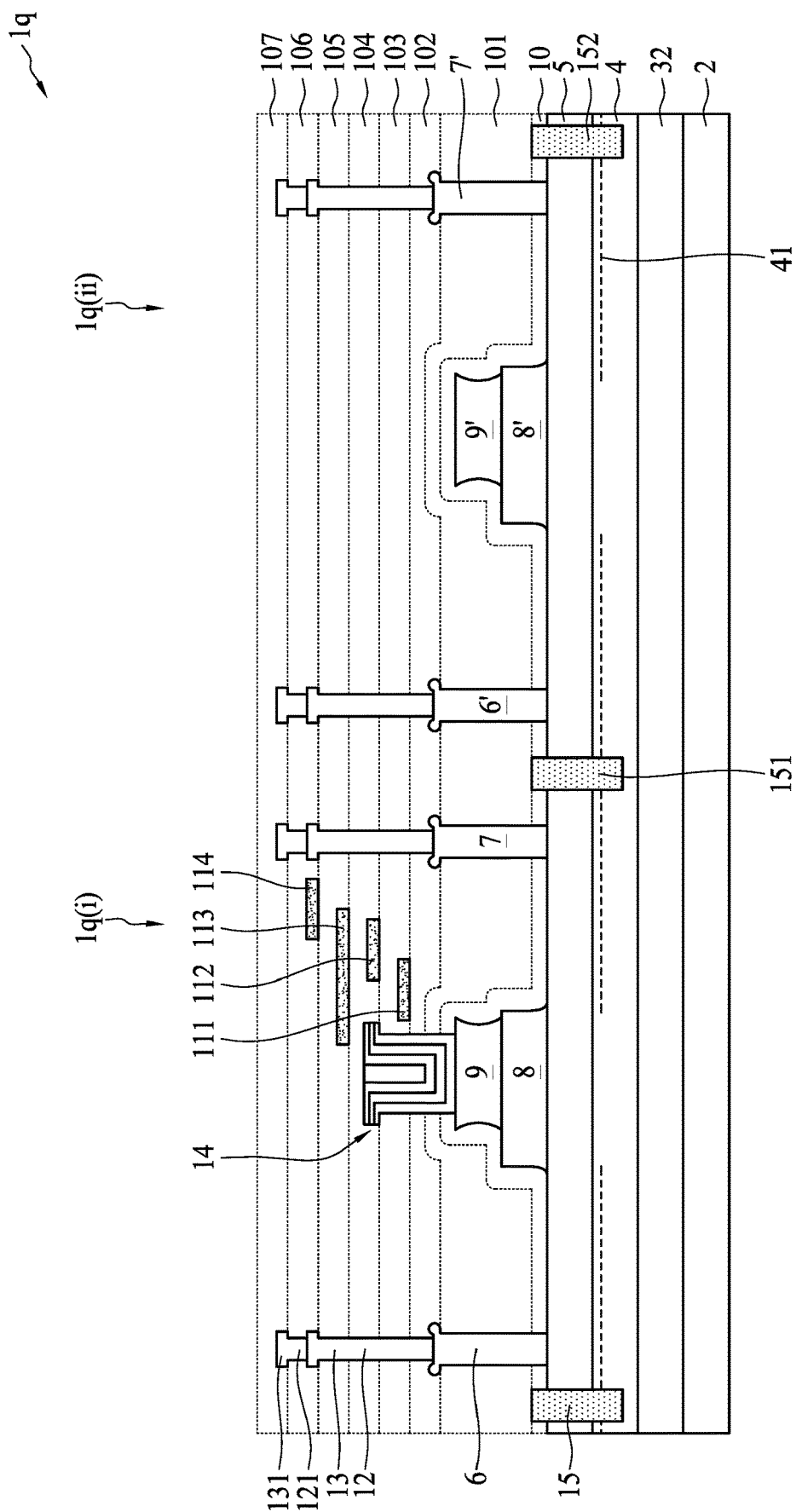

| | | | | | Junction type of the gate electrode 9 and doped group III-V layer 8 (Gate voltage $V_g$ is 5V) | | | | | |
|---|---|---|---|---|---|---|---|---|---|---|
| | $L_1$ | $L_2$ | $L_3$ | $L_4$ | Schottky junction | | | Non-Schottky junction | | |
| Gate structure | (nm) | (nm) | (nm) | (nm) | $J_{gs}$ | $J_{gd}$ | $J_{total}$ | $J_{gs}$ | $J_{gd}$ | $J_{total}$ |
| As shown in FIG. 5a | 500 | 2,000 | 600 | 2,100 | $7 \times 10^{-13}$ | $3 \times 10^{-13}$ | $1 \times 10^{-12}$ | $3 \times 10^{-8}$ | $2 \times 10^{-8}$ | $5 \times 10^{-8}$ |
| As shown in FIG. 5b | 500 | 2,000 | 650 | 2,050 | $5 \times 10^{-13}$ | $4.5 \times 10^{-12}$ | $5 \times 10^{-12}$ | $2 \times 10^{-8}$ | $8 \times 10^{-8}$ | $1 \times 10^{-7}$ |
| As shown in FIG. 5c | 500 | 2,000 | 700 | 2,000 | $<1 \times 10^{-13}$ | $1 \times 10^{-10}$ | $1 \times 10^{-10}$ | $1 \times 10^{-7}$ | $1 \times 10^{-5}$ | $1 \times 10^{-5}$ |
| As shown in FIG. 5d | 500 | 2,000 | 550 | 2,150 | $4.8 \times 10^{-12}$ | $2 \times 10^{-13}$ | $5 \times 10^{-12}$ | $1 \times 10^{-7}$ | $3 \times 10^{-9}$ | $1 \times 10^{-7}$ |
| As shown in FIG. 5e | 500 | 2,000 | 500 | 2,200 | $1 \times 10^{-10}$ | $<1 \times 10^{-13}$ | $1 \times 10^{-10}$ | $1 \times 10^{-5}$ | $1 \times 10^{-7}$ | $1 \times 10^{-5}$ | for example, but is not limited to, a metal, an alloy, a doped semiconductor material (for example, doped crystalline silicon), or other suitable conductor materials.

Part of the source contact 6 may be positioned in the channel layer 4. Part of the drain contact 7 may be positioned in the channel layer 4. Part of the source contact 6 may be in direct contact with the two-dimensional electron gas 41. Part of the drain contact 7 may be in direct contact with the two-dimensional electron gas 41. In some other embodiments, the source contact 6 may be disposed on the channel layer 4. In some other embodiments, the drain contact 7 may be disposed on the channel layer 4. The source contact 6 passes through the passivation layer 10 to be in contact with the barrier layer 5. The drain contact 7 passes through the passivation layer 10 to be in contact with the barrier layer 5. With reference to FIG. 4 (h), the HEMT device $1j$ may also include an interconnect structure or conductive vias 12 and 121. The HEMT device $1j$ may also include metal layers 13 and 131.

In some embodiments, the interconnect structure or the conductive via 12 is formed through a plurality of steps, including the steps of a photolithography process, etching, and deposition. The photolithography process and etching include the steps of forming a patterned mask on the passivation layer 101, and etching the passivation layer 101 to form the source contact via 12 and a drain contact via (not shown in the figure). Part of the channel layer 4 is exposed from the bottom of the source contact via and the drain contact via. Then, the material is filled into the vias through the deposition steps of CVD, PVD, plating and the like.

Simulation Results of Leakage Current Caused by Different Gate Structures

FIG. 5 (a) is a low-voltage HEMT device with a gate structure 80a. $L_1$=500 nm. $L_2$=2000 nm. $L_3$=600 nm. $L_4$=2100 nm. Therefore, $(L_3-L_1) \approx (L_4-L_2)$.

From the above table, it can be known that the gate using a Schottky junction has a total leakage current value of about $10^{-5}$ to $10^{-4}$ times that of the gate using a non-Schottky junction.

From the above table, it can be known that under the condition that the fourth sidewall 92 is substantially coplanar with the second sidewall 82 (i.e., FIG. 5 (c); $L_4 \approx L_2$) or the third sidewall 91 is substantially coplanar with first sidewall 81 (i.e., FIG. 5 (e); $L_3 \approx L_1$), the total leakage current of them is about $10^2$ times of that of the non-coplanar ones. It has also been unexpectedly found from the results of the above table that the influence of the relative sizes of $L_1$ and $L_2$ on $J_{gs}$ and $J_{gd}$ is not significant, the relative sizes of $J_{gs}$ and $J_{gd}$ primarily depend on the symmetry of the gate structure rather than the distance of the gate relative to the source or the drain.

Application of High-Voltage HEMT Devices

With reference to FIG. 6 (a), the asymmetrical gate structure of the present invention is also applicable to high-voltage components. In some embodiments, reference may be made to the processes shown below of the passivation layer 101 in FIGS. 4 (a) to (e) for the preparation modes of the following structure of a passivation layer 101 of a high-voltage component 1p, and those will not be described in detail herein. However, in high-voltage application, in order to avoid direct breakdown of the voltage to a substrate 2, a doped superlattice layer 31 is optionally disposed between the substrate 2 and a channel layer 4 to increase the overall size of the HEMT device or structure and increase the breakdown voltage. After a passivation layer 10 is disposed, the passivation layer 101 is disposed on the passivation layer.

With reference to FIG. 6 (b), although a source contact 6 and a drain contact 7 are respectively disposed on two sides of a gate electrode 9 in FIG. 6 (b), the source contact 6, the drain contact 7, and the gate electrode 9 may have different configurations in other embodiments of the present invention according to design requirements.

With reference to FIG. 6 (c), a dielectric layer 102 is positioned between a field plate 111 and the source contact 6 substantially in the normal direction of two-dimensional electron gas 41. A high-voltage component device generally includes a plurality of field plates, and these field plates are not in contact with each other and are separated from each other. One or more of the field plates may be at zero potential. Although the HEMT device 1p depicted in FIG. 6 has four field plates, the present invention is not limited thereto. In some embodiments, the HEMT device 1p may include more or less than four field plates.

In some embodiments, the field plate 111 (including the field plates 112, 113, and 114 mentioned below) may be formed in the manner of firstly depositing a conductive material and then defining a pattern. For example, metal may be deposited through sputtering, and the pattern may be defined by dry etching. It should be noted that the position of the field plate 111 cannot be positioned at the position of a T-shaped electrode 14 formed in subsequent steps. Additionally, the applicable voltage of the relatively-low-voltage component is smaller, and the influence of the electric field between conductor structures on the efficiency of the component is smaller, so that the field plate of the relatively-low-voltage component may be omitted.

The field plate 111 may reduce the electric field of a gate contact structure, enables the electric field among the conductor structures (for example, the T-shaped electrode 14, the source contact 6, and the drain contact 7) to be averagely distributed, and improves the voltage tolerance so as to smoothly release the voltage, thus further improving the reliability of the device.

With reference to FIG. 6 (d), a dielectric layer 103 is positioned between the field plate 111 and the source contact 6 substantially in the normal direction of the two-dimensional electron gas 41. An opening 1031 is formed in the dielectric layers 102 and 103. The opening 1031 exposes a partial surface of the gate electrode 9. In some embodiments, the opening 1031 may be formed in a dry etching or wet etching mode.

For example, wet etching includes exposure to a hydroxide-containing solution, deionized water, and/or other etching agents. Dry etching includes use of inductively coupled plasma. The gate electrode 9 may be used as a stop layer for the doped group III-V layer 8 in this step.

With reference to FIG. 6 (e), in high-voltage application, the T-shaped electrode 14 may be additionally disposed on the gate electrode 9. The T-shaped electrode 14 may be in direct contact with the gate electrode 9. The T-shaped electrode 14 may be electrically connected with the gate electrode 9. Substantially in the normal direction of the two-dimensional electron gas 41, the T-shaped electrode 14 is positioned above the gate electrode 9, the gate electrode 9 is positioned under the T-shaped electrode 14, and the gate electrode 9 is positioned between the T-shaped electrode 14 and the doped group III-V layer 8.

In some embodiments, the T-shaped electrode 14 may include a structure formed by a single material. In some embodiments, the T-shaped electrode 14 may include a structure formed by heterogeneous materials. In some embodiments, as shown in dotted boxes in FIG. 6 (e), the T-shaped electrode 14 may include multiple layers of heterojunctions. In some embodiments, the T-shaped electrode 14 may include multiple layers, for example, a layer 141, a layer 142, a layer 143, and a layer 144. Although the T-shaped electrode 14 depicted in FIG. 6 (e) includes the four layers, the present invention is not limited thereto. In other embodiments, the T-shaped electrode 14 may also include structures of more or less than four layers.

In some embodiments, the layer 141 may include, for example, but is not limited to, a refractory metal or a compound thereof. The layer 141 may include a material identical or similar to the gate electrode 9. The layer 141 may include a material different from the gate electrode 9. In some embodiments, the layer 142 may include, for example, but is not limited to, a metal or a metal compound, for example, titanium, chromium, and tungsten titanate. The layer 142 may be used as a wetting layer to help subsequent metal filling In some embodiments, the layer 143 may include, for example, but is not limited to, a gate metal. The layer 143 may include a material identical or similar to the T-shaped electrode 14. The layer 143 may include a material different from the T-shaped electrode 14. In some embodiments, the layer 144 may include, for example, but is not limited to, a refractory metal or a compound thereof. The layer 144 may include a material identical or similar to the gate electrode 9. The layer 144 may include a material different from the gate electrode 9.

The field plate 112 may enable the electric field among the conductor structures (for example, the T-shaped electrode 14, the source contact 6, and the drain contact 7) to be averagely distributed, and improve the voltage tolerance so as to smoothly release the voltage, thus further improving the reliability of the device. The field plate 112 may reduce the electric field of the gate contact structure, and increase the threshold voltage. The field plate 112 partially coincides with the field plate 111 substantially in the normal direction of the two-dimensional electron gas 41.

In some embodiments, the T-shaped electrode 14 has an overhang or flange 14' so that the top width of the T-shaped electrode is greater than the width of the gate electrode 9 substantially in the tangential direction of the two-dimensional electron gas. In this case, the width of the gate electrode 9 is relatively smaller than that of the T-shaped electrode 14. In other embodiments, the T-shaped electrode 14 may have no flange 14'.

In some embodiments, the distance between the border of the flange 14' and the border of the field plate 111 is about 0.5 µm to 2.5 µm. The distance from the border of the flange 14' to the border of the field plate 112 is about 2 µm to 4 µm.

The T-shaped electrode 14 may reduce the overall resistance value of the gate contact structure, is used to provide a low-resistance conductor wire, and may further be used to be electrically connected to other conductors.

The gate electrode 9 is favorable for improving bias control of the T-shaped electrode 14. The gate electrode 9 is favorable for accelerating the switching speed of the gate. The gate electrode 9 is favorable for reducing the leakage current and increasing the threshold voltage.

In the high-voltage component, the voltage tolerance may be influenced by the distance between the drain contact 7 and the T-shaped electrode 14, so that the distance between the drain contact 7 and the T-shaped electrode 14 generally may be greater than about 15 µm. The smaller the width of the doped group III-V layer 8, the greater the distance between the drain contact 7 and the T-shaped electrode 14, and the higher the high-voltage tolerance capability. Additionally, the smaller the width of the doped group III-V layer 8, the smaller the resistance value of the high-voltage component.

In some embodiments, the T-shaped electrode 14 may have the width greater than about 0.3 μm substantially in the tangential direction of the two-dimensional electron gas 41. In some embodiments, the width of the T-shaped electrode 14 may be about 0.3 μm to about 0.8 μm. In some embodiments, the width of the T-shaped electrode 14 may be smaller than the width of the gate electrode 9. In some embodiments, the width of the T-shaped electrode 14 may be smaller than the width of the doped group III-V layer 8.

In some embodiments, each layer of the T-shaped electrode 14 may be formed through PVD, CVD, ALD, plating, and/or other suitable steps. In some embodiments, after each layer of the T-shaped electrode 14 is filled, the surface of the T-shaped electrode 14 is not treated by CMP, so that the flange 14' remains on the dielectric layer 103.

The field plate 111 is adjacent to the T-shaped electrode 14 substantially in the tangential direction of the two-dimensional electron gas 41. The field plate 112 is adjacent to the T-shaped electrode 14 substantially in the tangential direction of the two-dimensional electron gas 41. The field plate 111 is positioned between the T-shaped electrode 14 and the drain contact 7 substantially in the tangential direction of the two-dimensional electron gas 41. The field plate 112 is positioned between the T-shaped electrode 14 and the drain contact 7 substantially in the tangential direction of the two-dimensional electron gas 41.

In some embodiments, the field plate 112 may be formed together with the T-shaped electrode 14. In some embodiments, the field plate 112 may have the same material as the T-shaped electrode 14.

In some embodiments, a passivation layer 10 may surround the T-shaped electrode 14. The passivation layer 10 may surround part of the T-shaped electrode 14.

In some embodiments, a passivation layer 101 disposed above the passivation layer 10 may surround the T-shaped electrode 14. The passivation layer 101 may surround part of the T-shaped electrode 14.

With reference to FIG. 6 (f), the dielectric layer 102 is positioned between the field plate 113 and the source contact 6 substantially in the normal direction of the two-dimensional electron gas 41. The field plate 113 partially coincides with the field plate 111 substantially in the normal direction of the two-dimensional electron gas 41.

The dielectric layer 103 is positioned between the field plate 113 and the source contact 6 substantially in the normal direction of the two-dimensional electron gas 41. A dielectric layer 104 is positioned between the field plate 113 and the source contact 6 substantially in the normal direction of the two-dimensional electron gas 41.

The field plate 113 may reduce the electric field of the gate contact structure, and increase the threshold voltage. The field plate 113 may enable the electric field among the conductor structures (for example, the T-shaped electrode 14, the source contact 6, and the drain contact 7) to be averagely distributed, and improve the voltage tolerance so as to smoothly release the voltage, thus further improving the reliability of the device. In some embodiments, the field plate 113 partially overlaps with the T-shaped electrode 14 substantially in the normal direction of the two-dimensional electron gas 41. The field plate 113 has a portion positioned between the border of the flange 14' and the geometric center of the T-shaped electrode 14 substantially in the tangential direction of the two-dimensional electron gas 41. The border of the flange 14' passes through the field plate 113 substantially in the normal direction of the two-dimensional electron gas 41.

In some embodiments, the field plate 113 may not coincide with the T-shaped electrode 14 substantially in the normal direction of the two-dimensional electron gas 41. In other embodiments, the field plate 113 may not coincide with the centerline 143 of the T-shaped electrode 14 substantially in the normal direction of the two-dimensional electron gas 41. The field plate 113 is positioned between the T-shaped electrode 14 and the drain contact 7 substantially in the tangential direction of the two-dimensional electron gas 41.

In some embodiments, the shortest distance between the border of the flange 14' and the border of the field plate 113 is about 3 μm to 5 μm.

With reference to FIG. 6 (g), the HEMT device 1p may also include a dielectric layer 102, a dielectric layer 103, a dielectric layer 104, a dielectric layer 105, a dielectric layer 106, and a dielectric layer 27.

The dielectric layer 102 is positioned between the field plate 114 and the source contact 6 substantially in the normal direction of the two-dimensional electron gas 41. The dielectric layer 103 is positioned between the field plate 114 and the source contact 6 substantially in the normal direction of the two-dimensional electron gas 41. The dielectric layer 104 is positioned between the field plate 114 and the source contact 6 substantially in the normal direction of the two-dimensional electron gas 41. The dielectric layer 105 is positioned between the field plate 114 and the source contact 6 substantially in the normal direction of the two-dimensional electron gas 41.

The field plate 114 may reduce the electric field of the gate contact structure, and increase the threshold voltage. The field plate 114 may enable the electric field among the conductor structures (for example, the T-shaped electrode 14, the source contact 6, and the drain contact 7) to be averagely distributed, and improve the voltage tolerance so as to smoothly release the voltage, thus further improving the reliability of the device. The field plate 114 partially coincides with the field plate 111 substantially in the normal direction of the two-dimensional electron gas 41. The field plate 114 is positioned between the T-shaped electrode 14 and the drain contact 7 substantially in the tangential direction of the two-dimensional electron gas 41.

In some embodiments, the distance between the border of the flange 14' and the closest border of the field plate 114 is about 6 μm to 8 μm.

In some embodiments, the width of the field plate (for example, the field plate 111, the field plate 112, the field plate 113, and/or the field plate 114) substantially in the tangential direction of the two-dimensional electron gas 41 is about 50 to 150 nm. In some embodiments, the width of the field plate substantially in the tangential direction of the two-dimensional electron gas 41 is about 80 to 120 nm. In some embodiments, the width of the field plate substantially in the tangential direction of the two-dimensional electron gas 41 is about 90 to 110 nm.

The field plate 111 may be connected with the source contact 6 and/or the drain contact 7 through other conductor structures. The field plate 112 may be connected with the source contact 6 and/or the drain contact 7 through other conductor structures. The field plate 113 may be connected with the source contact 6 and/or the drain contact 7 through other conductor structures. The field plate 114 may be connected with the source contact 6 and/or the drain contact 7 through other conductor structures. The field plate 111 is not in direct contact with the source contact 6. The field plate 111 is not in direct contact with the drain contact 7. The field plate 112 is not in direct contact with the source contact 6.

The field plate 112 is not in direct contact with the drain contact 7. The field plate 113 is not in direct contact with the source contact 6. The field plate 113 is not in direct contact with the drain contact 7. The field plate 114 is not in direct contact with the source contact 6. The field plate 114 is not in direct contact with the drain contact 7.

In some embodiments, at least one dielectric layer (for example, the dielectric layer 102, the dielectric layer 103, the dielectric layer 104, and the dielectric layer 105) exists between the field plate 111, the field plate 112, the field plate 113, and/or the field plate 114 and the conductor structure. Through such configuration, the distance between the conductor structures may be small, and the resistance value increase is avoided.

Application of Hybrid HEMT Devices

In some embodiments, the asymmetrical gate structure of the present invention may be applied to an HEMT device as shown in FIG. 7.

The HEMT device includes: a substrate; a buffer layer, positioned above the substrate, the buffer layer including a superlattice structure; a channel layer, positioned above the buffer layer; a barrier layer, positioned above the channel layer, the barrier layer being configured to form two-dimensional electron gas (2DEG), and the two-dimensional electron gas being formed in the channel layer along an interface between the channel layer and the barrier layer; and a high-voltage component portion and a low-voltage component portion, positioned above the barrier layer, the operating voltage of the high-voltage component portion being greater than the operating voltage of the low-voltage component portion.

The high-voltage component portion includes: a first source contact and a first drain contact, positioned above the barrier layer; a first doped group III-V layer, positioned above the barrier layer and between the first drain contact and the first source contact; and a first gate electrode, positioned above the first doped group III-V layer.

The low-voltage component portion includes: a second source contact and a second drain contact, positioned above the barrier layer; a second doped group III-V layer, positioned above the barrier layer and between the second drain contact and the second source contact; and a second gate electrode, positioned above the second doped group III-V layer.

In some embodiments, the first gate electrode and the first doped group III-V layer of the high-voltage component portion are disposed in the mode described above.

In some embodiments, the second gate electrode and the second doped group III-V layer of the low-voltage component portion are disposed in the mode described above.

In some embodiments, the first gate electrode of the high-voltage component portion is configured to form a Schottky junction with the first doped group III-V layer. In some embodiments, the second gate electrode of the low-voltage component portion is configured to form a Schottky junction with the second doped group III-V layer.

In some embodiments, the structure of the low-voltage component portion may be similar to that of the HEMT device 1$j$ mentioned above. In some embodiments, the structure of the high-voltage component portion may be identical or similar to that of the HEMT device 1$p$ mentioned above.

FIGS. 7 (a) to (l) show several operations for manufacturing an HEMT device 1$q$ according to some embodiments of the present invention. Although FIGS. 7 (a) to (l) illustrate several operations for manufacturing the hybrid HEMT device 1$q$, similar operations are also applicable.

With reference to FIG. 7 (a), a substrate 2 is provided. In some embodiments, a doped superlattice layer 32 optionally epitaxially grows on the substrate 2. In some embodiments, a channel layer 4, a barrier layer 5, and a doped group III-V layer 8 are disposed on the substrate 2 through epitaxial growth. In some embodiments, a gate electrode is formed before a source contact and a drain contact are formed. The gate electrode 9 is configured to form a Schottky junction with the doped group III-V layer 8.

Additionally, photoresist 94 and 94' is applied to a hard mask 93, and is used to position the position of the gate electrode 9 after the photolithography and etching processes.

With reference to FIG. 7 (b), patterned hard masks 93 and 93' are formed above the gate electrode 9. Then, the required portions of the gate electrodes 92 and 92' are retained in photolithography and etching modes. The configuration and forming modes of each of the above components are as described above.

Patterned photoresist 95 is respectively applied to the hard mask 93 and the gate electrode 9, and is enabled to coat a third sidewall 91 and/or a fourth sidewall 92 of the gate electrode 9. Patterned photoresist 95' is respectively applied to the hard mask 93' and the gate electrode 9', and is enabled to coat a seventh sidewall 91' and/or an eighth sidewall 92' of the gate electrode 9'. The configuration and forming modes of each of the above components are as described above.

With reference to FIG. 7 (c), the exposed doped group III-V layer is etched to form structures 8 and 8', and then, the photoresist 93 and 93' is peeled off. The content relevant to the photolithography and etching of the gate electrodes 9 and 9' and the doped group III-V layers 8 and 8' has been described above, and will not be described in detail herein.

With reference to FIG. 7 (d), the gate electrode 9 may be optionally overetched so as to further recede the third sidewall 91 and the fourth sidewall 92 of the gate electrode 9 to increase the sizes of $(L_4-L_2)$ and $(L_3-L_1)$; the gate electrode 9' may be optionally overetched so as to further recede the seventh sidewall 91' and the eighth sidewall 92' of the gate electrode 9' to increase the sizes of $(L_8-L_6)$ and $(L_7-L_5)$, and then, the hard masks 93 and 93' are peeled off. The content relevant to the etching of the gate electrodes has been described above, and will not be described in detail herein.

With reference to FIG. 7 (e), after the asymmetrical gate structures are formed, a passivation layer 10 and a passivation layer 101 are formed on the gate electrodes 9 and 9'. The configuration and forming modes of each of the above components are as described above.

With reference to FIG. 7 (f), source contact vias and drain contact vias are formed, and are filled with materials to form source contacts 6 and 6' and drain contacts 7 and 7'. The forming modes of the source contact vias and the drain contact vias have been described above, and will not be described in detail herein.

With reference to FIG. 7 (g), a dielectric layer 102 is deposited onto the passivation layer 101. In some embodiments, the dielectric layer 102 (and the dielectric layers 103, 104, 105, 106, and 107) may be deposited in the following modes: chemical vapor deposition (CVD), high density plasma CVD, spin-on, sputtering, etc. Then, the surface of the dielectric layer 102 is treated through chemical-mechanical planarization (CMP).

Isolation regions 15, 151, and 152 are formed to isolate the source contacts 6 and 6' from the drain contacts 7 and 7' of a high-voltage component 1$q$(i) and a low-voltage component 1$q$(ii). In some embodiments, an implant isolation process may be used. Patterned photoresist 1021 is used. Nitrogen, oxygen, fluorine or the like is implanted in the area not covered by the patterned photoresist 1021. These elements will remain in the channel layer 4 to block channels of the two-dimensional electron gas 41 on the two sides.

In some embodiments, the isolation regions 15, 151, and 152 may include dielectric materials. In some embodiments, the isolation regions 15, 151, and 152 may include dielectric materials with a low dielectric constant (low k value). In some embodiments, the isolation regions 15, 151, and 152 may include nitrides, oxides, or fluorides. In some embodiments, the isolation regions 15, 151, and 152 may include silicon oxide, silicon nitride, silicon oxynitride, or fluorine-doped silicate glass (FSG). If the isolation regions 15, 151, and 152 need to be filled with the dielectric materials, the operation may be performed in photolithography, etching and deposition modes before the passivation layer 101 is disposed.

With reference to FIG. 7 (*h*), a field plate 111 is formed on the dielectric layer 102, and the dielectric layer 102 separates the field plate 111 from the source contact 6 substantially in the tangential direction of the two-dimensional electron gas 41. The configuration and forming modes of each of the above components are as described in section II of Application of high-voltage HEMT devices.

With reference to FIG. 7 (*i*), an opening 1031 is formed in the high-voltage component portion 1*q*(i). The opening 1031 exposes a partial surface of the gate electrode 9. In some embodiments, the opening 1031 may be formed in a dry etching or wet etching mode. The configuration and forming modes of the opening 1031 are as described by parts relevant to the opening 1031 in section II of Application of high-voltage HEMT devices.

A semiconductor component 1*q* includes the high-voltage component portion 1*q*(i) and the low-voltage component portion 1*q*(ii). Before the manufacturing process proceeds to the formation of the isolation regions 15, 151, and 152 (including the step of forming the isolation regions 15, 151, and 152), the high-voltage component portion 1*q*(i) and the low-voltage component portion 1*q*(ii) have the same structures and flow processes, and the same components may be formed in the same step.

In some embodiments, the high-voltage component portion 1*q*(i) belongs to a relatively-high-voltage component, and the low-voltage component portion 1*q*(ii) belongs to a relatively-low-voltage component. In the semiconductor component 1*q*, the low-voltage component portion 1*q*(ii) belongs to the gate first manufacturing process. After the isolation regions 15, 151, and 152 are formed, the low-voltage component portion 1*q*(ii) will not form the opening and the T-shaped electrode.

In some embodiments, the high-voltage component portion 1*q*(i) belongs to a hybrid manufacturing process of the gate first flow process and the gate last process. After the isolation regions 15, 151, and 152 are formed, the high-voltage component portion 1*q*(i) continues to form the field plate 111, form the opening 1031, and form the T-shaped electrode 14.

With reference to FIG. 7 (*j*), each layer of the T-shaped electrode 14 is deposited and filled into the opening 1031 to form the T-shaped electrode 14. The material selection, configuration and forming modes of each layer of the T-shaped electrode 14 are as described in section II of Application of high-voltage HEMT devices.

In some embodiments, the field plate 112 may be formed together with the T-shaped electrode 14. In some embodiments, the field plate 112 may have the same material as the T-shaped electrode 14.

With reference to FIG. 7 (*k*), in some embodiments, the operations for manufacturing the HEMT device 1*q* also include forming the dielectric layer 104 and the field plate 113.

With reference to FIG. 7 (*l*), in some embodiments, the operations for manufacturing the HEMT device 1*q* also include forming the dielectric layer 105 and forming the interconnect structure 12 passing through the dielectric layers 105 to 102 to be connected to the source contacts 6 and 6' and the drain contacts 7 and 7'.

In some embodiments, the operations for manufacturing the HEMT device 1*q* also include forming the metal layer 13 and the field plate 114 on the dielectric layer 105.

In some embodiments, the operations for manufacturing the HEMT device 1*q* also include forming a dielectric layer 106 to cover the metal layer 13 and the field plate 114. In some embodiments, the operations for manufacturing the HEMT device 1*q* also include forming a conductive via 121 passing through the dielectric layer 106 to be connected to the metal layer 13 or the interconnect structure 12. In some embodiments, the operations for manufacturing the HEMT device 1*q* also include forming the metal layer 131 connected to the conductive via 121, and forming a dielectric layer 107 to cover the metal layer 131.

In some embodiments, one or more field plates may be disposed in the high-voltage component portion 1*q*(i). In some embodiments, one or more field plates may be disposed in the low-voltage component portion 1*q*(ii). In some embodiments, one or more field plates may be disposed in both the high-voltage component portion 1*q*(i) and the low-voltage component portion 1*q*(ii). The field plate may not be disposed in the low-voltage component portion 1*q*(ii).

In some embodiments, the high-voltage component portion 1*q*(i) may be applied to the voltage higher than 500 V. In some embodiments, the high-voltage component portion 1*q*(i) may be applied to the voltage higher than 550 V. In some embodiments, the high-voltage component portion 1*q*(i) may be applied to the voltage higher than 600 V. In some embodiments, the low-voltage component portion 1*q*(ii) may be applied to the voltage of 10 V to 40 V. In some embodiments, the low-voltage component portion 1*q*(ii) may be applied to the voltage relatively lower than the voltage of the high-voltage component portion 1*q*(i).

The high-voltage component portion 1*q*(i) may be formed on the superlattice layer 32. The low-voltage component portion 1*q*(ii) may be formed on the superlattice layer 32.

As used herein, for ease of description, space-related terms such as "under", "below", "lower portion", "above", "upper portion", "lower portion", "left side", "right side", and the like may be used herein to describe a relationship between one component or feature and another component or feature as shown in the figures. In addition to orientation shown in the figures, space-related terms are intended to encompass different orientations of the device in use or operation. An apparatus may be oriented in other ways (rotated 90 degrees or at other orientations), and the space-related descriptors used herein may also be used for explanation accordingly.

It should be noted that, values of width and distance described in the present invention are merely exemplary, and the present invention is not limited thereto. In some embodiments, such values may be adjusted according to an actual application situation of the present invention without departing from the spirit of the present invention.

As used in the present application, terms "approximately", "basically", "substantially", and "about" are used for describing and explaining a small variation. When being used in combination with an event or circumstance, the term may refer to a case in which the event or circumstance occurs precisely, and a case in which the event or circumstance occurs approximately. As used herein with respect to a given value or range, the term "about" or "similar" generally means in the range of ±10%, ±5%, ±1%, or ±0.5% of the given value or range. The range may be indicated herein as from one endpoint to another endpoint or between two endpoints. Unless otherwise specified, all the ranges disclosed in the present invention include endpoints. The term "substantially coplanar" may refer to two surfaces within a few micrometers (μm) positioned along the same plane, for example, within 10 μm, within 5 μm, within 1 μm, or within 0.5 μm located along the same plane. When reference is made to "substantially" the same numerical value or characteristic, the term may refer to a value within ±10%, ±5%, ±1%, or ±0.5% of the average of the values.

Several embodiments of the present invention and features of details are briefly described above. The embodiments described in the present invention may be easily used as a basis for designing or modifying other processes and structures for realizing the same or similar objectives and/or obtaining the same or similar advantages introduced in the embodiments of the present invention. Such equivalent construction does not depart from the spirit and scope of the present invention, and various variations, replacements, and modifications can be made without departing from the spirit and scope of the present invention.

Although the subject of this specification is described by using specific preferred embodiments and exemplary implementations, the foregoing accompanying drawings and descriptions of this specification describe merely typical non-limiting examples of implementations of the subject. Therefore, the foregoing accompanying drawings and descriptions are not intended to limit the scope of this specification, and many alternatives and modifications will be apparent to a person skilled in the art.

As reflected in the claims below, aspects of the present invention may have fewer features than all features of an individual implementation disclosed above. Therefore, the claims described below are hereby explicitly incorporated into the specific embodiments, and each claim itself represents an independent implementation of the present invention. In addition, although some implementations described herein include some features included in other implementations, but do not include other features included in the other implementations, a person skilled in the art should understand that, a combination of features of different implementations shall fall within the scope of the present invention, and is intended to form different implementations.

What is claimed is:

1. A semiconductor device, comprising:
   a channel layer;
   a barrier layer, positioned above the channel layer, the barrier layer and the channel layer being configured to form two-dimensional electron gas (2DEG) along an interface between the channel layer and the barrier layer;
   a source contact and a drain contact positioned above the barrier layer;
   a doped group III-V layer positioned above the barrier layer and between the drain contact and the source contact, wherein the first doped group III-V layer has a first non-vertical sidewall adjacent to the source contact and a second non-vertical sidewall adjacent to the drain contact; and
   a gate electrode positioned above the doped group III-V layer and having a third non-vertical sidewall adjacent to the source contact and a fourth non-vertical sidewall adjacent to the drain contact, wherein a horizontal distance from the first non-vertical sidewall to the third non-vertical sidewall is different than a horizontal distance from the second non-vertical sidewall to the fourth non-vertical sidewall; and a surface roughness of the third non-vertical sidewall is substantially different from a surface roughness of the fourth non-vertical sidewall.

2. The semiconductor device according to claim 1, wherein a horizontal distance from the source contact to the first non-vertical sidewall is greater than a horizontal distance from the drain contact to the second non-vertical sidewall.

3. The semiconductor device according to claim 2, wherein the horizontal distance from the first non-vertical sidewall to the third non-vertical sidewall is greater than the horizontal distance from the second non-vertical sidewall to the fourth non-vertical sidewall.

4. The semiconductor device according to claim 2, wherein the horizontal distance from the first non-vertical sidewall to the third non-vertical sidewall is less than the horizontal distance from the second non-vertical sidewall to the fourth non-vertical sidewall.

5. The semiconductor device according to claim 1, wherein an included angle between a tangent plane of the first non-vertical sidewall and a tangential direction of the 2DEG is 30° to 85°.

6. The semiconductor device according to claim 5, wherein an included angle between a tangent plane of the second non-vertical sidewall and a tangential direction of the 2DEG is 30° to 85°.

7. The semiconductor device according to claim 1, wherein an included angle between a tangent plane of the third non-vertical sidewall and a tangential direction of the 2DEG is 30° to 85°.

8. The semiconductor device according to claim 7, wherein an included angle between a tangent plane of the fourth non-vertical sidewall and a tangential direction of the 2DEG is 30° to 85°.

9. The semiconductor device according to claim 1, wherein the gate electrode is narrower than the doped group III-V layer.

10. A semiconductor device, comprising:
    a channel layer;
    a barrier layer, positioned above the channel layer, the barrier layer and the channel layer being configured to form two-dimensional electron gas (2DEG) along an interface between the channel layer and the barrier layer;
    a source contact and a drain contact positioned above the barrier layer;
    a doped group III-V layer positioned above the barrier layer and between the drain contact and the source contact, wherein the first doped group III-V layer has a first left sidewall and a first right sidewall which are curved and opposite each other; and
    a gate electrode positioned above the doped group III-V layer and having a second left sidewall and a second right sidewall which are curved and opposite each other, wherein a horizontal distance from the first left sidewall to the second left sidewall is different than a horizontal distance from the first right sidewall to the second right sidewall, and a surface roughness of the second left sidewall is substantially different from a surface roughness of the second right sidewall.

11. The semiconductor device according to claim 10, wherein an included angle between a tangent plane of the first left sidewall and a tangential direction of the 2DEG is 30° to 90°.

12. The semiconductor device according to claim 11, wherein an included angle between a tangent plane of the first right sidewall and a tangential direction of the 2DEG is 30° to 90°.

13. The semiconductor device according to claim 10, wherein an included angle between a tangent plane of the second left sidewall and a tangential direction of the 2DEG is 30° to 90°.

14. The semiconductor device according to claim 13, wherein an included angle between a tangent plane of the second right sidewall and a tangential direction of the 2DEG is 30° to 90°.

15. A semiconductor device, comprising:
a channel layer;
a barrier layer, positioned above the channel layer, the barrier layer and the channel layer being configured to form two-dimensional electron gas (2DEG) along an interface between the channel layer and the barrier layer;
a low voltage device comprising:
  a first source contact and a first drain contact which are positioned above the barrier layer;
  a first doped group III-V layer positioned above the barrier layer and between the first drain contact and the first source contact; and
  a first gate electrode positioned above the first doped group III-V layer and having a first sidewall adjacent to the first source contact and a second sidewall adjacent to the first drain contact, wherein a profile of the first sidewall and a profile of the second sidewall are substantially in non-specular symmetry with respect to a geometric center of the first doped group III-V layer; and a surface roughness of the first sidewall is substantially different from a surface roughness of the second sidewall; and
a high voltage device comprising:
  a second source contact and a second drain contact which are positioned above the barrier layer;
  a second doped group III-V layer positioned above the barrier layer and between the second drain contact and the second source contact; and
  a second gate electrode positioned above the second doped group III-V layer and having a third sidewall adjacent to the second source contact and a fourth sidewall adjacent to the second drain contact, wherein a profile of the third sidewall and a profile of the fourth sidewall are substantially in non-specular symmetry with respect to a geometric center of the second doped group III-V layer, and a surface roughness of the third sidewall is substantially different from a surface roughness of the fourth sidewall.

16. The semiconductor device according to claim 15, further comprising:
a first isolation region and a second isolation region collectively defining a first area; and
a third isolation region defining a second area with the second isolation region, wherein the high voltage device is located in the first area and the low voltage device is located in the second area.

17. The semiconductor device according to claim 16, further comprising a first field plate positioned over the fourth sidewall and out of the second area.

18. The semiconductor device according to claim 17, wherein the first field plate is confined in between the third sidewall and the second drain contact.

19. The semiconductor device according to claim 16, further comprising a plurality of field plates positioned over the second gate electrode and out of the second area.

20. The semiconductor device according to claim 18, wherein the semiconductor device further comprises:
a second field plate positioned above the first field plate and between the gate electrode and the second drain contact.

\* \* \* \* \*